(12) United States Patent
Takeshita et al.

(10) Patent No.: US 7,205,024 B2
(45) Date of Patent: Apr. 17, 2007

(54) METHOD OF COATING FILM, COATING UNIT, AGING UNIT, SOLVENT REPLACEMENT UNIT, AND APPARATUS FOR COATING FILM

(75) Inventors: Kazuhiro Takeshita, Kumamoto (JP); Shinji Nagashima, Kikuchi-gun (JP); Makoto Muramatsu, Kamimashiki-gun (JP); Yoji Mizutani, Kawasaki (JP); Kazutoshi Yano, Kikuchi-gun (JP); Kyoshige Katayama, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 316 days.

(21) Appl. No.: 10/771,637

(22) Filed: Feb. 5, 2004

(65) Prior Publication Data

US 2004/0156996 A1    Aug. 12, 2004

Related U.S. Application Data

(62) Division of application No. 10/421,839, filed on Apr. 24, 2003, now Pat. No. 6,726,775, which is a division of application No. 09/842,395, filed on Apr. 26, 2001, now Pat. No. 6,589,339, which is a division of application No. 09/210,759, filed on Dec. 14, 1998, now Pat. No. 6,248,168.

(30) Foreign Application Priority Data

| Dec. 15, 1997 | (JP) | ................................... 9-363552 |
| Jan. 7, 1998 | (JP) | ................................... 10-13217 |
| Jan. 9, 1998 | (JP) | ................................... 10-14964 |
| Jan. 9, 1998 | (JP) | ................................... 10-14965 |
| Jan. 27, 1998 | (JP) | ................................... 10-30502 |
| Mar. 5, 1998 | (JP) | ................................... 10-73336 |
| Mar. 20, 1998 | (JP) | ................................... 10-92496 |

(51) Int. Cl.
 *B05D 3/04* (2006.01)
(52) U.S. Cl. ...................... 427/240; 427/335; 427/377; 427/379; 427/397.8
(58) Field of Classification Search ................ 427/240, 427/425, 335, 377, 379, 397.7, 397.8, 387; 118/52
See application file for complete search history.

(56) References Cited

U.S. PATENT DOCUMENTS 4,282,270 A    8/1981    Nozaki et al.

(Continued)

FOREIGN PATENT DOCUMENTS

EP    0 775 669 A2    11/1996

(Continued)

*Primary Examiner*—Kirsten Jolley
(74) *Attorney, Agent, or Firm*—Oblon, Spivak, McClelland, Maier & Neustadt, P.C.

(57) ABSTRACT

Prior to transfer of an wafer W, a mixed gas is being generated and exhausted, thereby fluctuation of concentration and temperature of a solvent component at the beginning of gas introduction into a chamber 3 is suppressed. A step of gelling after the wafer W is carried into an aging unit is divided into several steps. Until a temperature of the wafer W reaches a predetermined treatment temperature, an average concentration of the solvent component in a mixed gas is gradually raised relative to the temperature of the wafer W. Thereby, immediately after the wafer W is transferred into a sealed chamber, the gas of the solvent component is prevented from condensing.

12 Claims, 39 Drawing Sheets

U.S. PATENT DOCUMENTS

| | | |
|---|---|---|
| 5,139,999 A | 8/1992 | Gordon et al. |
| 5,343,633 A | 9/1994 | Wang et al. |
| 5,461,003 A | 10/1995 | Havemann et al. |
| 5,470,802 A | 11/1995 | Gnade et al. |
| 5,472,913 A | 12/1995 | Havemann et al. |
| 5,488,015 A | 1/1996 | Havemann et al. |
| 5,494,858 A | 2/1996 | Gnade et al. |
| 5,504,042 A | 4/1996 | Cho et al. |
| 5,523,615 A | 6/1996 | Cho et al. |
| 5,561,318 A | 10/1996 | Gnade et al. |
| 5,565,142 A | 10/1996 | Deshpande et al. |
| 5,625,232 A | 4/1997 | Numatat et al. |
| 5,670,210 A | 9/1997 | Mandal et al. |
| 5,723,019 A | 3/1998 | Krusell et al. |
| 5,763,007 A | 6/1998 | Weiller |
| 5,955,140 A | 9/1999 | Smith et al. |
| 5,958,517 A | 9/1999 | Poag et al. |
| 6,130,152 A * | 10/2000 | Smith et al. ............ 438/622 |
| 6,248,168 B1 | 6/2001 | Takeshita et al. |
| 6,589,339 B2 | 7/2003 | Takeshita et al. |
| 6,605,153 B2 | 8/2003 | Kitano et al. |
| 6,676,757 B2 | 1/2004 | Kitano et al. |

FOREIGN PATENT DOCUMENTS

| | | |
|---|---|---|
| JP | 8-59362 | 3/1996 |
| JP | 8-162450 | 6/1996 |

* cited by examiner

ETHYLENE GLYCOL
AMMONIA

ETHYL ALCOHOL
HMDS HEPTANE

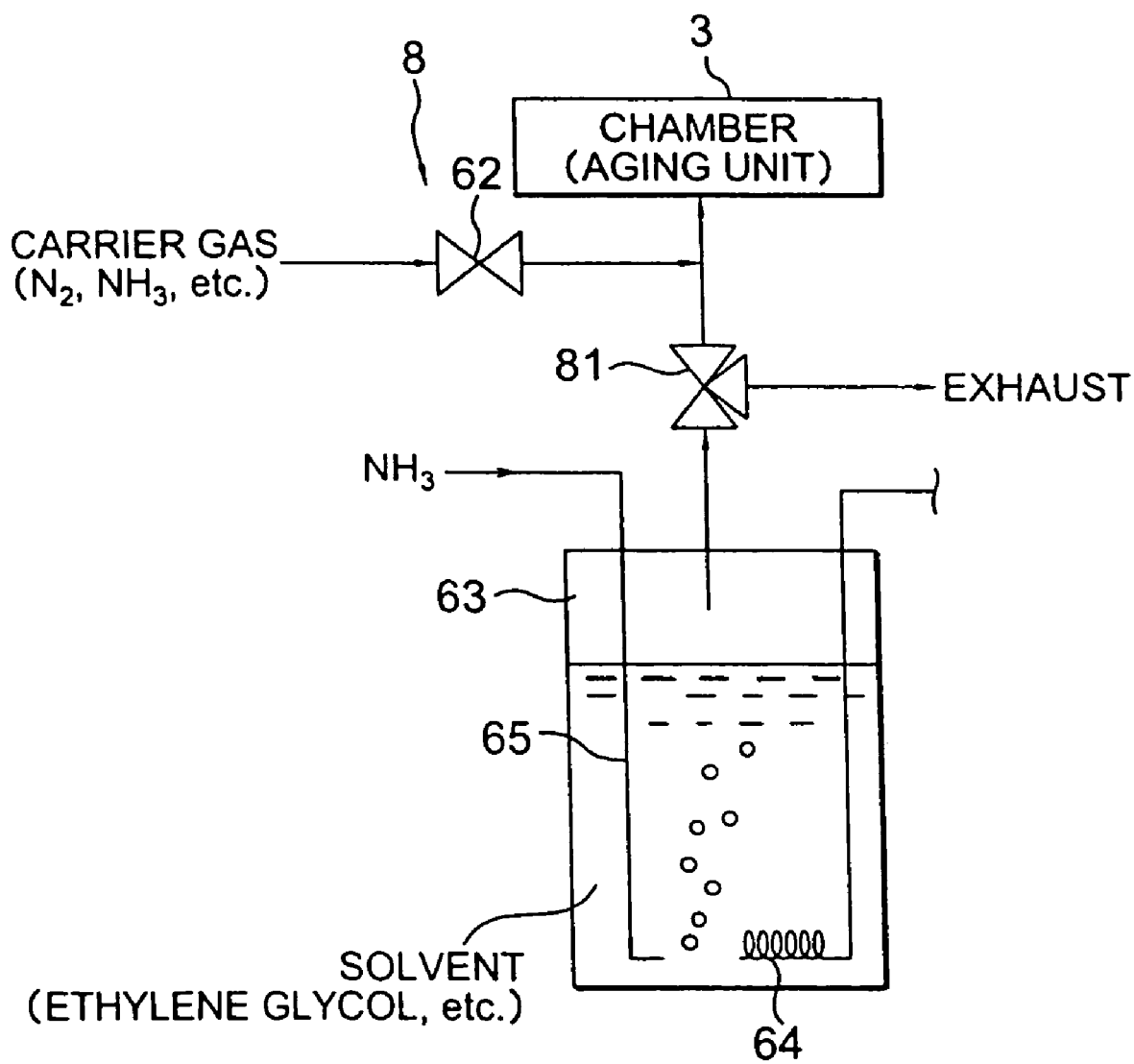

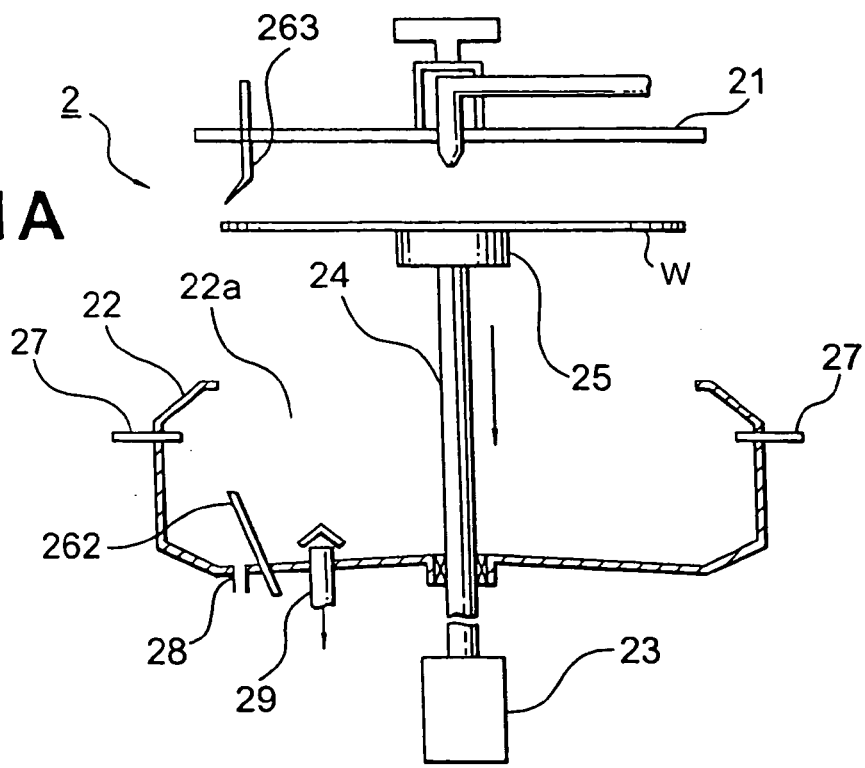
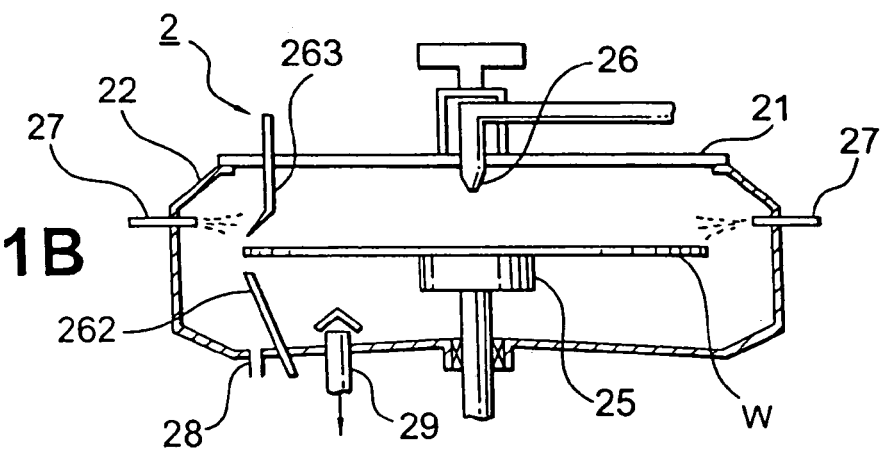
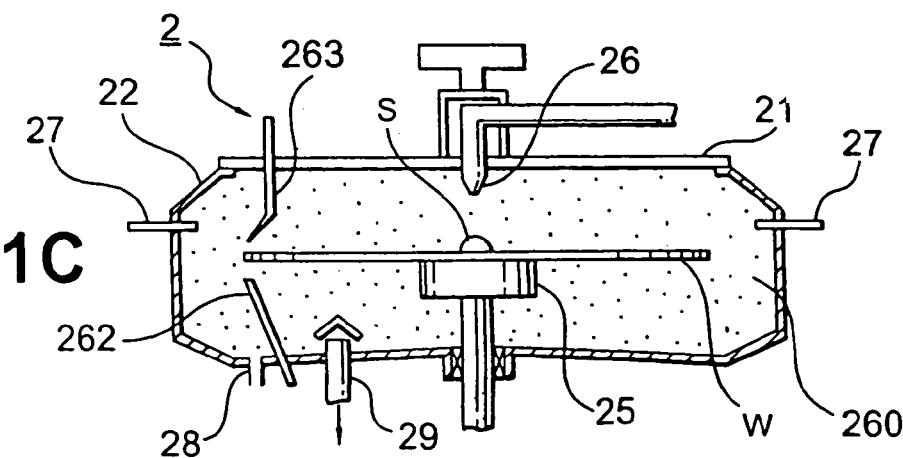

ETHYLENE GLYCOL

FIG. 31

| TIME FROM MIXING TO DISPENSING | CONDITION OF FILM QUALITY | SURFACE UNIFORMITY (%) |
|---|---|---|
| 1MIN | ○ | 10% OR LOWER |
| 2MIN | ○ | 10% OR LOWER |
| 3MIN | ○ | 10% OR LOWER |
| 4MIN | ○ | 10% OR LOWER |
| 5MIN | ○ | 10% OR LOWER |
| 6MIN | ○ | 10% OR LOWER |
| 10MIN | × | 20% |
| 30MIN | × | 40% |

ETHYLENE GLYCOL VAPOR

ETHYLENE GLYCOL

METHOD OF COATING FILM, COATING UNIT, AGING UNIT, SOLVENT REPLACEMENT UNIT, AND APPARATUS FOR COATING FILM

This application is a divisional of U.S. application Ser. No. 10/421,839, filed Apr. 24, 2003, now U.S. Pat. No. 6,726,775, which is a divisional of U.S. application Ser. No. 09/842,395, filed Apr. 26, 2001, now U.S. Pat. No. 6,589,339, which is a divisional of U.S. application Ser. No. 09/210,759, filed Dec. 14, 1998, now U.S. Pat. No. 6,248,168.

BACKGROUND OF THE INVENTION

1. Field of the Invention

The present invention relates to a coating method of forming an insulating film by coating a coating liquid dispersed therein particles or colloids destined to be a starting material of a film component in a solvent on a surface of a substrate, and relates to a coating unit, an aging unit, and a solvent replacement unit, and a film coating apparatus for coating a film.

2. Description of the Related Art

As a method of forming an interlayer insulating film of a semiconductor device, CVD and thermal oxidation are well known. On the other hand, other than these, there is a method called a sol-gel method. In this sol-gel method, a coating liquid dispersed colloids of TEOS (tetra-ethoxy-silane; $Si(C_2H_5O)_4$) in an organic solvent such as ethanol solution is coated on a surface of a semiconductor wafer (hereinafter, simply refers to as wafer), the coated film, after being gelled, is dried, to obtain a silicon oxide film. The examples of this sol-gel method are disclosed in Japanese Patent Laid-Open Application Nos. HEI-8-162450 and HEI-8-59362.

Behavior in the course of change of the coated film in this sol-gel method is shown schematically in FIG. 10A through FIG. 10C. First, particles or colloids 100 of the TEOS, when coated on a wafer, are in a dispersed state in a solvent 200 (FIG. 10A). Then, this coated film, by being subjected to an basic atmosphere or to heating, is promoted in polycondensation and hydrolysis of the TEOS. As the result, the coated film is gelled to form a reticular structure of the TEOS 300 (FIG. 10B).

Next, in order to remove moisture in the coating liquid, the solvent in the coated film is replaced by another solvent 400 of which boiling point is low and surface tension is small (FIG. 10C). By drying further thereafter, a coated film of a silicon oxide film is obtained.

Incidentally, a step of replacing the solvent shown in FIG. 10C is carried out to remove moisture. Further, the step of replacing with the solvent is carried out with an object to make the film hydrophobic. That is, since OH group is liable to absorb the moisture, the OH group combined to a terminal portion of Si—O bond is replaced by another organic substance by cleaning the film with, for instance, HMDS or the like.

Further, another object is to suppress collapse of a structure of the film by employing a solvent of smaller surface tension than ethanol so that a large force is not placed on the reticular structure of the TEOS when the solvent vaporizes.

Thus, there are an uncountable number of minute pores in the silicon oxide film formed by the sol-gel method, there comes in air. Therefore, relative dielectric constant of the oxide film $\epsilon$ is close to that of air. Therefore, the electric resistance of the oxide film including such minute pores becomes such high as is close to that of air, resulting in an ideal insulating film.

In order to apply such a sol-gel method in an actual manufacturing line, a coating unit of coating a coating liquid on a wafer, an aging unit of gelling the coated film by heating the wafer at a pre-determined temperature, for instance, at 100° C., and a replacement unit of replacing the solvent in the coated film by another solvent are necessary. Further, a pre-treatment unit for carrying out the pre-treatment such as hydrophobic treatment to the wafer, and a baking unit of drying the wafer are also necessary. And, by disposing a transfer mechanism of transferring the wafers between respective units, an apparatus is constituted.

Now, upon carrying out gelling treatment of the coated film, it is necessary that, through suppression of evaporation of the solvent from the coated film, gelling of the TEOS is made not to be disturbed. For this, it is not desirable to carry out gelling operation in an open system like the conventional method. Instead, the gelling treatment needs only to be carried out in a sealed container of an atmosphere filled with vapor of the solvent. That is, after disposing a wafer on a stage heated at a pre-determined temperature in the sealed container, gas including vapor of the solvent needs only to be introduced.

Now, the inventors of the present invention investigated to carry out the gelling operation with an aging unit 3 of a structure illustrated in FIG. 11, for instance. The aging unit 3 comprises a heating plate 30, a cover 33 provided with a heater, a gas introducing path 34, and a gas exhausting path 35.

As shown in FIG. 11, in this aging unit 3, the heating plate 30 is formed of ceramic and incorporates a heater 31a.

The cover 33 is provided with a heater. This cover 33 is intimately connected to a circumference portion of the heating plate 30 through a sealing member 32, and, together with the heating plate 30, constitutes a sealed container defining a treatment chamber S.

In the heating plate 30, outside along the circumference portion of the wafer W, a gas introducing inlet 34a is formed in slit. This gas introducing inlet 34a penetrates the heating plate 30 and is connected to a gas introducing path 34 introducing gas from the outsides.

At the central portion of the cover 33, an exhausting outlet 35a is disposed. This exhausting outlet 35a penetrates the cover 33 to connect the exhausting path 35 communicating with the outsides. In addition, to the aging unit 3, 3 pieces of pins 36 for going up and down are disposed, for instance, and with these pins for going up and down, the wafer W is moved up and down between the heating plate 30 and the above position thereof.

As a gas to be employed here, a gas of a solvent component, for instance, vapor of ethylene glycol, is employed in order to suppress evaporation of the solvent inside the coated film during the atmosphere for heat treatment is heated.

And the gas introducing path 34 is disposed penetrating the heating plate 30. Therefore, the gas is introduced into the sealed container after being heated to approximately 100° C., for instance, or a temperature extremely close to that temperature. At this time, the concentration of the vapor of ethylene glycol is a concentration that is equal with the saturated vapor pressure at a treatment temperature of approximately 100° C., for instance. Further, in addition to ethylene glycol, a gas accelerating gelation, ammonia gas, for instance, can be introduced simultaneously.

However, in such a sealed container as the aging unit 3 shown in FIG. 11, when introduction of gas therein is started, there is such a problem that until supply of the gas reaches a steady state, the concentration and temperature of the gas fluctuate.

Also as aforementioned, in the case of a wafer being processed at a pre-determined temperature higher than normal temperature, 100° C., for instance, when the wafer of the room temperature is transferred as it is into the sealed container of a pre-determined temperature, the gas of the solvent component which is at the saturated vapor pressure in the sealed container contacts with the wafer, to lower the temperature thereof. As the result, it becomes a super-saturated state, and the gas of the solvent component is likely to condense. When ethylene glycol, for instance, condenses on the wafer, the thickness of that part becomes thick, resulting in a problem of becoming a non-homogeneous insulating film.

SUMMARY OF THE INVENTION

The first invention of the present application is made to solve such a problem.

That is, an object of the first invention is to provide a method of coating a film which are capable of suppressing fluctuation of temperature and concentration at the starting time of gas introduction into a sealed container, capable of preventing the solvent component from condensation immediate after transfer of a substrate, for instance, an wafer into the sealed container, and capable of obtaining thereby a thin film, for instance, an interlayer insulating film, of an excellent quality, an aging unit, and an apparatus of coating a film.

For this, a method of coating a film of the first invention comprises the following steps as disclosed in claim a step of forming a film by coating a liquid, in which particles or colloids of a starting material of a film component is dispersed in a solvent, on a surface of a substrate;

a first gelling step of, in addition to transferring of the substrate into a sealed container, gelling the substrate in a state of the coated substrate being exposed to gas including vapor of the solvent of the coating liquid at a first average concentration; and a second gelling step of gelling in a state where the insides of the sealed container is filled by a gas including the vapor of the solvent of the coating liquid at a second average concentration higher than the first average concentration.

Further, an aging unit for carrying out this method of forming the film comprises:

a treatment chamber accommodating a substrate thereon a film including a solvent and particles or colloids of starting material of a film component is formed;

a heater of heating the substrate;

a carrier gas feeding system feeding the carrier gas towards the treatment chamber;

a solvent dispensing system of dispensing the solvent towards the treatment chamber;

a mixing system forming a gas mixture containing vapor of the solvent from the carrier gas feeding system and the solvent dispensing system; and an adjusting mechanism for adjusting concentration of the solvent in the gas mixture.

Further, an apparatus of forming a film for carrying out the aforementioned method of forming the film comprises:

a coating unit of coating a liquid in which particles or colloids of a starting material of a film component is dispersed on a surface of a substrate;

an aging unit comprising a treatment chamber accommodating a substrate thereon a film is formed, a heater heating the substrate, a carrier gas feeding system feeding a carrier gas towards the treatment chamber, a solvent dispensing system dispensing the solvent towards the treatment chamber, a mixing system forming a gas mixture containing vapor of solvent from the carrier gas feeding system and the solvent dispensing system, an adjustment mechanism adjusting concentration of the solvent of the gas mixture, and a solvent replacement unit replacing the solvent in the coated film.

In the aforementioned method, the gas introduced into the sealed container in the first gelling step is preferable to be adjusted in temperature to approximately a temperature of the inside of the sealed container.

According to the first invention, after a substrate is transferred into a sealed container until the temperature of the substrate reaches the pre-determined temperature, the average concentration of the solvent component is made low. On the other hand, when the temperature of the substrate becomes high, the concentration of the solvent component is made high. Therefore, immediate after the substrate is transferred into the sealed container, the gas of the solvent component can be prevented from condensation.

Incidentally, before transferring the substrate into the sealed container, it is preferable that while a mixture of vapor of the solvent component and a carrier gas is formed, the gas mixture is being exhausted. By implementing like this, the fluctuation of the concentration of the solvent component and the temperature can be suppressed at the starting of gas introduction.

Specific examples of the first invention are cited as follows. A step of gelling particles or colloids of the coated film is one that heats the substrate. Further, the gas to be introduced into the sealed container is made by mixing a carrier gas and the vapor of the solvent component. The first gelling step is carried out by adjusting the flow rate of at least one of the carrier gas or the vapor of the solvent component. Further, mixing of the carrier gas and the vapor of the solvent component is carried out at an evaporator which evaporates liquid of the solvent component. The first gelling step is carried out by adjusting the flow rate of the liquid of the solvent component being introduced into the evaporator.

In this case, the first gelling step includes the step of varying continuously the concentration of the vapor of the solvent component. Further, the first gelling step includes the step of mixing intermittently the vapor of the solvent component with the carrier gas.

Further, the second gelling step includes the step of, after the first gelling step is carried out subsequent transfer of the substrate into the sealed container, feeding the gas into the sealed container in a state where the average concentration of the vapor of the solvent component is higher than that during the first gelling step.

Further, an average concentration of the solvent of the gas being exposed to the substrate at each step is preferable to be the concentration corresponding to the saturated vapor pressure at the substrate temperature at each step. For instance, the aforementioned first average concentration is preferable to be the concentration corresponding to the saturated vapor pressure at the substrate temperature at the time of introduction of the container, the second average concentration being preferable to be the concentration corresponding to the saturated vapor pressure at the substrate temperature during gelling.

The reason is that there is a problem that, when the average concentration of the solvent in the gas is lower than the saturated vapor pressure, the solvent volatilizes from the coated film on the substrate, resulting in difficulty of generating pores in the film.

On the other hand, when the average concentration of the solvent in the gas is higher than the saturated vapor pressure, there is a problem that the vapor condenses on the substrate or on the wall of the treatment chamber, the condensation on the substrate induces deterioration of the film quality, and the condensation on the wall of the treatment chamber tends to cause contamination of the apparatus or re-sticking on the substrate.

Next, as the second invention, the inventors investigated to form an interlayer insulating film by use of sol-gel method illustrated in FIG. 10A to FIG. 10C.

Here, the inventors further attempted to replace the solvent in the coated film by another solvent 400 (FIG. 10C). In this replacement step of the solvent, after replacement of water in the coated film by ethanol, for instance, HMDS (hexamethyl disilane) is supplied to remove OH group, and finally replacement by heptane is carried out.

The reason for employing heptane here is to suppress collapse of the film structure by avoiding, with use of a solvent of low surface tension, a large power placed on a reticular structure of TEOS during vaporization of the solvent.

When applying such a sol-gel method into an actual manufacturing line, a coating unit for coating a coating liquid on a wafer, a gelling unit for gelling the coated film and a replacement unit for replacing the solvent in the coated film by another solvent are necessary.

In the replacement step of the solvent, because of use of 3 solvents as aforementioned, the present inventors attempted to employ a conventional resist coating device for the replacement unit.

The resist coating device will be described with reference to FIG. 18.

The device comprises a vacuum chuck 194 which is capable of going up and down and rotates a wafer while holding in a horizontal position, a fixed cup 195, and a nozzle 196 for dispensing a solvent to the wafer. The fixed cup 195 is disposed such that it surrounds the wafer W on the chuck 194, and an opening portion at an upper surface is opened or closed by the cup 195a.

As the nozzle 196, 3 pieces of nozzles 196a to 196c which discharge ethanol, HMDS and heptane, respectively, are disposed. These nozzles of 196a to 196c are taken out in this order by grasping by a carrying arm 197 from nozzle receiving portions 198a to 198c, and are transferred up to around the central portion above the wafer W.

In the case of carrying out the solvent replacement step of the sol-gel method with such an apparatus, first, in a state where the cover 195a is open, the wafer W is transferred to the chuck 194. Then, ethanol is dripped from the nozzle 196a onto the wafer W, thereafter the fixed cup 195 is closed, the wafer W is rotated. Thus, the ethanol is diffused over the whole front surface of the wafer W through centrifugal force. Thereafter, the cover 195a is opened, similarly HMDS is supplied on the surface of the wafer W with the nozzle 196b. Then, heptane is further supplied on the surface of the wafer W through the nozzle 196c, to carry out treatment.

However, in the aforementioned apparatus, since 3 pieces of nozzles 196 prepared for the respective solvents are grasped by a carrying arm 197 to transfer, when the solvent is supplied on the surface of the wafer W, after transfer by the nozzle 196a, the nozzle 196b is necessary to be transferred. That is, the carrying arm 197 was required to repeat to go and return several times between the nozzle receiving portion 198 and a position above the wafer W. Further, each time one solvent is diffused-on the wafer W, the cover 195a of the fixed cup 195 was necessary to be opened and closed.

Thus, the next solvent is impossible to be supplied continuously succeeding the supply of one solvent, supply of the solvent is stopped to cause idle time.

Moreover, since until next supply of the solvent, a travelling time of the carrying arm 197 and an opening/closing time of the cover 195a are piled up, a certain degree of time is necessary.

When it takes time between replacements of the solvents and there is an idle time of the supply of the solvent, the solvent on the surface of the wafer, for instance, contacts with the air. Therefore, there occurs such an inconvenience as that moisture in the air is confined in the film. And, as the result, the formed interlayer insulating film is deteriorated in its film quality.

The second invention of the present application was made to solve such a problem.

That is, an object of the second invention of the present application is to provide, in a method of forming a film having a step of carrying out replacement of solvents by dispensing successively at least a plurality of solvents on a surface of a substrate thereon a coated film is to be formed, a method of forming a film, a solvent replacement unit, and an apparatus for forming a film in which a preceding solvent and a succeeding solvent can be supplied continuously, thereby enabling to obtain an excellent thin film such as an interlayer insulating film.

Therefore, a method of forming a film of the second invention comprises the following steps disclosed in claim 13:

a step of forming a film on a surface of a substrate by coating a coating liquid in which particles or colloids of a starting material of a film component are dispersed in a solvent;

a step of gelling the particles or the colloids in the coated film; and a step of dispensing at least 2 kinds of replacement solvents different from the aforementioned solvent on the surface of the substrate by switching successively;

wherein the switching of the replacement solvent to be supplied is carried out by starting dispensing of the succeeding solvent while dispensing the preceding replacement solvent, and thereafter by stopping supply of the preceding replacement solvent.

Further, a solvent replacement unit for carrying out this method of coating a film comprises:

a treatment vessel accommodating a substrate formed thereon a film containing the solvent and particles or colloids of the starting material of the film component;

a spin chuck holding the substrate disposed in the treatment vessel;

a plurality of solvent supply systems dispensing solvents towards the substrate; and a switching device for switching the plurality of solvent dispensing systems.

Further, an apparatus of forming a film for carrying out the aforementioned method of forming a film comprises:

a coating unit forming a film on a surface of a substrate by coating a liquid in which particles or colloids of the starting material of the film component are dispersed in a solvent;

an aging unit for gelling the coated film; and a solvent replacement unit consisting of a treatment vessel accommodating a substrate formed thereon a film containing the solvent and particles or colloids of the starting material of the film component, a spin chuck holding the substrate disposed in the treatment vessel, a plurality of solvent supply systems dispensing solvents to the substrate, and a switching device switching the plurality of solvent supply systems.

In the method of the second invention, since the supply of the succeeding solvent begins before the supply of the preceding solvent is ceased, the preceding solvent and the succeeding solvent are continuously supplied on the surface of the coated film without being interrupted. Thus, in the solvent replacement step, there is no time of interruption of supply of the solvent on the surface of the substrate thereon the coated film is formed. Therefore, occurrence of such an inconvenience as that occurs due to stoppage of the supply of the solvent, inclusion of moisture in the coated film, for instance, can be suppressed, resulting in formation of an excellent thin film on the substrate.

In the second invention, in the solvent replacement step, among the plurality kinds of solvents, at least 2 kinds of solvents may be supplied on a substrate from a common solvent dispensing portion, each of the plurality of kinds of solvents may be supplied on the substrate from separate solvent dispensing portions. Further, in the solvent replacement step, alcohol, a liquid for hydrophobic treatment, and a solvent of smaller surface tension than the solvent contained in the coating liquid, for instance, are supplied in this order on the substrate.

Next, as the third invention, the inventors attempted to use spin coating, which is used in coating of resist, as a coating method. In this unit, on the central portion of the wafer sucked to a spin chuck, the coating liquid is dripped, the spin chuck is rotated to thin out the coated film over the whole surface through centrifugal force to coat.

Now, since, during coating of a coating liquid, the wafer is rotated with high speed, air flow is generated along the surface of the wafer, resulting in speedy evaporation of the solvent in the coating liquid. Therefore, evaporation of the solvent is being tried to be suppressed by adjusting the temperature and humidity of the coating unit and the temperature of the coating liquid. However, it is difficult to suppress sufficiently the evaporation of the solvent through only adjustment of their temperature and humidity. In addition, when the solvent evaporates much, gelling of the solvent is disturbed to deteriorate the film quality of the silicon oxide film.

The third invention of the present application was made to solve such a problem.

That is, an object of the third invention is to provide a method of forming a film, a coating unit, and an apparatus of forming a film which, when obtaining a film by coating a coating liquid dispersed therein starting material of film components of colloids or particles in a solvent on the substrate, enable to obtain a thin film of excellent quality such as an interlayer insulating film.

For this, the third method of forming a film comprises the following steps as disclosed in claim 19:
a step of forming a film by coating a coating liquid, in which particles or colloids of the starting material of a film component are dispersed in a solvent, on a surface of a substrate under an atmosphere filled by the vapor of the solvent; and
a step of gelling the particles or colloids in the coated film;
wherein the vapor of the solvent contains one vapor of any one of solvent components.

As an example of a method of the third invention, a method of forming a film comprising the following steps can be cited:
a step of transferring a substrate into a treatment vessel from an inlet;
a step of closing the inlet of the treatment vessel;
a step of filling the treatment vessel with vapor of a solvent;
a step of coating a coating liquid in which particles or colloids of the starting material of the film component are dispersed in the solvent on the surface of the substrate in the treatment vessel filled by the vapor; and
a step of gelling the particles or the colloids in the coated film.

As another example of the method of the third invention, a method of forming a film comprising the following steps can be cited:
a step of disposing a substrate on a rotary stage by transferring into the treatment vessel from the inlet;
a step of closing the substrate inlet of the treatment vessel;
a step of filling the vapor by feeding vapor of the solvent into the treatment vessel;
a step of, together with rotating a rotary stage, spreading a coating liquid on the surface of the substrate by dispensing the coating liquid, in which particles or colloids of the starting material of the film component are dispersed in the solvent, on a surface of the substrate; and
a step of gelling the particles or the colloids in the coated film.

Further, a coating unit for carrying out this coating method comprises:
a treatment vessel accommodating a substrate;
a spin chuck holding the substrate disposed in the treatment vessel;
a coating liquid nozzle dispensing a coating liquid on the substrate;
a coating liquid supply system dispensing a coating liquid, in which particles or colloids of starting material of film component are dispersed in the solvent, to the coating liquid nozzle;
a solvent nozzle dispensing the solvent into the treatment vessel; and
a solvent supply system dispensing the solvent to the solvent nozzle.

Further, an apparatus of forming a film for carrying out the aforementioned film forming method comprises:
a coating unit forming the film on the substrate comprising a treatment vessel accommodating a substrate, a spin chuck holding the substrate disposed in the treatment vessel, a coating liquid nozzle dispensing the coating liquid to the substrate, a coating liquid supply system dispensing a coating liquid, in which particles or colloids of the starting material of film component are dispersed in the solvent, to the coating liquid nozzle, a solvent nozzle dispensing the solvent into the treatment vessel, and a solvent dispensing system dispensing the solvent to the solvent nozzle;
an aging unit for gelling the coated film; and
a solvent replacement unit replacing the solvent in the coated film.

The third invention, after a film is formed on a surface of a substrate, while keeping an atmosphere therein the substrate is placed an atmosphere filled with vapor of the solvent, on the circumference portion of the substrate, a cleaning liquid of removing the coated film may be supplied to remove the coated film of the circumference portion.

In this case, the solvent contains a plurality kinds of organic solvents. The third invention includes the case where the vapor is at least one vapor of the plurality kinds of organic solvents.

For instance, the solvent contains ethylene glycol and alcohol, the vapor of the solvent is ethylene glycol. The starting material of the film component is a metal alkoxide, for instance.

Next, as the fourth invention, the inventors attempted to apply the aforementioned sol-gel method in an actual manufacturing line. That is, the inventors attempted to form a film by, in the step of forming a film, dispensing a coating liquid, in which particles or colloids of TEOS are dispersed in the solvent, on an approximately center of rotation of the wafer surface, then by rotating the wafer around a vertical axis, thereby spreading a coating liquid over the whole surface of the wafer by making use of centrifugal force of rotation.

Now, after the coating liquid is coated on the wafer, vaporization of the solvent is required to be suppressed not to disturb gelling of TEOS. For this, as one solvent components of the coating liquid, a solvent, which has a high boiling point and is difficult to evaporate, such as ethylene glycol, is employed.

However, because of high viscosity of ethylene glycol, use of it as the solvent causes the viscosity of the coating liquid itself.

On the other hand, on the surface of the wafer thereon an interlayer insulating film is formed, due to disposition of aluminum wiring, there is fine unevenness. Therefore, only by rotating the wafer after supply of the coating liquid on the surface of the wafer as described above, the coating liquid is difficult to spread due to its viscosity. Accordingly, the coating liquid is difficult to come into the fine unevenness of the surface of the wafer, thus, there occurs a problem that a film is difficult to be coated on the whole surface of the wafer. In recent years, in particular, finer pattern is a trend. As the trend of the fine pattern advances and the width of aluminum wiring becomes narrow, the coating liquid is the more difficult to come into.

The fourth invention of the present application was carried out to solve such a problem.

That is, an object of the fourth invention is to provide a method of forming a film, a coating unit, and an apparatus of forming a film in which the coating liquid is easily coated on the surface of the substrate, thereby a film is formed universally all over the surface of the substrate, as a result, an excellent thin film such as an interlayer insulating film can be obtained.

For this, a method of forming a film of the fourth invention comprises the following steps as disclosed in claim 26:

a step of coating the solvent of lower viscosity than the most viscous component among the solvent components of the coating liquids in which particles or colloids of the starting material of the film component are dispersed in a solvent, and of capable of dissolving the starting material, on the surface of the substrate;

a step of forming a film by coating the coating liquid on the surface of the substrate; and a step of gelling particles or colloids in the coated film.

Here, as a starting material, tetraethoxysilane can be employed. Further, after the step of gelling, on the surface of the substrate thereon a film is formed, the other solvent than the aforementioned one is supplied, thereby the solvent replacement step for replacing the solvent in the coated film by the different solvent may be carried out.

Further, a coating unit for carrying out this film forming method comprises:

a treatment vessel accommodating a substrate;

a spin chuck holding the substrate disposed in the treatment vessel;

a solvent nozzle dispensing solvent to the substrate;

a solvent supply system dispensing the solvent to the solvent nozzle;

a coating liquid nozzle dispensing the coating liquid to the substrate thereto the solvent is supplied; and a coating liquid supply system dispensing the coating liquid in which particles or colloids of the starting materials of film components are dispersed in the solvent to the coating liquid nozzle.

Further, an apparatus of forming a film for carrying out the aforementioned method for forming a film comprises:

a coating unit comprising a treatment vessel accommodating a substrate, a spin chuck holding the substrate disposed in the treatment vessel, a solvent nozzle dispensing solvent to the substrate, a solvent supply system dispensing solvent to the solvent nozzle, a coating liquid nozzle dispensing coating liquid to substrate thereto the solvent is supplied, and a coating liquid supply system dispensing the coating liquid in which particles or colloids of the starting materials of film components is dispersed in the solvent to the coating liquid nozzle;

an aging unit for gelling the coated film; and a solvent replacement unit for replacing the solvent in the coated film.

In the method according to the fourth invention, in the step of forming a film, before coating a coating liquid on a substrate, a solvent of smaller viscosity than that of the component of the most highest viscosity among the components of solvent of the coating liquid is coated over the whole surface of the substrate. Accordingly, when the coating liquid is supplied on the surface thereof, first, the starting material of the coating liquid and water are dissolved in the solution coated over the whole surface of the substrate.

Thereby, due to mixing of the coating liquid and the solution, the viscosity of the coating liquid becomes low. Accordingly, the coating liquid becomes easy to spread on the substrate, to be coated over the whole surface of the substrate universally. As the result, a thin film of excellent quality can be formed.

According to the method of the fourth invention, as a solution to be coated on a surface of a substrate before coating the coating liquid on the surface of the substrate, one component of lower viscosity than the highest one among the aforementioned components of the solvent may be employed. In this case, since one solvent component is coated, when the coating liquid is applied, this component and the coating liquid are likely to be easily mixed. And, upon mixing thereof, there is no occurrence of bubbles, accordingly a coated film of more excellent quality can be formed. Further, as a solution to be coated on the surface of the substrate preceding the step of applying the coating liquid on the surface of the substrate, alcohol can be employed. Since alcohol can dissolve the aforementioned starting materials and water, effect as identical as the aforementioned method of the first disclosure of the fourth invention can be obtained.

Next, as the fifth invention, the inventors have studied a method of forming an interlayer insulating film by use of the aforementioned sol-gel method.

In the case of applying the aforementioned sol-gel method in an actual manufacturing line, in the step of forming a film, the coating liquid is supplied approximately the center of rotation on the surface of the wafer, then the wafer is rotated. Thus, by spreading the coating liquid over the whole surface of the wafer by use of the centrifugal force of rotation, a film is formed. In this case, the coating liquid is made by mixing TEOS and the solvent in advance, the mixed liquid (coating liquid) is stored in a tank or the like, and the stored coating liquid is supplied on the surface of the wafer.

However, in the case of a film being formed with the coating liquid formed in advance and stored in a tank, there are some cases where unevenness of the film thickness or film quality is confirmed by eye-inspection. According to observation by the inventors, in the case of the coating liquid which has stood for a certain degree of time period after mixing of TEOS and the solvent being coated on the wafer, deterioration of the film quality was experientially confirmed to occur. This is a problem.

The fifth invention of the present application was made to solve such a problem.

That is, an object of the fifth invention is to provide a method of forming a film which can suppress deterioration of the film quality of the coated film, as a result, can obtain a thin film such as an interlayer insulating film of excellent quality.

For this, a method of forming a film of the fifth invention comprises the following steps as disclosed in claim 32:

a step of mixing a first liquid containing particles or colloids of a starting material of a film component which is insoluble or difficult to be dissolved in water and water, and a second liquid consisting of an organic solvent which can dissolve water and the film component;

a step of coating, after completion of the aforementioned mixing, before lapse of time in which the quality of the film obtained by the mixing deteriorates, the mixed liquid containing the first liquid and the second liquid on the surface of the substrate; and a step of gelling the particles or the colloids in the film coated on the substrate.

According to the method of the fifth invention, after mixing of the first liquid and the second liquid, before lapse of the time period where the film quality of the obtained coated film deteriorates, within 6 min. after mixing for instance, the coating liquid is coated on the surface of the substrate. Thereby, the film quality of the coated film can be suppressed from deterioration, resulting in an excellent thin film such as a silicon oxide film.

In this fifth invention, after a step of coating the mixed liquid which does not stand the deterioration time of the film quality after completion of mixing of the first and the second liquids, before coating of the mixed liquid on the surface of the next substrate, a step of cleaning the mixing portion of the first and second liquids and the insides of the liquid path at the down-stream of the mixing portion with an organic solvent such as alcohol may be carried out.

In this case, the mixed liquid which remained in the liquid path and lapsed the film quality deteriorating time after mixing is cleared away by the organic solvent. Therefore, upon treatment of the next substrate, the old mixed liquid remaining in the liquid path is not coated, accordingly deterioration of the film quality can be suppressed.

Further, when alcohol is employed as the organic solvent, since alcohol dissolves the starting materials of the film components and water, cleaning of the insides of the liquid path can be carried out readily.

Next, as the sixth invention, the inventors have studied another method of forming a film with use of the aforementioned sol-gel method.

That is, in the aforementioned sol-gel method, after coating of the coating liquid on the wafer, by standing for one night, for instance, the coated film is gelled. However, for mass production, gelation should be carried out as fast as possible. As one method for this, heating of the wafer may be one candidate, however, in this case, the solvent in the coated film is activated in evaporation.

For this, the inventors have studied, as the sixth invention, of carrying out gelation at, for instance, room temperature with use of ammonium gas ($NH_3$) containing water vapor.

The reason of containing moisture in ammonium gas is as follows. That is, a part of ammonium gas containing water vapor, upon sticking on the coated film, is ionized such as

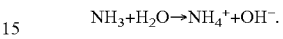

$NH_3 + H_2O \rightarrow NH_4^+ + OH^-$.

That is, under presence of water, hydroxide group is formed to be basic. An alkali is a catalyst accelerating polycondensation and contributes to gelation. From this, water vapor is necessary to be contained. And, as the state approaches the saturated state due to much water vapor, OH groups can be expected to be generated much, accordingly the rate of gelation is considered to be fast.

In FIG. 35, a device being used when gelation is carried out with ammonium gas containing water vapor close to the saturated state is illustrated.

The device 501 comprises a disposing stage 511 of an wafer W, a treatment vessel 510 capable of tight sealing consisting of a sealing member 512 and a cover 513, a tank 521 storing commercial ammonia water ($NH_4OH$) (concentration of ammonia: 30% by weight at normal temperature) 520, a bubbling gas supply pipe 522 of carrying out bubbling by introducing ammonia gas into ammonia water 520 in the tank 521, an exhausting outlet 523 of exhausting the treatment gas generated by bubbling, and a piping 525 communicating the exhausting outlet 523 and the gas introducing inlet 514 disposed at the disposing stage 511.

At normal temperature, ammonia water contains approximately 33% by weight of ammonia as saturated concentration. Therefore, if the bubbling is started at normal temperature with the commercial ammonia water as it is, first, ammonia gas is absorbed in the ammonia water. During this, ammonia gas is not generated or is not generated enough to obtain desired flow rate if generated, accordingly gelation takes a long time. And, when the concentration of ammonia in the ammonia water attains approximately 33% by weight, the ammonia gas containing water vapor of approximately saturated concentration is generated as a treatment gas. The generated treatment gas is introduced into the treatment vessel 510 through the piping 525 and is exhausted out through an exhausting path 515 opened at a cover 513 of the treatment vessel 510.

However, in this device, as mentioned above, the commercial ammonia water is employed as it is. Therefore, when continuous treatment of the wafer is implemented, if ammonia water 520 in the tank 521 is replenished, the concentration of the ammonia water 520 is temporarily lowered and ammonia gas is absorbed. Accordingly, ammonia gas is not generated or, if generated, the desired flow rate can not be obtained. Therefore, there is a problem that gelation can not be completed, accordingly, the desired film thickness and film quality can not be obtained.

As a method preventing this from occurring, such a method is considered that, immediately before replenishment of ammonia water, gelling treatment is interrupted, and, after the treatment gas begins to be generated again, gelling is started again. However, upon carrying out like this, there occurs a problem that serviceability ratio of the device goes down, thereby through-put also goes down.

The sixth invention of the present application is made to solve such a problem.

That is, an object of the sixth invention is, upon gelling the coated film with an ammonia gas, to provide a gas treatment method capable of carrying out stable treatment, and capable of treating evenly between subjects to be treated.

Another object of the sixth invention is to provide a method capable of carrying out stable treatment, without restricting in the case of carrying out gelling treatment with an ammonia gas, also in the case of carrying out treatment to the subjects to be treated with the treatment gas.

For this, the method of forming a film of the sixth invention comprises the following steps as disclosed in claim 36:

a step of forming a film by coating a coating liquid, in which particles or colloids of a starting material of a film component is dispersed in a solvent, on a surface of a substrate; and a step of gelling the particles or colloids in the coated film by exposing the substrate to the ammonia gas;

wherein in the step of gelling, an ammonia gas is generated by successively introducing the ammonia gas into at least 2 vessels accommodating ammonia water of ammonia concentration lower than the saturated concentration, the ammonia gas generated precedently is supplied to the substrate, thereafter the succeedingly generated ammonia gas is supplied to the substrate, thereby conductance of the ammonia gas supplied to the substrate is maintained constant.

Further, an aging unit for carrying out the method of forming a film comprises:

a treatment vessel accommodating a substrate;

a plurality of ammonia containers accommodating ammonia water;

bubbling gas supply systems feeding a carrier gas for bubbling in the respective ammonia containers;

bubbling gas valves closing or opening the respective bubbling gas supply systems;

exhausting systems for exhausting gas generated in the respective ammonia containers;

exhausting system valves for closing or opening the respective exhausting systems;

ammonia gas supply systems for feeding gas generated at the respective ammonia containers to the treatment vessels;

ammonia gas valves closing or opening the respective ammonia gas supply systems; and a means for opening the respective bubbling gas valves in turn, at the same time, synchronizing with this closing or opening of the respective bubbling gas valves, closing respective exhausting system valves in turn, and opening the respective ammonia gas valves in turn.

Further, an apparatus of forming a film for carrying out the aforementioned method of forming a film comprises:

a coating unit for coating a coating liquid on a substrate;

an aging unit comprising a treatment vessel accommodating a substrate, a plurality of ammonia containers accommodating ammonia water, bubbling gas supply systems feeding a carrier gas for bubbling to the respective ammonia containers, bubbling gas valves closing or opening the respective bubbling gas supply systems, exhausting systems for exhausting gas generated from the respective ammonia containers, exhausting system valves for closing or opening the respective exhausting systems, ammonia gas supply systems feeding the gas generated at the respective ammonia containers to the treatment vessel, ammonia gas valves closing or opening the respective ammonia gas supply systems, and a means which opens in turn the respective bubbling gas valves, at the same time, synchronizing with closing or opening of the respective bubbling gas valves, closes in turn the respective exhausting system valves, and opens in turn the respective ammonia gas valves; and a solvent replacement unit for replacing the solvent in the coated film.

Here, since the concentration of ammonia in ammonia water is lower than the saturated concentration, when ammonia water is replenished, ammonia gas, upon bubbling by it, is absorbed by ammonia water for a while. Therefore, it takes some time for ammonia gas containing vapor of moisture to be generated with stability.

According to the sixth invention, when ammonia water is replenished in the precedent container, the first container, for instance, ammonia gas is being generated from the succeeding container, the second container, for instance, accordingly supply of the ammonia gas containing vapor of moisture is not interrupted, thereby stable treatment can be carried out.

Further, by equalizing conductance of the path when gas flows from the precedent container through the treatment vessel, conductance of the path when gas flows from the precedent container through the first exhausting path, conductance of the path when gas flows from the succeeding container through the treatment vessel, and conductance of the path when gas flows from the succeeding container through the second exhausting path, upon switching the path, fluctuation of flow rate and pressure of ammonia gas can be suppressed. Therefore, more stable treatment can be carried out.

Further, a method of forming a film of the sixth invention comprises the following steps as disclosed in claim 41:

a step of forming a film by coating a coating liquid, in which particles or colloids of a starting material of a film component is dispersed in a solvent, on a surface of a substrate; and a step of gelling the particles or the colloids in the coated film by exposing the substrate to ammonia gas;

wherein the gelling step comprises:

a preliminary exhausting step of exhausting treatment gas from gas source without going through the treatment vessel but through the exhausting path;

a step of transferring the subject to be treated into the treatment vessel; and a treatment step of treating a subject to be treated by feeding the treatment gas from the gas source into the treatment vessel by switching the path from the exhausting path to treatment vessel side;

wherein the conductance of the path upon flowing through the treatment vessel from the gas source and conductance of path upon flowing through exhausting path are made equal.

According to the sixth invention, fluctuation of the flow rate and pressure of the gas can be suppressed when the path of the gas is switched, accordingly stable treatment can be carried out.

Next, the seventh invention will be described.

When the sol-gel method as described above is being applied in an actual manufacturing line, a coating unit for coating a coating liquid on an wafer, a gelling unit for gelling the coated film, and a replacement unit for replacing the solvent in the coated film by another solvent are necessary.

In addition, a pre-treatment unit for carrying out pre-treatment such as hydrophobic treatment to the wafer, and a bake unit for drying the wafer are also necessary. The device is constituted by further disposing a transferring mechanism for transferring the wafer between respective units.

Now, when the coating liquid is coated on the wafer, the solvent, being organic solvent, evaporates. If the amount of evaporation is much, there is a problem that the aimed film thickness and film quality can not be obtained.

The seventh invention of the present application is made to solve such a problem.

That is, an object of the seventh invention is to provide an apparatus for forming a film capable of carrying out the following step as soon as possible after coating a coating liquid in which particles or colloids of a starting material of a film components are dispersed in a solvent on a substrate and capable of obtaining an excellent thin film such as interlayer insulating film, for instance.

Therefore, the apparatus of forming a film of the seventh invention comprises, as disclosed in claim 44: a coating portion of forming a film by coating a coating liquid, in which particles or colloids of a starting material of a film components is dispersed in a solvent, on a substrate; a gelling treatment portion which is disposed in neighborhood of this coated portion and gels the particles or the colloids in the coated film formed on the coated portion; a plurality of pre-treatment portions for pre-treating prior to coating of the coating liquid on the substrate; a plurality of heating portions for drying the substrate after treatment at the gelling treatment portion; a receiving portion receiving the substrate from the outside; a main transfer portion which, in addition to transferring to the coating portion through the pre-treatment portion after reception of the substrate from the receiving portion, transfers the substrate after treatment at the gelling treatment portion to the heating portion; and an auxiliary transfer portion transferring the substrate coated at the coating portion to the gelling treatment portion.

According to the seventh invention, the substrate is transferred by an exclusive auxiliary transferring portion from the coating portion to the gelling treatment portion. Therefore, the substrate, immediately after the coating liquid is applied, is transferred to the next step, thereby evaporation of the solvent can be suppressed, resulting in a thin film of excellent film quality.

Here, in the aforementioned apparatus for forming a film, on the transferring path of the substrate in the auxiliary transferring portion, a means for feeding vapor of solvent component, for instance, ethylene glycol, can be provided with. Further, a case for covering the coating portion and gelling treatment portion, and a means for feeding vapor of the solvent component into the case may be provided with. In this case, evaporation of the solvent in the coated film during transferring of the substrate can be further suppressed.

In the aforementioned apparatus for forming a film, a solvent replacement treatment portion which is disposed neighboring the gelling portion, supplies another solvent different from the aforementioned solvent to the substrate treated at the gelling treatment portion, and replaces the solvent in the coated film by another solvent, can be provided, and the substrate treated at the gelling treatment portion may be transferred to the solvent replacement treatment portion by an auxiliary transferring portion. In this case, since the time period during which large surface tension of the solvent is added on the reticular structure of TEOS is made short, collapse of the film structure is suppressed, resulting in a thin film of excellent quality.

BRIEF DESCRIPTION OF THE DRAWINGS

FIG. 9 is a diagram showing diagrammatically another example of the gas feeding means.

FIG. 21A, FIG. 21B and FIG. 21C are process diagrams showing sequentially a part of one example of processes of a method of the third invention.

FIG. 31 is a characteristic diagram showing relation between coating liquids and film quality of the coated film.

DESCRIPTION OF THE PREFERRED EMBODIMENTS

In the following, the details of specific examples of the present invention will be described with reference to drawings. Incidentally, the scope of the present invention should not be construed to be restricted to the range of the following examples.

EXAMPLE 1

Figure 1:
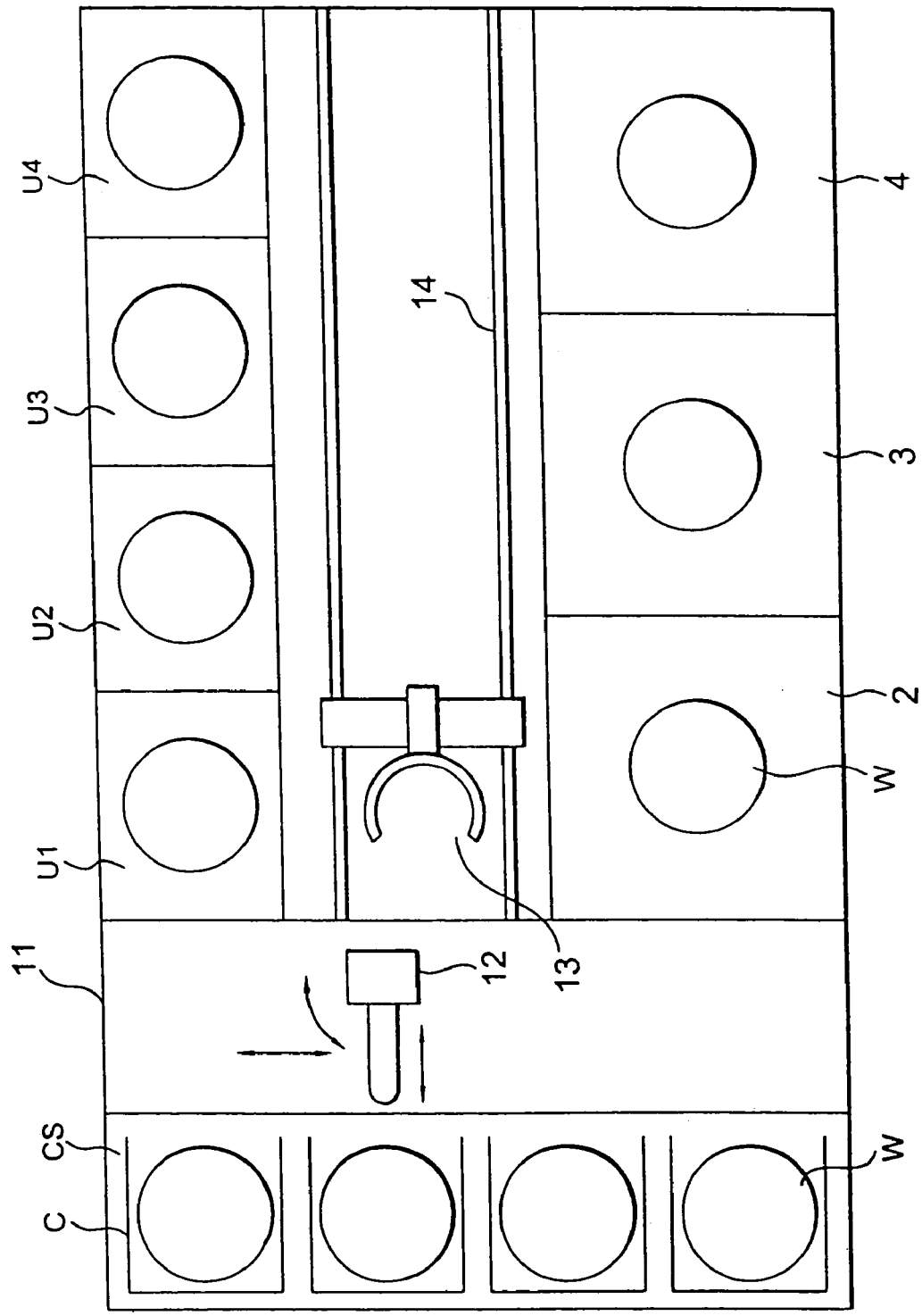
FIG. 1 is a plan view showing diagrammatically total configuration of one example of an apparatus of forming a film being employed in practicing the first invention.

FIG. 1 is a plan view showing diagrammatically an apparatus of forming a film which is employed upon practicing the method of example 1 involving the first invention of the present application. Reference numeral 11 denotes an input/output port of wafers W which are substrates. At this input/output port 11, from a cassette C disposed on a cassette stage CS, a carrying arm 12, after pulling out an wafer W, supplies to a main arm 13.

On one side of guide rails 14 which is transferring path of a main arm 13, a coating unit 2 which is a coating portion constituting a main portion of the apparatus, together with an aging unit 3 which is a gelling treatment portion and a solvent replacement unit 4 which is a solvent replacing portion, is arranged in this order. Also on the other side of the transferring path 14, treatment units U1 to U4 are arranged. To these treatment units U1 to U4, units for carrying out hydrophobic treatment preceding coating of a coating liquid on the substrate, cooling treatment, and heat treatment (bake treatment) after formation of a film on the substrate or the like are assigned, respectively.

The whole operation of example 1 employing this apparatus of forming a film will be described.

Figure 2A:
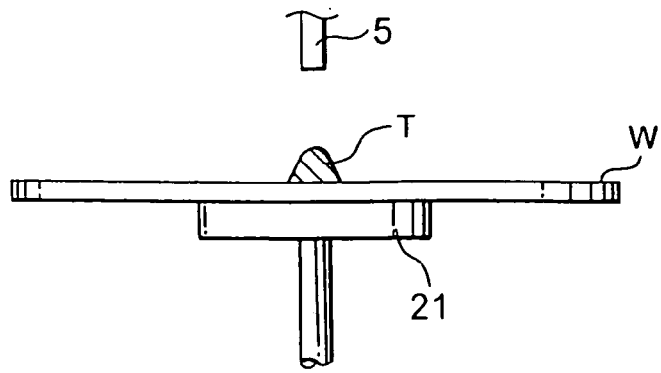
FIG. 2A, FIG. 2B, FIG. 2C and FIG. 2D are diagrams for explaining flow of treatment of formation of a film in which the aforementioned apparatus of forming a film is employed.

In FIG. 2A to FIG. 2D, flow of treatment of forming a film is schematically shown following the order. An wafer W prior to treatment which is taken out of the inside of a cassette C of a cassette stage CS by a main arm 13 is stored in a coating unit 2. And, in the coating unit 2, a coating liquid T id dripped on a surface of the wafer W (FIG. 2A). As a coating liquid, one in which colloids and/or particles of TEOS, for instance, is dispersed in a solvent containing ethylene glycol, ethyl alcohol, water and a trace of hydrochloric acid can be employed.

Figure 2B:
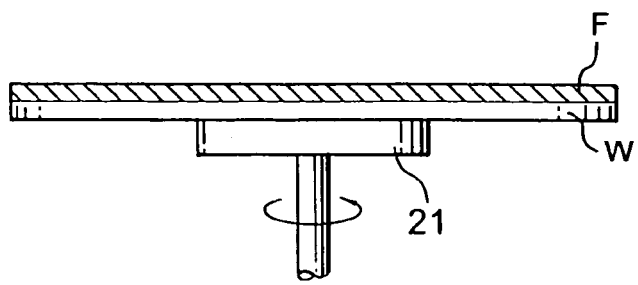

Subsequently, the inside of the coating unit 2 is filled with vapor of the solvent, ethylene glycol, for instance. In this state, when the wafer W is rotated with high speed, the coating liquid is spread over a surface of the wafer to form a coated film F (FIG. 2B).

Figure 2C:
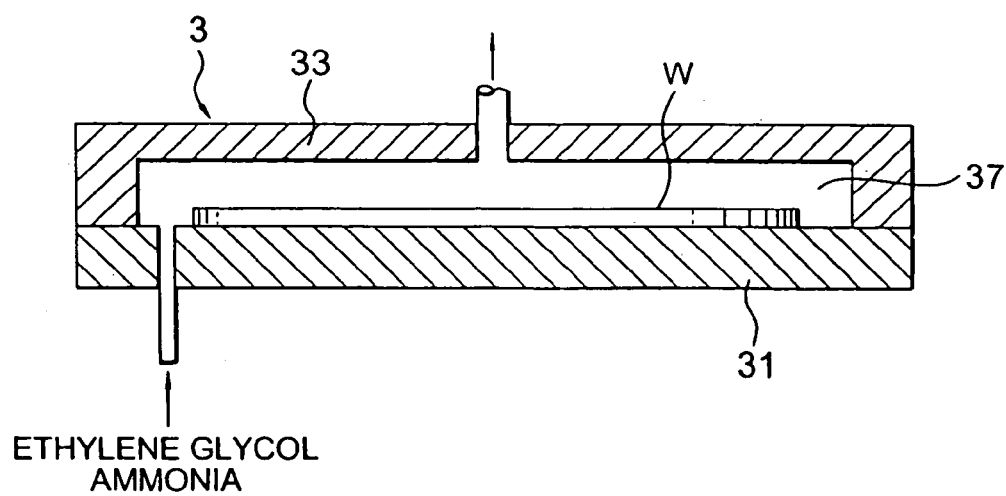

Then, the wafer W is disposed on a heating plate 31 of the aging unit 3, followed by closing of a cover 33 to seal. At this time, the wafer W is heated to a predetermined temperature, approximately 100° C., for instance, by the heating plate 31. Thereafter, vapor of ethylene glycol and a carrier gas are introduced into the aging unit 3 to gel the coated film (FIG. 2C).

Figure 2D:
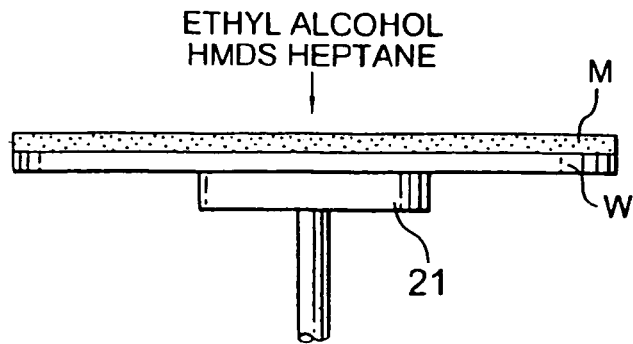

Then, in the solvent replacement unit 4, with ethyl alcohol, HMDS (hexamethyl disilane) and heptane, solvent replacement of a gelled film is carried out. By this solvent replacement, moisture in the coated film is replaced by ethyl alcohol. Further, by HMDS, hydroxide groups in the coated film are removed. Further, the solvent in the coated film is replaced by heptane. The reason to employ heptane exists in that, due to use of a solvent of lower surface tension, stress added on a porous structure, that is, a reticular structure of TEOS, can be reduced. Thereby, the reticular structure is prevented from collapsing. The state up to this step is illustrated in FIG. 2D. Thereafter, the wafer W is processed for approximately 1 min., for instance, at a bake unit. Thus, on the surface of the wafer W, an interlayer insulating film consisting of silicon oxide film of a thickness of 6000A, for instance, is formed.

Figure 3:
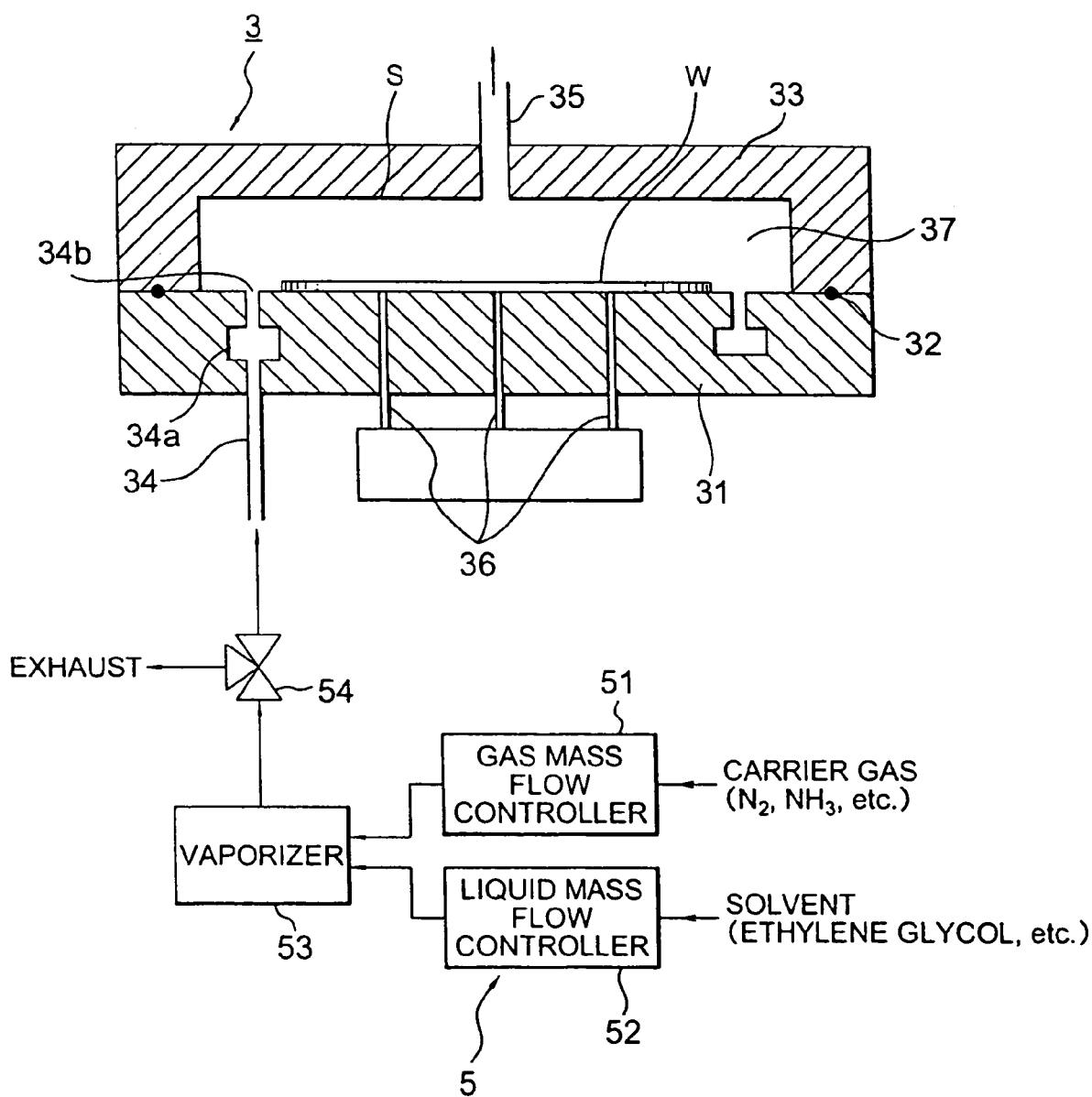
FIG. 3 is a diagram diagrammatically showing one example of an aging unit and a gas feeding means in the aforementioned apparatus of forming a film.

In FIG. 3, one example of the aging unit (gelling treatment portion) 3 and a gas feeding means 5, both of which are essential portions of the present example, is shown. As shown in FIG. 3, the gas feeding means 5 is connected to a gas introducing path 34 of the aging unit 3.

The gas feeding means comprises a gas mass flow controller 51, a liquid mass flow controller 52, a vaporizer 53, a 3-way valve 54 and pipes or tubes connecting them.

The gas mass flow controller 51 controls flow rate of the carrier gas consisting of a nitrogen gas or an ammonia gas delivered from a carrier gas feeding device (not shown in the figure).

The liquid mass flow controller 52 controls the flow rate of the solvent such as ethylene glycol delivered from a solvent dispensing device (not shown in the figure).

A vaporizer 53 vaporizes the solvent controlled in flow rate by the gas mass flow controller 51 and the liquid mass flow controller 52.

The 3-way valve 54 switches the direction of delivery of the gas containing vapor of the solvent component vaporized by the vaporizer 53 between the chamber side and the exhaust side of the aging unit 3.

Figure 11:
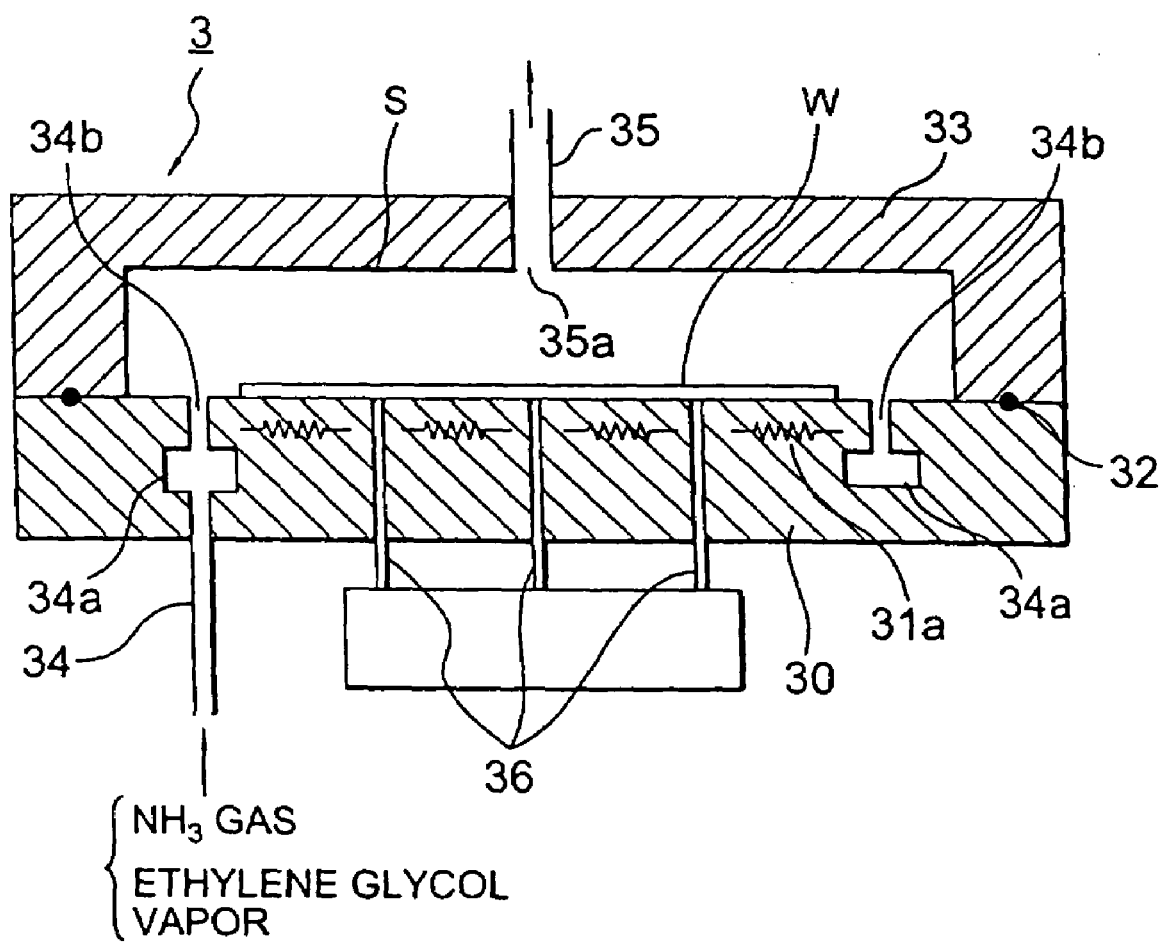
FIG. 11 is a diagram showing diagrammatically one example of an aging unit being studied by the inventors.

The aging unit 3 has a configuration identical with the unit shown in FIG. 11.

Therefore, a detailed description of the aging unit 3 is omitted here. Incidentally, the gas from the gas introducing path 34 is dispersed in a dispersing room 34a and is introduced into a treatment space from a gas introducing inlet 34b formed in slit along the circumference direction.

Next, flow of the gelling treatment will be described.

Figure 4:
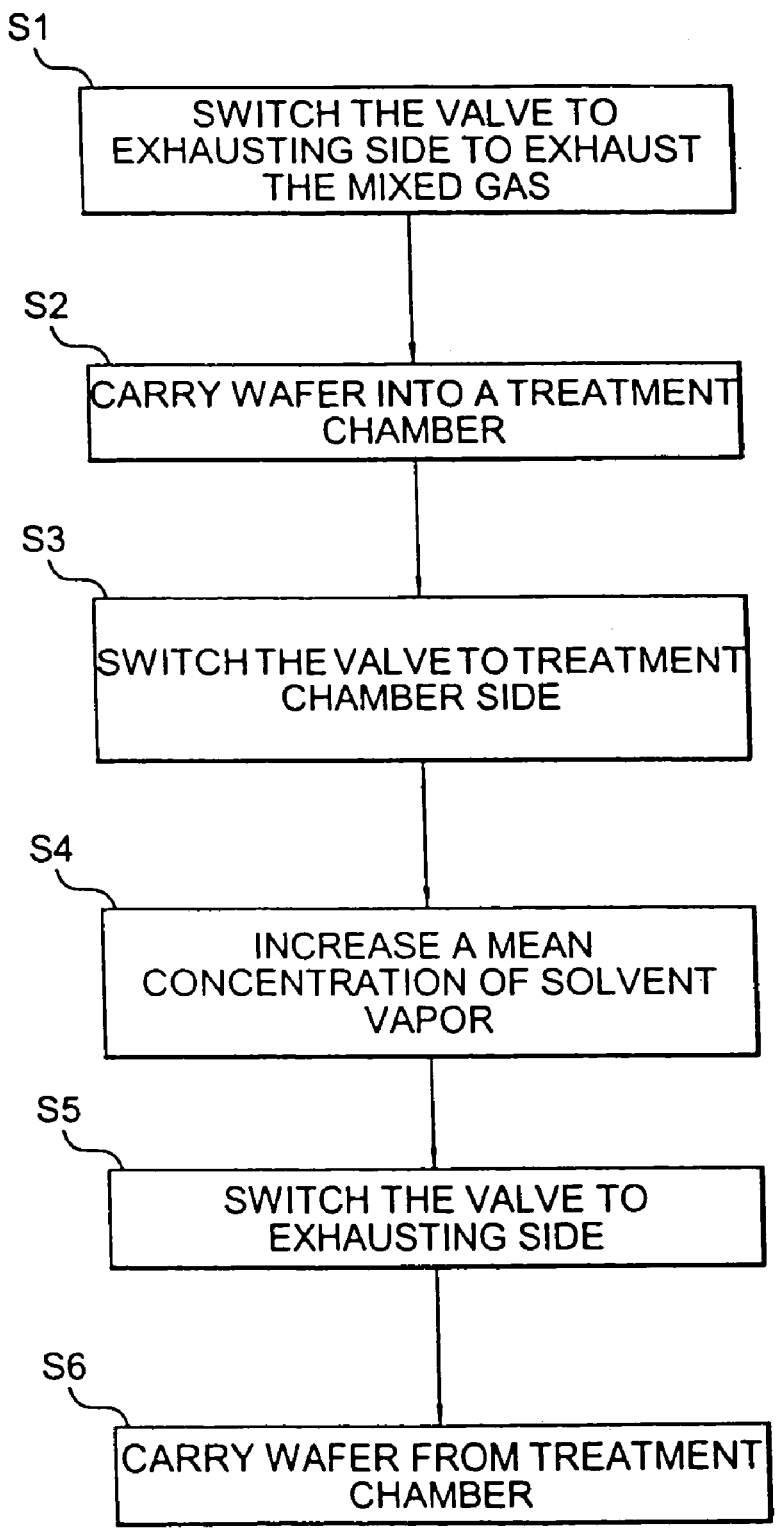
FIG. 4 is a flow chart showing one example of flow of gelling treatment according to the method of the first invention.

FIG. 4 shows a flow-chart of the gelling treatment. First, a 3-way valve 54 is switched toward the exhaust side. Then, a carrier gas and a solvent are supplied from a carrier gas supply device (not shown in the figure) and a solvent supply device (not shown in the figure), respectively. Then, at the vaporizer 53, a gas mixture of vapor of the solvent component and the carrier gas is formed. Thus generated gas mixture is exhausted through the 3-way valve 54 (step 1).

When the state of generation such as concentration, temperature or the like of the gas mixture became stable, in the coating unit 2, the wafer W coated thereon a film is placed on the heating plate 31 kept at the predetermined temperature and the cover 33 is closed (step 2).

Then, the 3-way valve 54 is switched toward the chamber side. For a while after being switched toward the chamber side, that is, until the gas introducing path 34 of the aging unit 3 and the inside of the treatment chamber S are filled by the gas mixture, the concentration of the solvent component in the gas mixture is adjusted to be the saturated concentration at the treatment temperature, for instance, 100° C. (time A in FIG. 5).

Figure 5:
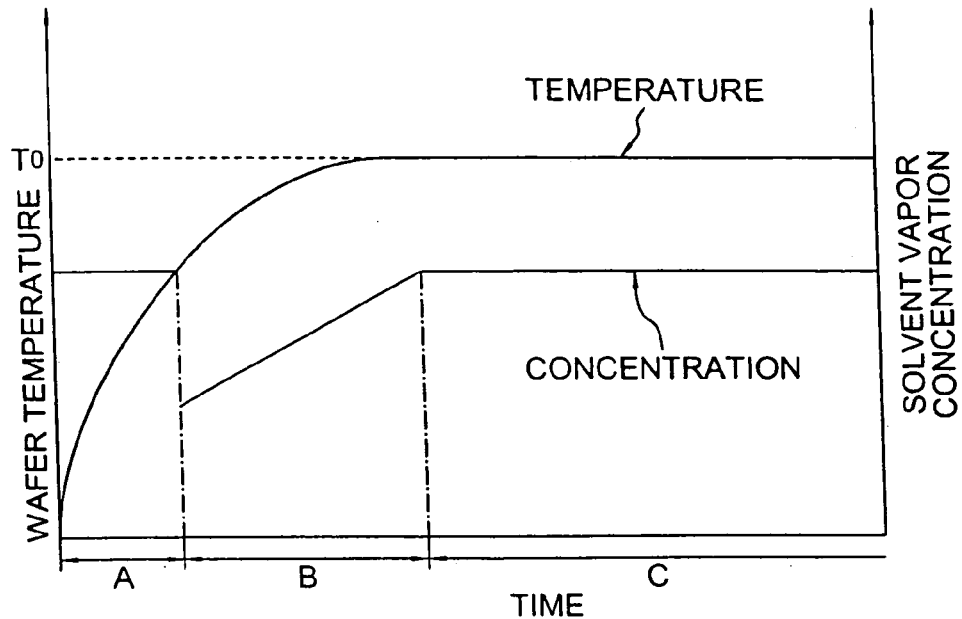
FIG. 5 is a characteristic diagram showing change on standing of wafer temperature and concentration of solvent vapor during the gelling treatment according to the method of the first invention.

Then, after the temperature of the wafer W is raised gradually from the normal temperature to fill the insides of the treatment chamber S by the gas mixture, until the temperature of the wafer W reaches the pre-determined temperature $T_0$, for instance, 100° C., the average concentration of the solvent component in the gas mixture is made low (time B in FIG. 5). During the period where the solvent concentration is low, the concentration of the solvent component is continuously raised as the wafer temperature is elevated. The concentration of the solvent component is preferably controlled such that the partial pressure of the solvent component is always equal with the saturated vapor pressure at the wafer temperature, that is, 100% (step S3).

Incidentally, the concentration control of the solvent component may be carried out by controlling the flow rate of the carrier gas with the gas mass flow controller 51. Or, it can be carried out through control of the liquid mass flow controller 52. Further, both of them may be employed simultaneously.

When the temperature of the wafer W attained the pre-determined temperature, the concentration of the solvent component is controlled to be the saturated concentration (100%) (step 4). Then, this state is maintained until gelling treatment of the coated film is completed (time C in FIG. 5). Thereafter, by switching the 3-way valve 54 toward the exhaust side, the gas mixture sent from the vaporizer 53 is exhausted (step S5). Then, by opening the cover 33 of the aging unit 3, the wafer W is carried out of the aging unit 3 (step 6). Thereby, the gelling treatment is completed.

According to the example 1, since, after the state of generation of the gas mixture became stable, the gas mixture is supplied into a sealed container of the aging unit 3, at the start of gas introduction, fluctuation of the concentration and the temperature of the solvent component can be suppressed. Further, until the temperature of the wafer is elevated to the pre-determined temperature after the wafer is carried into the sealed container, the gas concentration of the solvent component in the gas mixture is gradually elevated corresponding to the temperature of the wafer. Therefore, the gas of the solvent component can be prevented from condensing immediately after carrying in of the wafer W into the sealed container, thereby excellent thin film such as an interlayer insulating film can be obtained.

Figure 6:
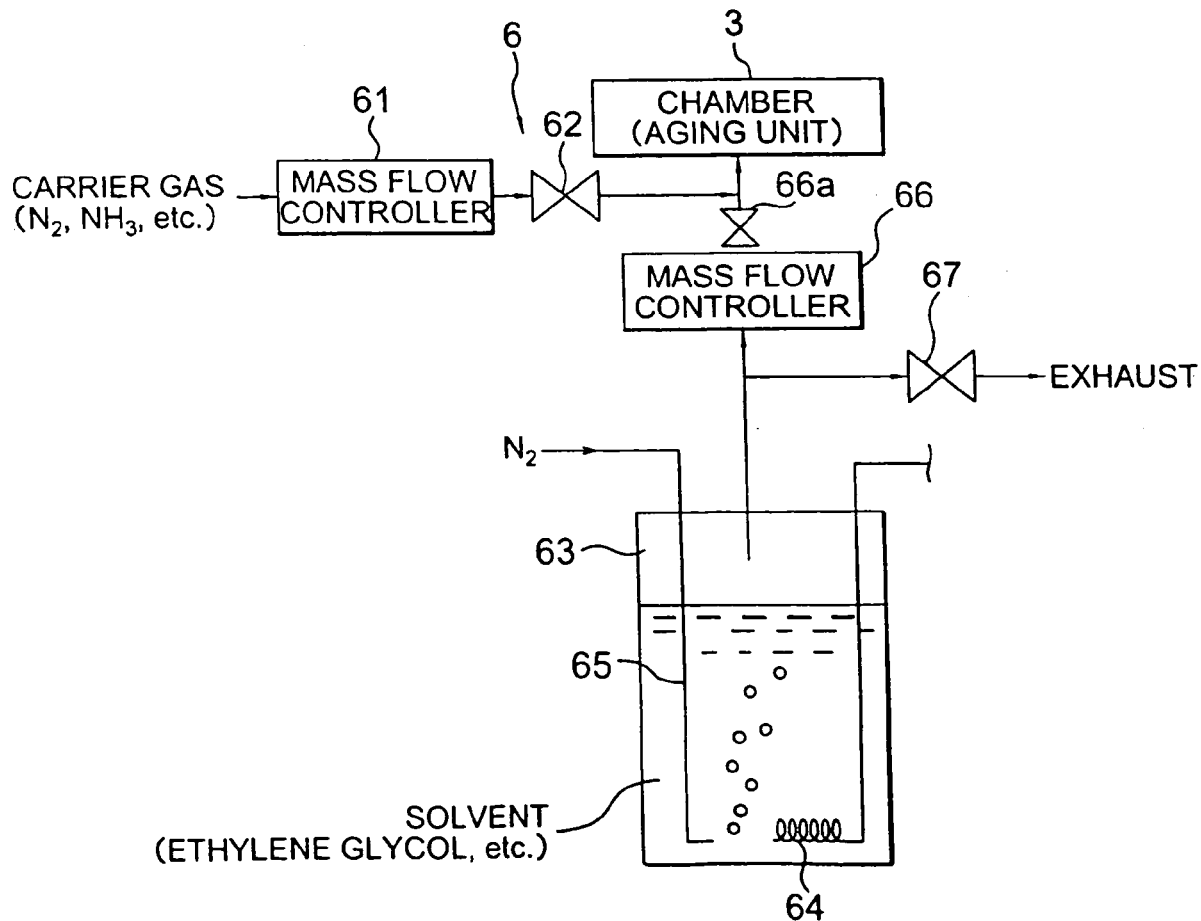
FIG. 6 is a diagram showing diagrammatically another example of the gas feeding means.

In FIG. 6, another example of the gas feeding means is illustrated. As shown in FIG. 6, the gas feeding means 6 comprises a gas mass flow controller 61, a 2-way valve 62, a chamber 63, a heater 64, a feeding pipe 65, a gas mass flow controller 66, a 2-way valve 66a, a 2-way valve 67, and pipes or tubes connecting therebetween.

The gas mass flow controller 61 controls the flow rate of the carrier gas consisting of a nitrogen gas, an ammonia gas or the like fed from the carrier gas feeder (not shown in the figure).

The 2-way valve 62 switches feeding or stoppage of the carrier gas regulated in flow rate by the gas mass flow controller 61 to a chamber of the aging unit 3.

The container 63 stores the solvent such as ethylene glycol or the like.

The heater 64 heats the solvent.

The feeding pipe 65 is to pass a bubbling gas such as a nitrogen gas ($N_2$ gas) fed from the bubbling gas feeder (not shown in the figure) into the solvent such as ethylene glycol solution.

The gas mass flow controller 66 is to control the flow rate of the solvent vapor generated by a container 63 which is a heating bubbler.

The 2-way valve 66a is to carry out switching between feed and stoppage of the solvent vapor controlled in flow rate by the mass flow controller 66.

The 2-way valve 67 switches exhaust and stoppage of the solvent vapor generated by the heating bubbler.

The carrier gas and the solvent vapor are fed into the chamber 3 after mixing.

In the case of the gas feeding means shown in FIG. 6 being employed, at the same time with opening of the 2-way valves 62 and 66a, the 2-way valve 67 of the solvent vapor line is closed, for instance, and, by operating either one or both of the mass flow controllers 61, 66, the concentration of the solvent component in the gas mixture can be varied continuously. However, if the flow rate of the bubbling gas ($N_2$) is held constant, while exhausting the vapor by opening the 2-way valve 67, only the necessary flow rate may be flowed by controlling the mass flow controller 66. In this case, the pressure in the container 63 is advantageously stabilized. Further, by opening the 2-way valve 67 of the solvent vapor line and by squeezing the 2-way valve 66a to make zero the flow rate, feed of the solvent vapor to the chamber 3 can be stopped. Incidentally, if the mass flow controllers 61, 66 have a complete shut-off function, 2-way valves 62 and 66a can be dispensed with.

And, also in the example illustrated in FIG. 6, the concentration of the solvent component in the gas mixture can be continuously controlled corresponding to the wafer temperature. As illustrated in the aforementioned FIG. 5, for instance, the concentration of ethylene glycol is controlled. Further, before the wafer W is carried in, as identical as the aforementioned example, the solvent vapor of ethylene glycol is kept being generated and exhausted. Therefore, upon starting gas introduction, fluctuation of the temperature and the concentration of the solvent component can be suppressed, in addition, condensation of the gas of the solvent component due to low temperature of the wafer is prevented from occurring, thus, the excellent thin film such as an interlayer insulating film can be obtained.

Figure 7:
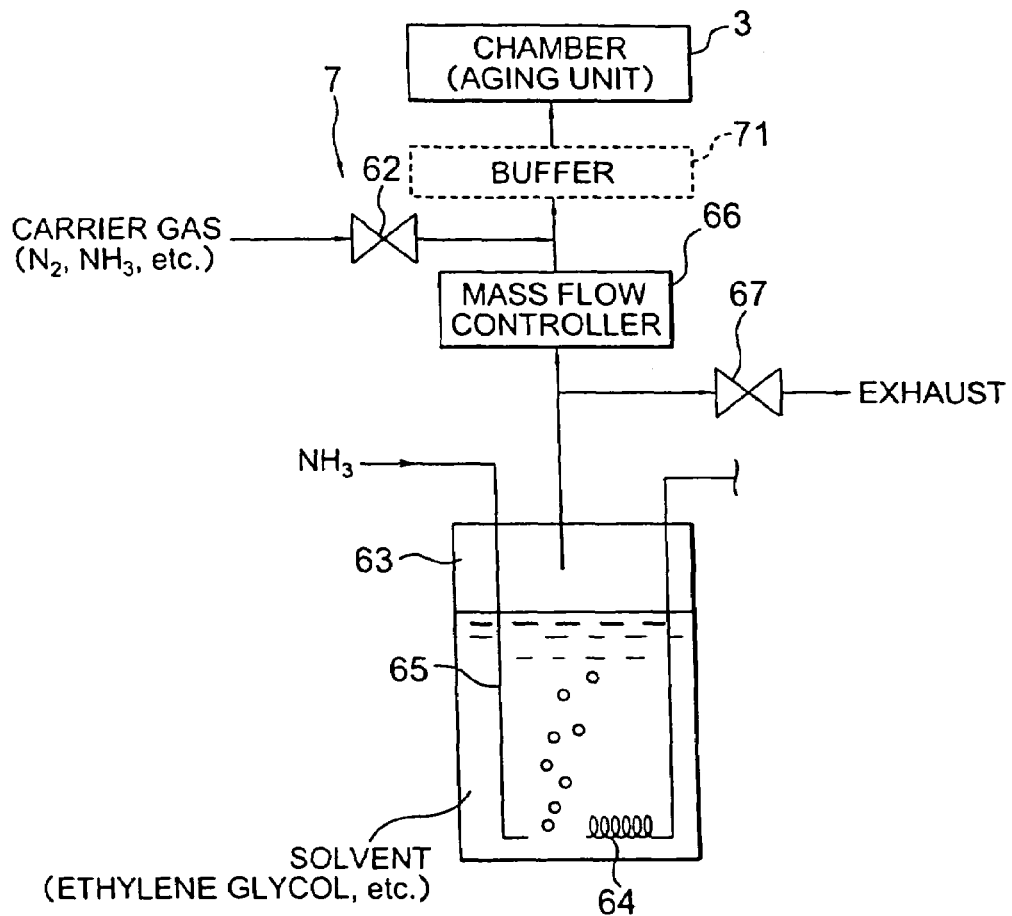
FIG. 7 is a diagram showing diagrammatically another example of the gas feeding means.

Further, the gas feeding means 7 shown in FIG. 7 is one in which the mass flow controller 61 of the carrier gas line is omitted from the gas feeding means 6 shown in FIG. 6. Other constitution is identical as the gas feeding means 6 shown in FIG. 6.

In this case, in order to control the concentration of the solvent component in the gas mixture, in a state where the 2-way valve 62 of the carrier gas line is opened and the flow rate of the solvent component is controlled by the mass flow controller 66, opening/closing of the 2-way valve 67 of the solvent vapor line may only be switched appropriately.

Figure 8:
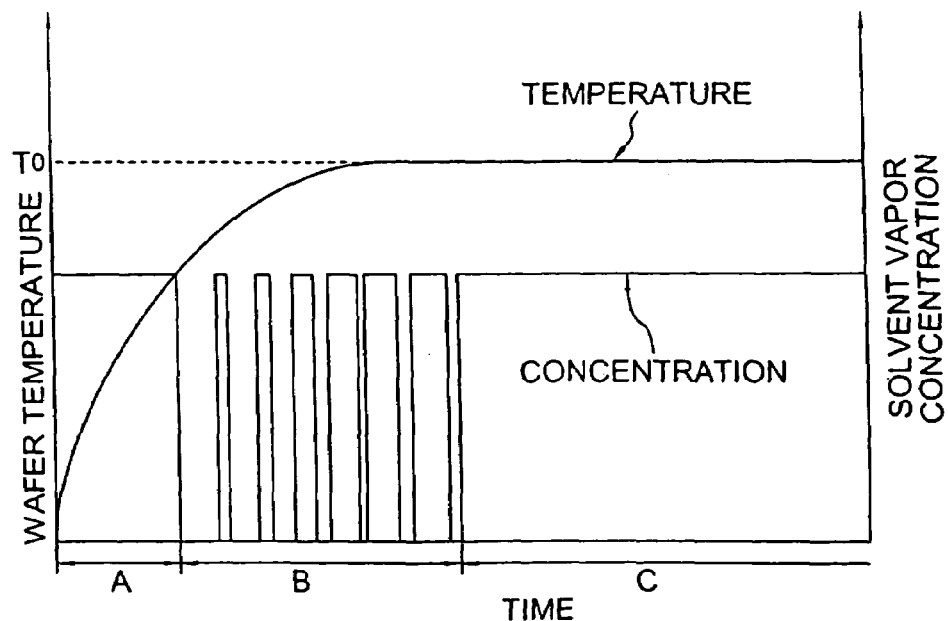
FIG. 8 is a characteristic diagram showing change on standing of wafer temperature and concentration of solvent vapor during the gelling treatment in the case of the gas feeding means shown in FIG. 7 being employed.
Figure 10A:
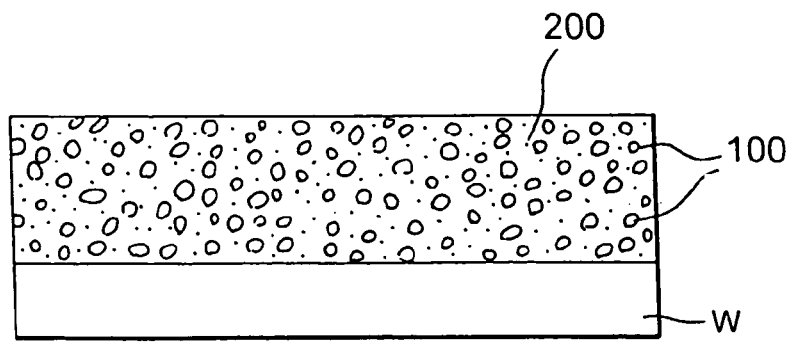
FIG. 10A, FIG. 10B and FIG. 10C are diagrams for explaining situation of variation of a coated film in sol-gel method.
Figure 10B:
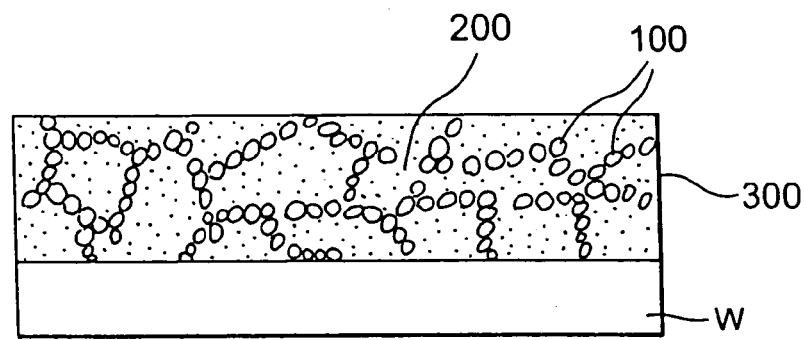
Figure 10C:
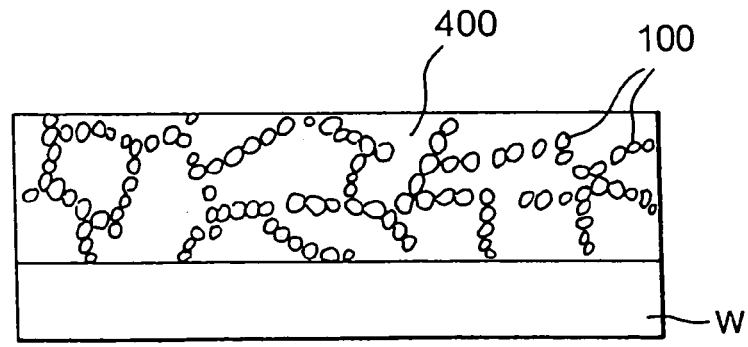

That is, as shown in FIG. 8, until the wafer W is carried in the chamber 3 and, after the inside of the gas introducing path 34 and the treatment chamber S are filled with the gas mixture, the temperature of the wafer is elevated to the pre-determined temperature, for instance, approximately 100° C. (time B in FIG. 8), the 2-way valve 67 is switched to the chamber 3 side intermittently. Thereby, the time-averaged concentration of the solvent component in the gas atmosphere in the chamber 3 can be adjusted. This time, in the time interval B as shown in FIG. 8, by making relatively and gradually longer the timings of switching of the 2-way valve 67 toward the chamber 3 side, the average concentration of the solvent component in the gas atmosphere in the chamber 3 can be controlled to be an appropriate concentration corresponding to the elevation of the wafer temperature. Incidentally, in FIG. 8, conductance of the gas flow path is ignored and depiction is made by assuming that the concentration of the gas varies corresponding to the switching of the valve 67.

In this case also, before carrying in of the wafer W, it is preferable the solvent vapor to be kept being generated and exhausted. Also in this example, fluctuation of the concentration and the temperature of the solvent component can be suppressed at the start of gas introduction, further, condensation of the gas of the solvent component due to the wafer of low temperature can be prevented from occurring. Thereby, an excellent thin film such as an interlayer insulating film can be obtained. Further, in the example shown in FIG. 7, by disposing a temperature controlled buffer room 71, the concentration fluctuation of the solvent vapor can be averaged.

Further, the gas feeding means 8 shown in FIG. 9, in the gas feeding means 7 shown in FIG. 7, in place of the mass flow controller 66 and the 2-way valve 67, is provided with a 3-way valve 81 which flows the solvent vapor to any one of the chamber 3 side and the exhaust side. By switching appropriately the feeding direction of the solvent vapor between the chamber 3 side and the exhaust side, the solvent vapor can be intermittently fed to the chamber 3 as shown in FIG. 8. Thereby, the concentration of the solvent component in the gas atmosphere in the chamber 3 can be controlled such that the appropriate concentration corresponding to the temperature rise of the wafer is attained.

Incidentally, in all of FIGS. 3, 6, and 7, from generation of the solvent vapor to the chamber, the piping can be heated with an object to prevent condensation in the piping from occurring.

In the above, in the first invention, the means for generating the solvent vapor is not restricted to a heating bubbler. Further, in the gas feeding means 6 and 7 shown in FIG. 6 and FIG. 7, the carrier gas line is dispensed with. In the case where there is no carrier gas line, at the heating bubbler, the solvent concentration and the flow rate of the bubbling gas may be controlled. Further, as the substrate to be subjected to treatment, without restricting to the wafer, the glass substrate for liquid crystal display can be employed.

Thus, according to the first invention, fluctuation of the concentration and the temperature of the solvent component can be suppressed at the beginning of gas introduction. Further, condensation of the gas of the solvent component can be prevented from occurring immediately after carrying in the substrate, thereby the excellent thin film such as the interlayer insulating film can be obtained.

In the following, Example 2 involving the second invention will be described. Incidentally, in the following examples, the parts repeating the preceding examples are omitted from explanation.

EXAMPLE 2

In such an apparatus of forming a film as shown in FIG. 1, the wafer W, after being subjected to hydrophobic treatment and cooling treatment, is sequentially carried to the coating unit 2, aging unit 3, and solvent replacement unit 4 by the main arm 13, and, after being carried out respective pre-determined treatments at these units, bake treatment is carried out.

The steps of forming a film and gelling carried out at the coating unit 2 and the aging unit 3, respectively, will be briefly described with reference to FIG. 2A to FIG. 2D.

In the step of forming a film, in order to suppress vaporization of the solvent in the coating liquid, in the not shown treatment chamber filled with the vapor of ethylene glycol for instance, on the approximately rotation center portion on the surface of the wafer W sucked to the spin chuck 21, the coating liquid T is fed (FIG. 2A). Next, by rotating the wafer W, the coating liquid T is spread over the whole surface of the wafer due to the centrifugal force to form a film (FIG. 2B). Here, the coating liquid T is one in which colloids or particles of TEOS which is a metal alkoxide are dispersed in solvent such as ethylene glycol or ethyl alcohol, for instance, and water and a trace of hydrochloric acid are further contained.

Further, in the gelling step, the colloids of TEOS contained in the coated film on the wafer is gelled to link the colloids in reticulum. Therefore, in the treatment chamber filled by vapor of ethylene glycol, the wafer W is heated to approximately 100° C. by the heating plate (FIG. 2C) Here, introduction of the vapor of ethylene glycol into the treatment chamber is carried out to suppress vaporization of the solvent in the coated film. Therefore, it is controlled such that, at the temperature in the treatment chamber, for instance, the vapor pressure becomes 100%.

In this gelling step, instead of heating, by carrying out the treatment at normal temperature in the treatment chamber filled by an ammonia gas, by use of the ammonia gas which is an alkali catalyst, gelling of the colloids of TEOS may be expedited.

Figure 12:
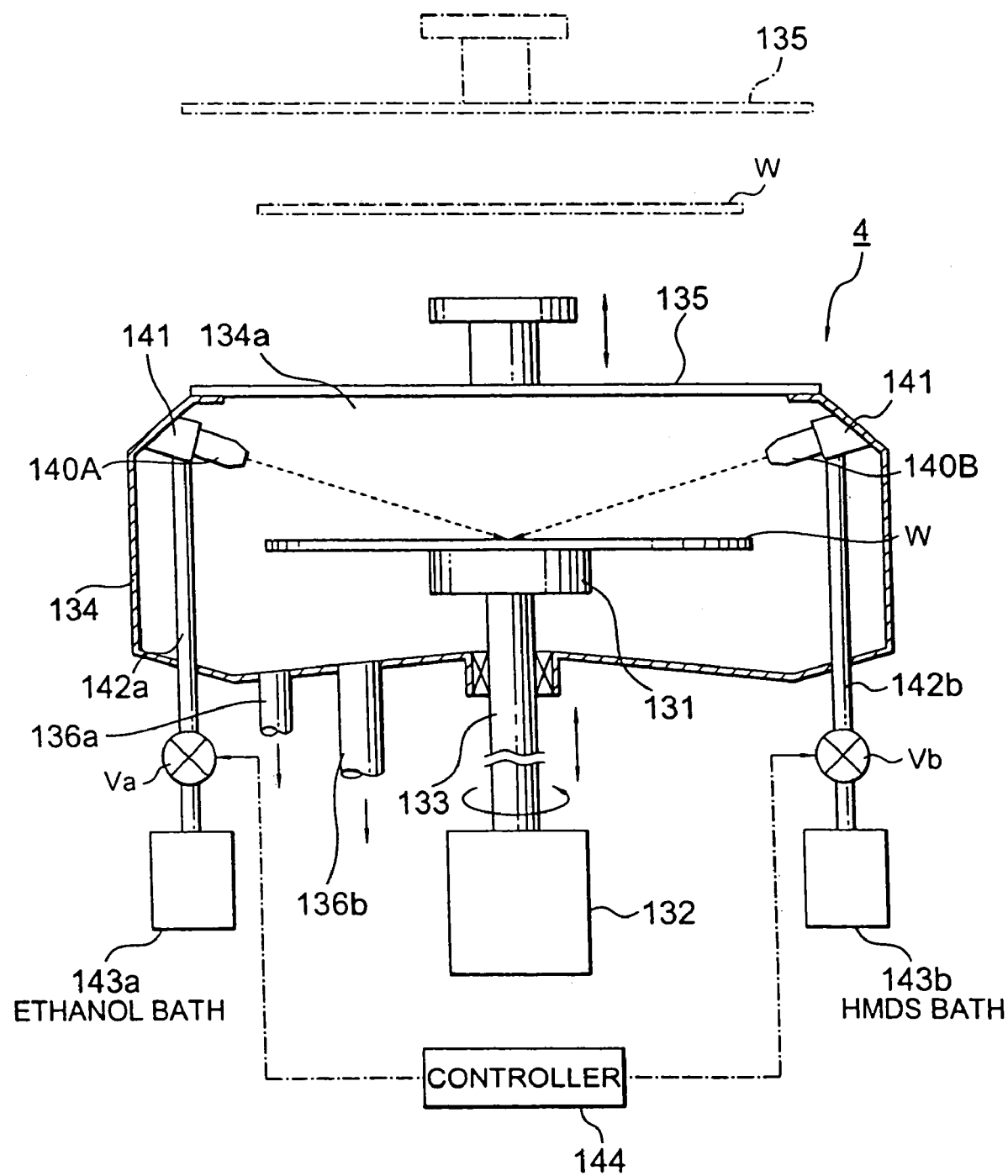
FIG. 12 is a side view of a profile showing one example of a solvent replacement unit where a step of solvent replacement of the second invention is practiced.
Figure 13:
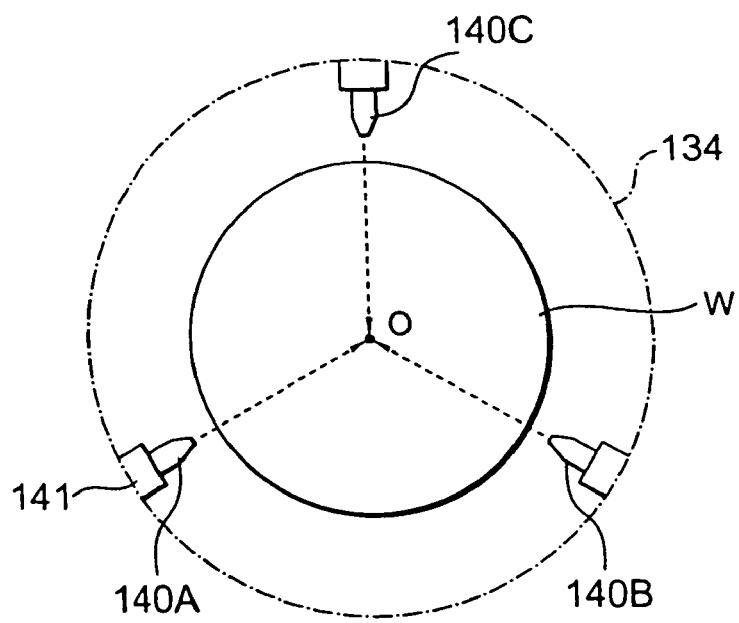
FIG. 13 is a plan view showing a nozzle for solvent supply being employed in the aforementioned solvent replacement unit.

Subsequently, the solvent replacement unit 4 will be described with reference to the side view of a profile of FIG. 12 and the plan view of FIG. 13. In the figure, reference numeral 131 denotes a chuck of holding an wafer W in a level position (an approximate level position can be included). This chuck 131 is constituted by a vacuum chuck for instance and sucks and holds the wafer W. To the approximately central portion of the bottom surface of the chuck 131, a rotation axis 133 capable of being gone up and down and rotated by a driving portion 132 is attached. With such a configuration, the chuck 131 is capable of going up and down between a delivering position of the wafer W which is shown by the dotted line in the figure and is positioned above a cup to be described later and a treatment position of the wafer W shown by the solid line in the figure. Further, the chuck 131 is designed to be rotated around a vertical axis.

In the circumference of the chuck 131 which is in the treatment position and the wafer W, a cup 134 is disposed to in order to surround these. On the upper surface of this cup 134, an opening 134a where the wafer W is passable is formed. The opening 134a can be opened and closed by a cover 135 which is disposed such that it is capable of going up and down. Further, at the bottom portion of the cup 134, a liquid exhaust path 136a and an exhaust gas path 136b are connected.

Inside the cup 134, above the outside of the wafer W when the chuck 131 holding the wafer W is in a treatment position, for instance, 3 nozzles of 140A through 140C are disposed.

Among these nozzles 140A to 140C, 140A is the first nozzle of dispensing alcohol such as ethanol on the surface of the wafer W. Similarly, 140B is the second nozzle of dispensing a hydrophobic treatment liquid such as HMDS. Further, the nozzle 140C is the third nozzle of dispensing a solvent such as heptane of smaller surface tension than the solvent contained in the coating liquid. These nozzles 140A through 140C are disposed with the same distance apart in the circumference direction as shown in FIG. 13. These nozzles 140A through 140C correspond to the respective solvent dispensing portions of the present invention.

These nozzles 140 (140A through 140C) are attached to the inside wall of the cup 134 with the respective attachments 141, and the tip end of each nozzle is attached slantingly to be directed toward the approximately center of rotation O of the surface of the wafer W (the surface thereon a coated film is formed). Therewith, from each nozzle 140, as shown in the figure with the dotted lines, the solvent is dispensed around the center of rotation O of the surface of the wafer W. Further, the tip ends of these nozzles are positioned outside the wafer W held by the chuck 131. Therefore, when the chuck 131 which holds the wafer W goes up and down, the wafer W and the each nozzle 140 are designed not to interfere each other.

The respective nozzles 140 are connected respectively to the ethanol tank 143a, HMDS tank 143b, and heptane tank 143c (not shown in FIG. 12) which are disposed outside the cup 134 by the solvent dispensing path 142 (142a through 142c) inserted from the bottom surface of the cup 134, for instance. The solvent dispensing paths 142a through 142c are provided respectively with valves Va through Vc. These valves Va through Vc are controlled in their timings of opening and closing and the degree of opening by a controller 144.

In this solvent replacement unit 4, the step of solvent replacement is carried out as follows. That is, the cover 135 is elevated up to the position shown by the dotted line in FIG. 12. At the same time, the chuck 131 is elevated up to the position above the cup 134. Then, at the position shown by the dotted line in FIG. 12, by the main arm 13, the wafer W carried up to the unit 4 is delivered to the chuck 131. Then, the chuck 131 is lowered down to the treatment position. At the same time, the cover 135 is lowered down to close the cup 134. Thereafter, the wafer W is rotated. Subsequently, with the controller 144, the valve Va is opened, thereby ethanol is dispensed around the center of rotation O of the surface of the wafer W from the first nozzle 140A. Due to centrifugal force, the ethanol diffuses over the whole surface of the wafer W. Thereby, ethanol dissolves in the moisture in the coated film. As the result, the moisture is replaced by the ethanol. Incidentally, preceding the rotation of the wafer W, ethanol may be dispensed around the center of rotation O of the surface of the wafer W.

After thus ethanol is dispensed on the surface of the wafer W, while rotating the wafer W, similarly the valve Vb is opened. Thereby, HMDS is dispensed on the surface of the wafer W from the second nozzle 140B to make diffuse. Thereby, hydroxide groups in the coated film are removed. Further thereafter, the valve Vc is opened to dispense heptane on the surface of the wafer W from the third nozzle 140C to make diffuse. Thereby, the solvent in the coated film is replaced by heptane. The reason why to use heptane is to reduce the force added on the porous structure namely reticular structure of TEOS by use of the solvent of lower surface tension, thereby the reticular structure of TEOS is prevented from collapsing.

Figure 14:
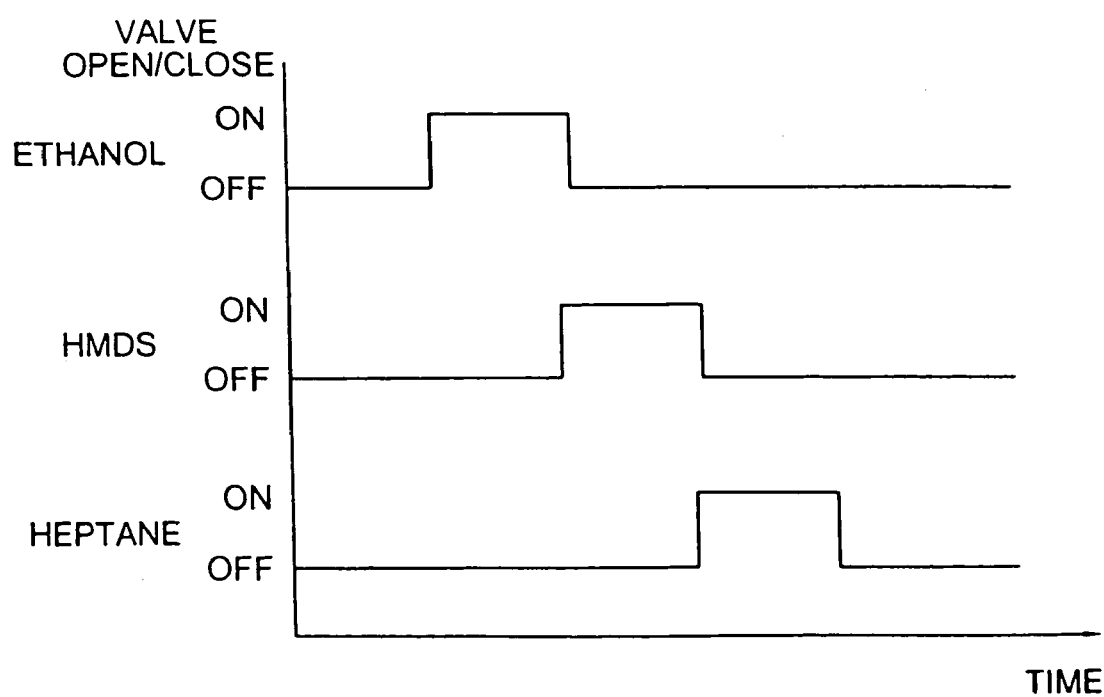
FIG. 14 is a diagram showing sequence of timings of closing and opening of valves for explaining a method of the second invention.

Here, the timings of opening and closing of each valve Va, VB and Vc are shown in FIG. 14. That is, immediately before closing the valve Va, the valve Vb is opened, further, immediately before closing the valve Vb, the valve Vc is opened. That is, immediately before supply of ethanol completes, supply of HMDS is began. Similarly, immediately before supply of HMDS completes, supply of heptane is started. Thus, it is designed such that a state in which supply of the solvent is stopped does not occur when the solvent to be dispensed to the wafer W is switched. Here, when 2 kinds of the solvents are being dispensed simultaneously, by reducing the degree of opening of the valve of the solvent of which supply is to be stopped, the flow rate of the solvent may be reduced.

Thus, the wafer W undergone the predetermined treatment at the solvent replacement unit 4 is carried up to the bake unit by the main arm 13. The wafer W is bake treated at this unit, thereby on the surface of the wafer W, an interlayer insulating film consisting of a silicon oxide film is formed.

According to the aforementioned example 2, since 3 pieces of nozzles 104 corresponding to 3 kinds of solvents are attached inside the cup 134, without implementing opening and closing of the cover 135 and movement of the nozzles 140, the solvent can be dispensed on the surface of the wafer W. Therefore, when the solvent to be dispensed to the wafer W is switched, before stopping the supply of the preceding solvent, supply of the succeeding solvent is began, thereby a state in which both solvents are dispensed simultaneously can be realized. Thus, since the solvents can be fed continuously, there is no time when the supply of the solvent is interrupted.

Thereby, inconvenient phenomena occurring due to interruption of supply of the solvent, that is, the phenomena such that, due to contact of the solvent on the surface of the wafer and air, the moisture in the air is confined in the coated film, or, the solvents vaporize, can be prevented from occurring in advance. As the result, the film structure of TEOS can be prevented from collapsing, an excellent silicon oxide film can be formed on the wafer W.

Further, in the example 2, the solvents can be dispensed continuously. Therefore, in the case of the preceding solvents being replaced, compared with the conventional method where opening and closing of the cover and transfer operation of the carrying arm are necessary, the time necessary for the whole solvent replacement treatment can be made remarkably short, and the throughput of the whole treatment can be improved. Further, thus, the time necessary for the solvent replacement step can be made short. As the result, the time period during which the large surface tension of the solvent is added on the reticular structure of TEOS is made short. Therefore, also from this point of view, the film is suppressed from collapsing.

In the above example 2, upon dispensing ethanol, HMDS, and heptane, stoppage of supply of the preceding solvent and start of supply of the succeeding solvent may be carried out simultaneously. Further, by making extremely short the time period between the stoppage of supply of the preceding solvent and the start of supply of the succeeding solvent, supply of the both solvents may be carried out continuously without essentially being interrupted. Even in such a case, supply of the preceding solvent and the succeeding solvent is carried out without essentially being interrupted. As the result, the aforementioned inconvenient phenomena can be suppressed from occurring, thus an excellent thin film can be formed on the substrate.

EXAMPLE 3

Next, another example of a solvent replacement unit for carrying out the solvent replacement step, that is, example 3 will be described with reference to FIGS. 15 and 16.

The different point of this solvent replacement unit from the aforementioned solvent replacement unit exists in that 3 kinds of solvents are dispensed on the surface of the wafer through a common solvent dispensing portion 150 arranged in a ring. The solvent dispensing portion 150 is disposed inside the cup 134 and at the upper side of the outside of the wafer W when the chuck 131 holding the wafer W is positioned at the treatment position, for instance. That is, the solvent dispensing portion 150 arranged in a ring are fixed to a plurality of places of the inside of the cup 134 through the attachment members 151.

The inside of the solvent dispensing portion 150 is disposed slanted with an expanding diameter toward, for instance, the lower side. On this slanting surface, a plurality of dispensing holes 152 are formed along a circumference direction with an equal distance apart. Thereby, the solvent from the respective dispensing hole 152 is dispensed on around the center of rotation O of the surface of the wafer W. Further, the inside of the solvent dispensing portion 150 is positioned outside the wafer W held by the chuck 131. Therefore, when the chuck 131 holding the wafer W went up and down, the wafer W and the solvent dispensing portion 150 are designed not to interfere each other.

To this solvent dispensing portion 150, one end side of the solvent dispensing path 153 inserted from, for instance, the bottom surface of the cup 134 is connected. On the other hand, the other end side of the solvent dispensing portion 153 are branched, outside the cup 134, for instance, into 3 dispensing paths 153a through 153c. The other end sides of these branched dispensing paths 153a through 153c are connected to a ethanol tank 154a, a HMDS tank 154b, and a heptane tank 154c, respectively. To the branched dispensing paths 153a through 153c, valves Va through Vc are inserted, respectively. The timing of opening or closing and the degree of opening of these valves Va through Vc are controlled by a controller 144. Other configuration is identical as the aforementioned example 2.

In this solvent replacement unit 4, after the wafer W is held by the chuck 131, the cup 134 is closed. Thereafter, the valve Va is opened by the controller 144, ethanol is dispensed to the solvent dispensing portion 150 through the solvent dispensing paths 153a and 153. Then, ethanol is dispensed in the neighbor of the center of rotation O on the surface of the wafer W through the dispensing holes 152 from the solvent dispensing portion 150. Then, as identical as the aforementioned embodiments, ethanol is diffused all over the whole surface of the wafer W.

Then, by opening the valve Vb, HMDS is dispensed on the surface of the wafer W through the solvent dispensing paths 153b, 153, and the solvent dispensing portion 150. Subsequently, by opening the valve Vc, heptane is dispensed on the surface of the wafer W through the solvent dispensing paths 153c, 153, and the solvent dispensing portion 150. In this case, the timings of opening and closing of the valves Va, Vb, and Vc are carried out identical as the above example 2.

EXAMPLE 4

Subsequently, still another example of the solvent replacement unit for carrying out the step of solvent replacement, that is, Example 4, will be described with reference to FIG. 17. The different point of this solvent replacement unit from the aforementioned solvent replacement unit exists in that 3 kinds of solvents are dispensed on the surface of the wafer through a common solvent nozzle 160. The solvent nozzle 160 is disposed combined with the cover 135 in such a manner that the tip end of the nozzle 160 pierces through the cover 135 of the cup 134 to oppose the neighborhood of the center of rotation on the surface of the wafer W. Thereby, the solvent is ejected in the neighborhood of the center of rotation of the surface of the wafer W. In this example, the solvent nozzle 160 corresponds to a common solvent dispensing portion.

To this solvent nozzle 160, one end side of the solvent dispensing path 161 is connected. On the other hand, the other end side of the solvent dispensing path 161 is branched into 3 dispensing paths 161a, 161b, and 161c. The other end sides of these branched dispensing paths 161a through 161c are connected to a ethanol tank 162a, a HMDS tank 162b, and a heptane tank 162c.

Further, in the branched dispensing paths 161a through 161c, valves Va through Vc are inserted, respectively. These valves Va through Vc are controlled of their timings of opening and closing and their degree of opening through a controller 144. The other configuration is identical as that of the aforementioned example.

In this example 4, after the wafer W is held by the chuck 131, the cup 134 is closed. Thereafter, the valve Va is opened by the controller 144, ethanol is dispensed in the neighborhood of the center of rotation O of the surface of the wafer W through the solvent dispensing portions 161a and 161b, and the solvent nozzle 160. Then, upon the valve Vb being opened, HMDS is dispensed on the surface of the wafer W through the solvent dispensing paths 161b and 161, and the solvent nozzle 160. Subsequently, upon the valve Vc being opened, heptane is dispensed on the surface of the wafer W through the solvent dispensing paths 161c and 161, and the solvent nozzle 160. Here, the timings of opening and closing of the valves Va, Vb, and Vc are identical as the example 2.

Figure 15:
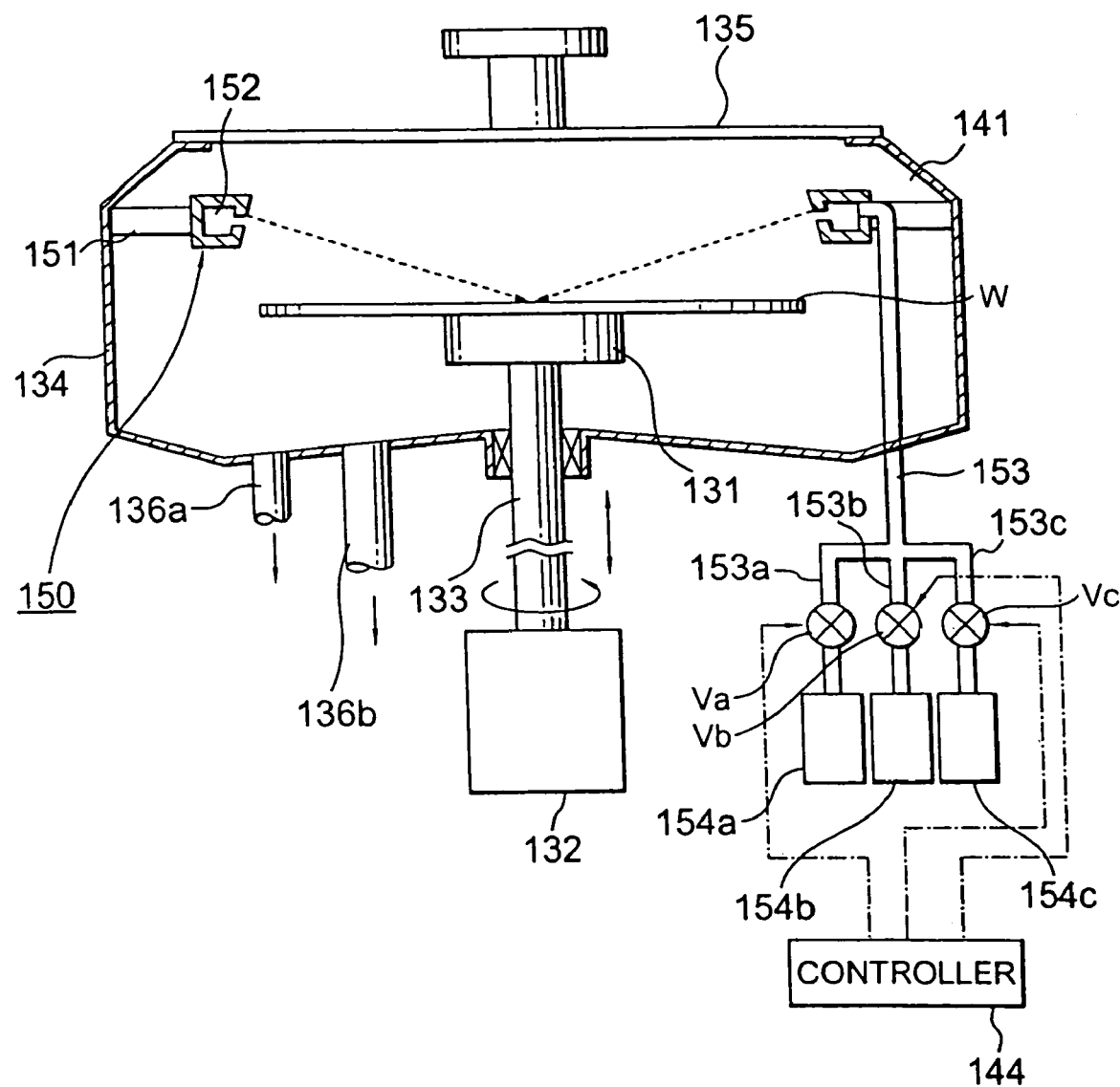
FIG. 15 is a side view of a profile showing another example of a solvent replacement unit where a step of solvent replacement of the second invention is practiced.
Figure 16:
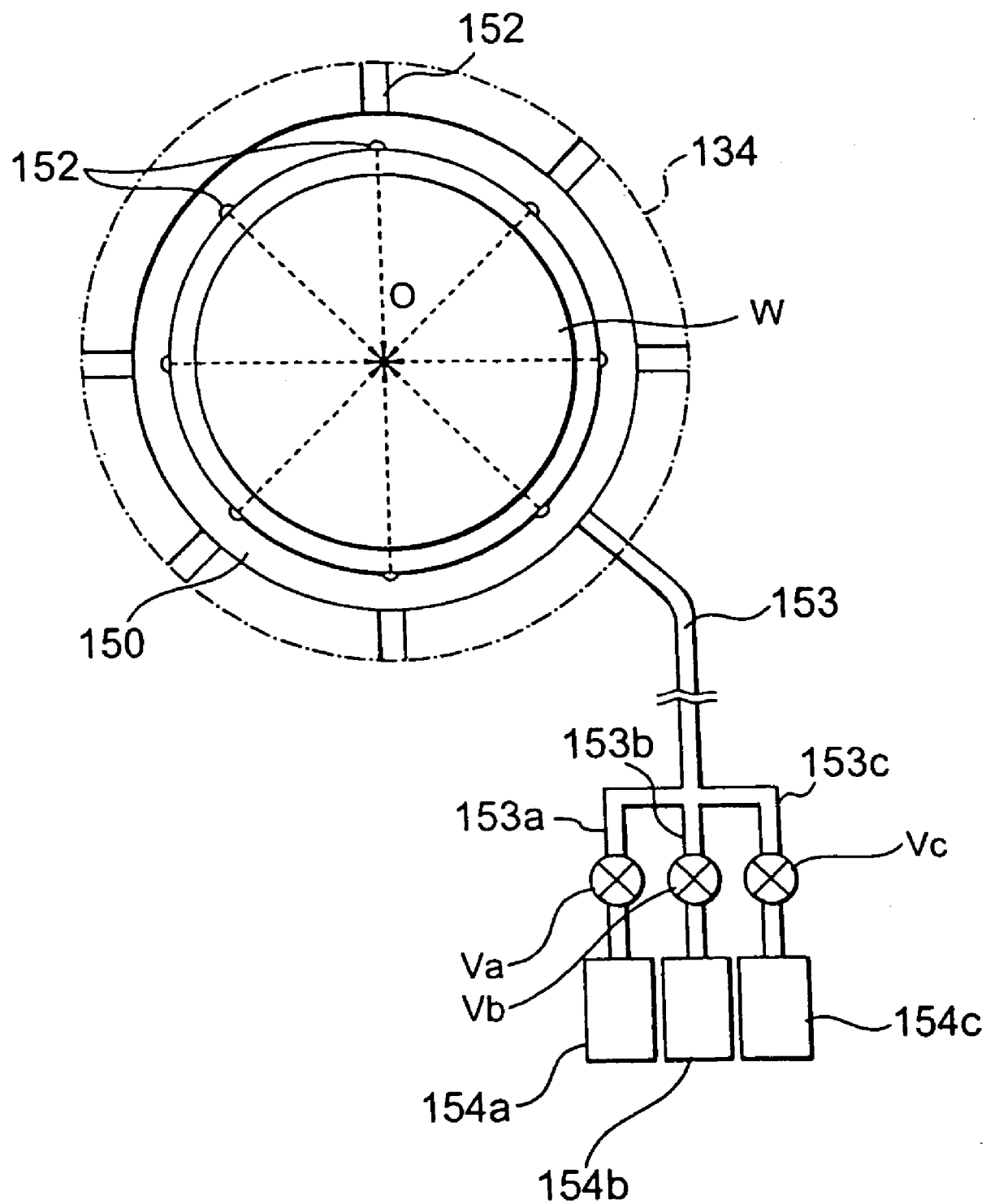
FIG. 16 is a plan view showing a solvent dispensing portion being employed in the solvent replacement unit.
Figure 17:
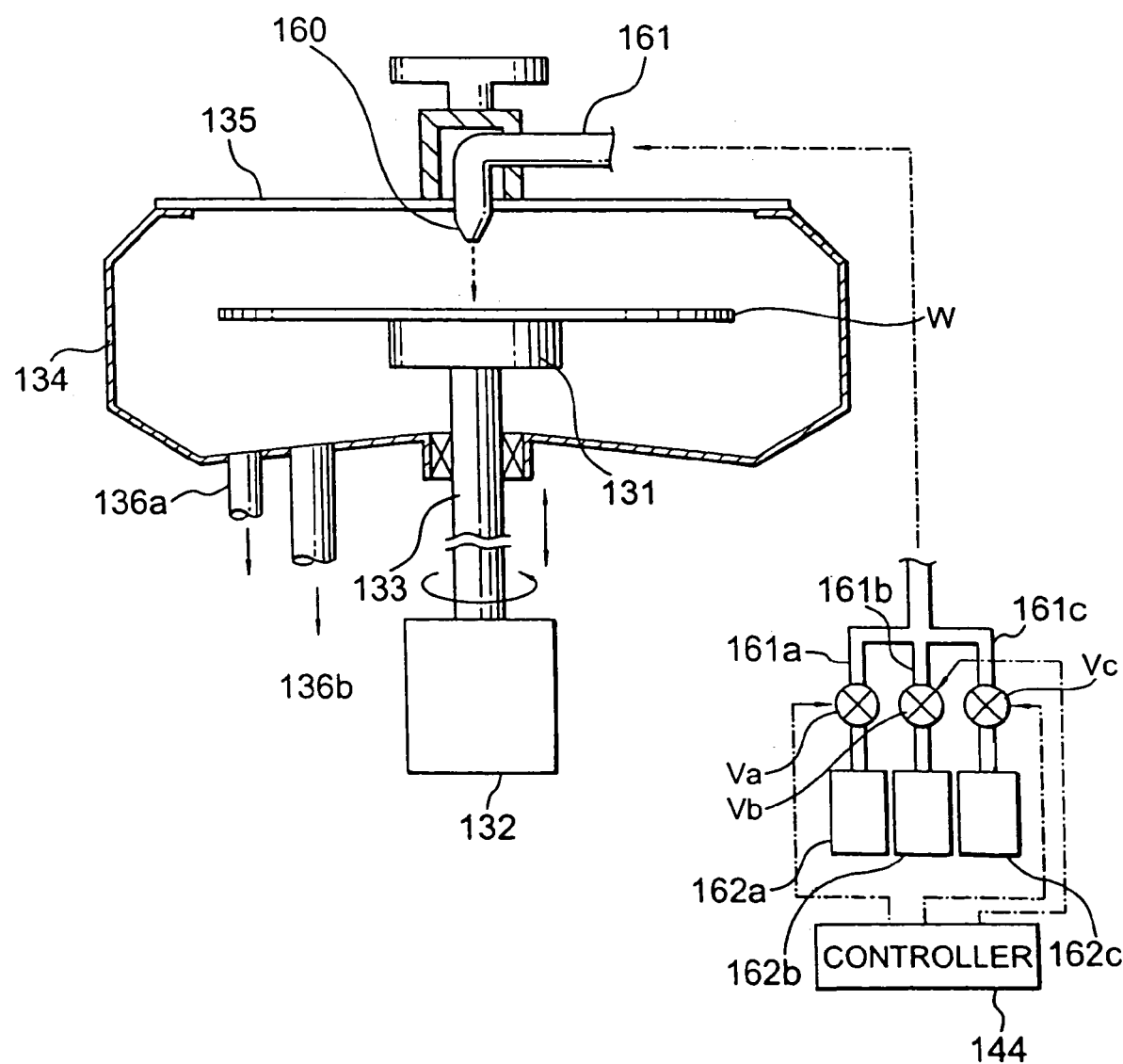
FIG. 17 is a side view of a profile showing still another example of a solvent replacement unit where a step of solvent replacement of the second invention is practiced.
Figure 18:
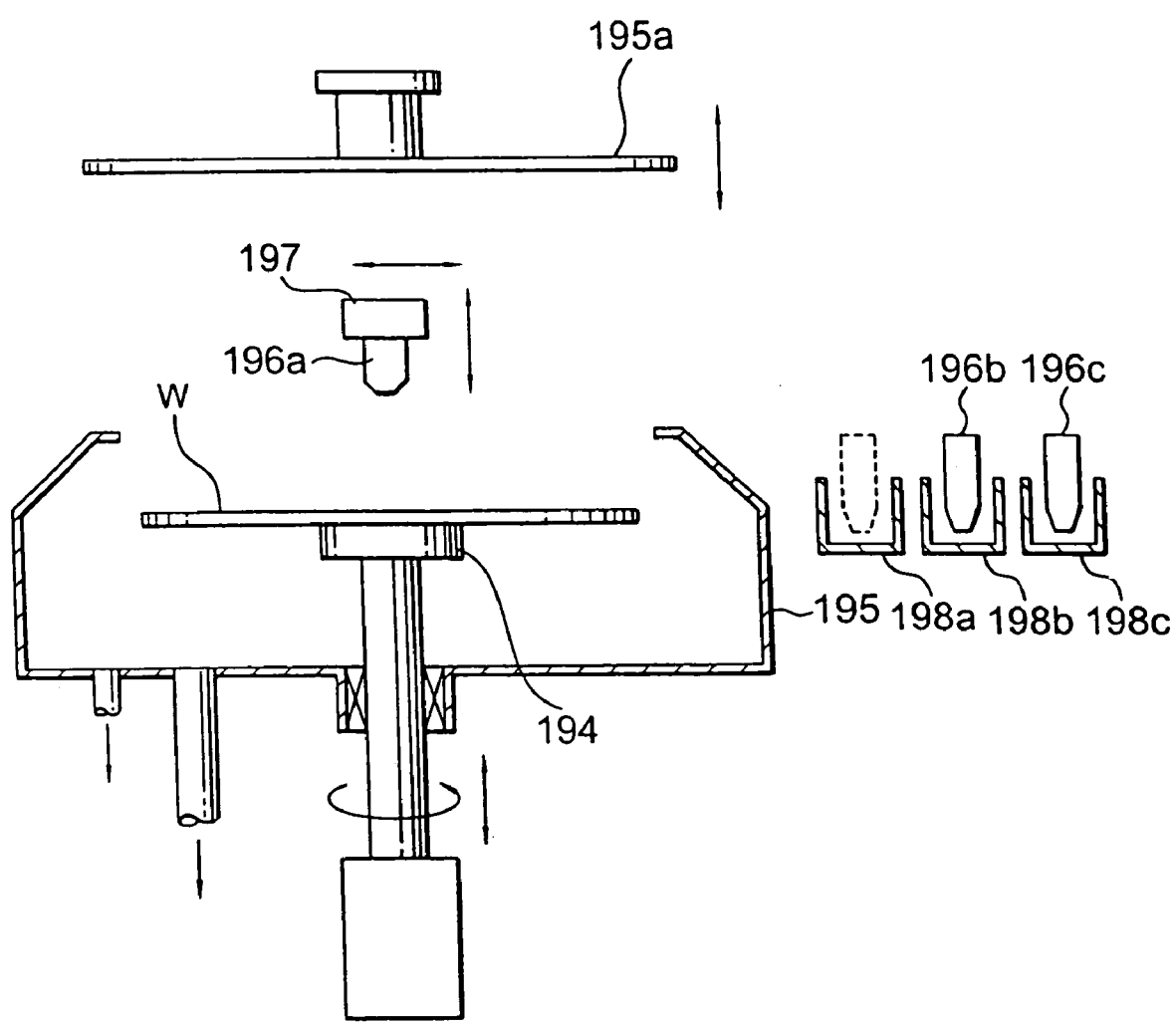
FIG. 18 is a cross-sectional view showing a conventional resist coating device.

Even in the solvent dispensing units shown in these FIG. 15 and FIG. 17, ethanol, HMDS, and heptane are continuously dispensed on the surface of the wafer W in this order through the common solvent dispensing portion 150 or the nozzle 160. Therefore, the effect identical as the case in which the solvent replacement unit shown in FIG. 12 is employed can be obtained. Further, the solvent dispensing portion shown in FIG. 15 and the solvent nozzle 160 shown in FIG. 17 may be combined. That is, among the solvent dispensed through the solvent dispensing portion 150, dispensing deficiency in the neighborhood of the center of rotation of the wafer W may be complemented by the supply due to the solvent nozzle 160.

According to the second invention, in the method of forming a film having a step of carrying out replacement of the solvent by dispensing a plurality of solvents on the substrate, the preceding solvent and the succeeding solvent can be dispensed continuously. As the result, an excellent thin film such as an interlayer insulating film can be obtained.

EXAMPLE 5

Next, Example 5 involving the third invention of the present application will be described.

Figure 19:
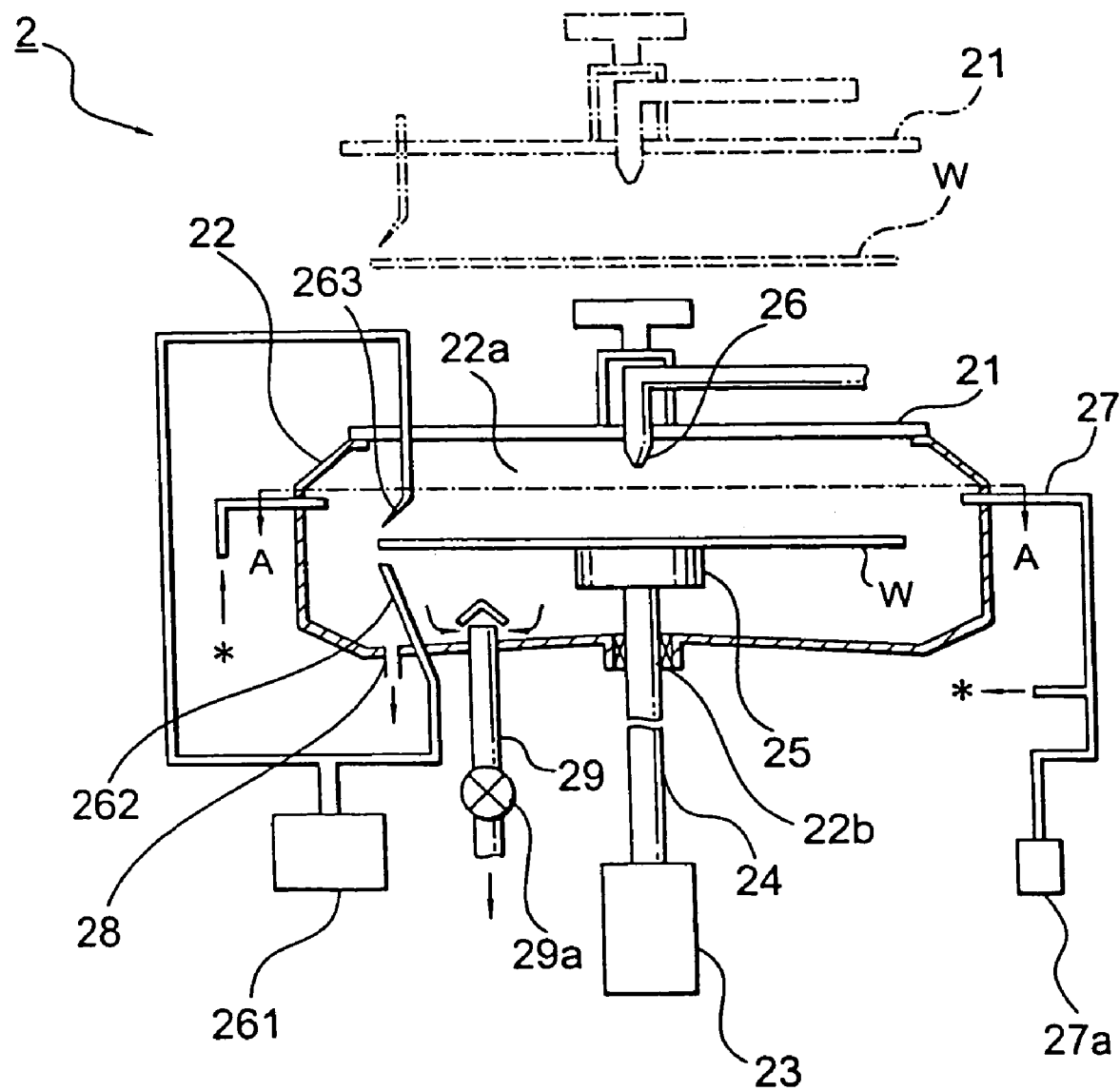
FIG. 19 is a side view of a profile showing an apparatus of forming a film being employed when practicing a method of the third invention.

In FIG. 19, an example of a coating unit 2 involving the third invention is illustrated.

As shown in FIG. 19, the coating unit 2 comprises a cup 22 which is a treatment chamber, a vacuum chuck 25 which is disposed inside the cup 22 and functions as a rotary stage holding the wafer, and a coating liquid nozzle 26 for dispensing the coating liquid on the center portion of the wafer W.

On the upper surface of the cup 22, an open inlet for carrying in a substrate 22a is disposed. This intake for taking in the substrate 22a is opened and closed by a cover 21 capable of freely going up or down. At the bottom surface of the cup 22, a breakthrough 22b is disposed. From this breakthrough 22b, a rotation axis 24 is inserted. The upper end of the rotation axis 24 is combined with the vacuum chuck 25, the lower end of the rotation axis is combined with a driving portion 23. Rotating driving force of the driving portion 23 is transmitted to the vacuum chuck 25 through the rotation axis 24. Further, the rotation axis 24 is designed to be capable of going up or down.

To the cover 21, a coating liquid nozzle 26 of dispensing coating liquid on the center portion of the wafer W is attached.

Figure 20:
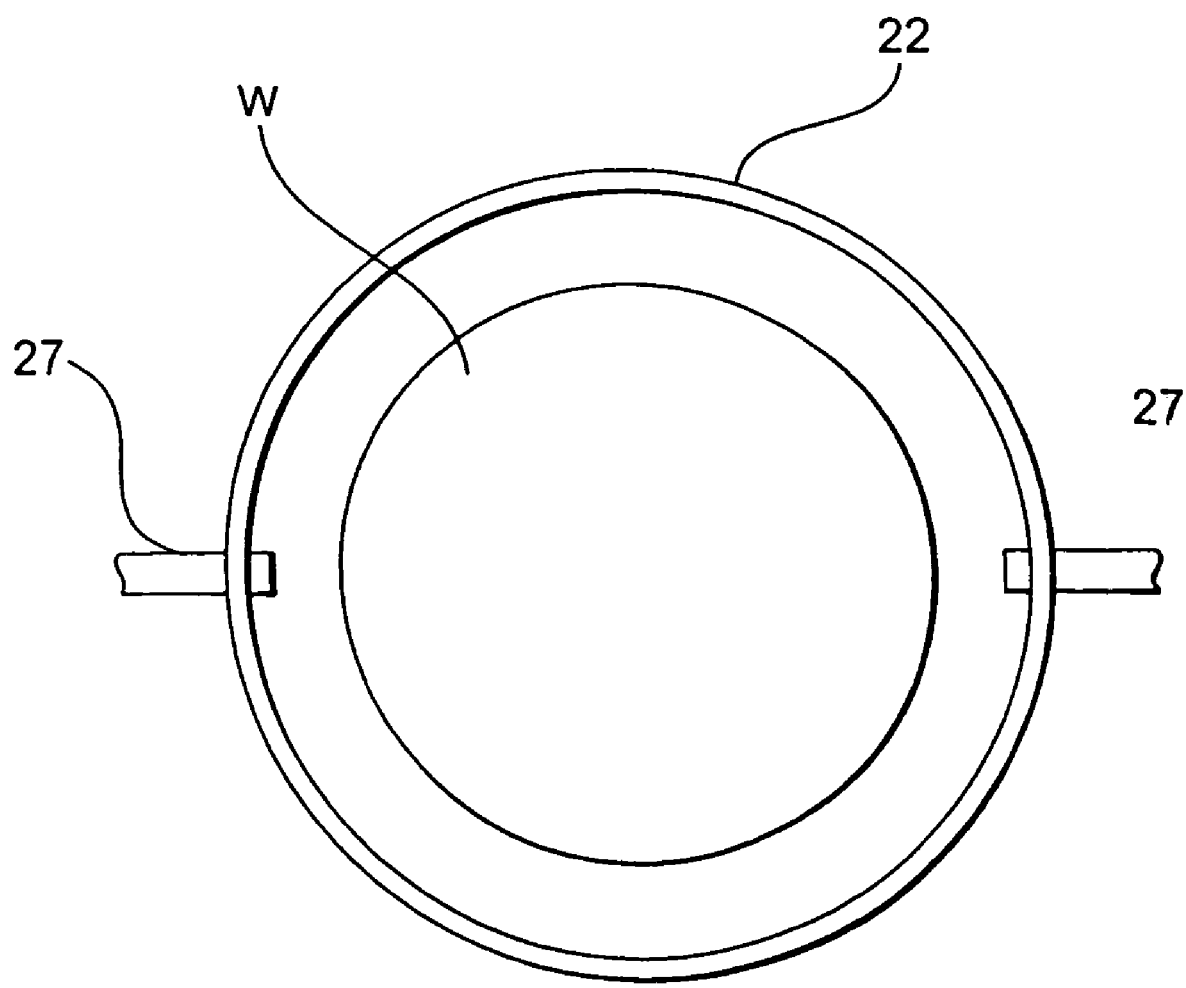
FIG. 20 is a plan view of a cross-section cut along A-A of the coating unit of FIG. 19.

To the cup 22, solvent vapor dispensing pipes 27 for dispensing vapor of the solvent employed in the coating liquid are connected. On the base side of the solvent vapor dispensing pipe 27, a solvent vapor generator 27a is connected. These solvent vapor dispensing pipes 27 are disposed such that the solvent vapor is dispensed into the cup 22 from a position higher than, for instance, the wafer W disposed on the pre-determined position in the cup 22. Further, as shown in FIG. 20, the pipes are disposed in the cup 22 such that the solvent vapor can be dispensed from the both sides of the wafer W.

Further, at the bottom surface and the cover 21 of the cup 22, as shown in FIG. 19, the solvent nozzles 262 and 263 for dispensing the solvent, which is a cleaning agent for removing (edge-rinse treatment) the coated film at the circumference portion of the wafer, from the solvent dispensing source 261, are inserted. The solvent nozzle 263 disposed on the cover 21 is to eject the solvent toward the circumference on the surface side of the wafer W. The solvent nozzle 262 disposed on the cup 22 is to remove the coating liquid which goes around the rear surface of the wafer by ejecting the solvent toward the circumference of the rear surface side of the wafer W.

Further, to the cup 22, a drain pipe 28, an exhaust pipe 29 are connected. There is a switching valve 29a in the midway of the exhaust pipe 29.

Then, the treatment of coating a coating liquid on an wafer W according to the method of the third invention will be described following order. First, the wafer W is carried to the coating unit 2 by the main arm 13. The carried wafer W is delivered to the chuck 25 at the position of the dotted line in FIG. 19, for instance. That state is shown in FIG. 21A. Subsequently, after the chuck 25 is lowered, the cup 22 is sealed with the cover 21. The coating liquid employed here is one in which colloids or particles of TEOS, which is a metal alkoxide, is dispersed in a solvent containing an organic solvent such as ethylene glycol and ethyl alcohol and further water and a trace of hydrochloric acid.

Ethylene glycol is employed to adjust the viscosity to the most appropriate one for coating the coating liquid.

Further, other than viscosity adjustment, because of low vapor pressure of ethylene glycol, it can be employed with an object to prevent shrinkage of the film due to volatilization of the solvent in the aging step from occurring.

And, in this example, as shown in FIG. 21B, while exhausting from the exhaust pipe 29, for instance, vapor of ethylene glycol 260 is dispensed inside the cup 22 from the solvent vapor dispensing pipe 27. Then, after the inside of the cup 22 is filled by the vapor 260, the exhaust is stopped. The solvent vapor 260 inside the cup 22 at this time is desirable to be the saturated vapor pressure. The reason for this is that, when the vapor pressure is lower than the saturated vapor pressure, the solvent vaporizes from the coating liquid. On the other hand, it is because that, when the vapor pressure is higher than the saturated vapor pressure, that is, when the vapor pressure is in a super-saturated state, the solvent condenses.

Figure 22A:
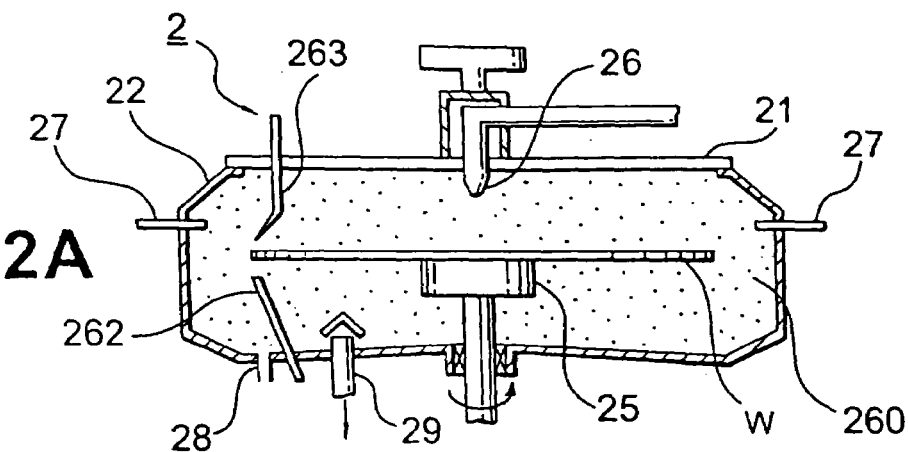
FIG. 22A, FIG. 22B and FIG. 22C are process diagrams showing processes following the processes shown in FIG. 21A to FIG. 22C.
Figure 22B:
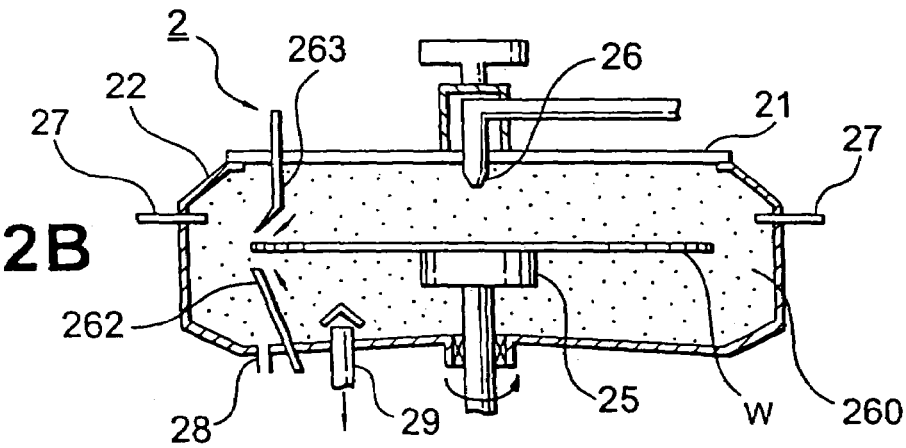
Figure 23:
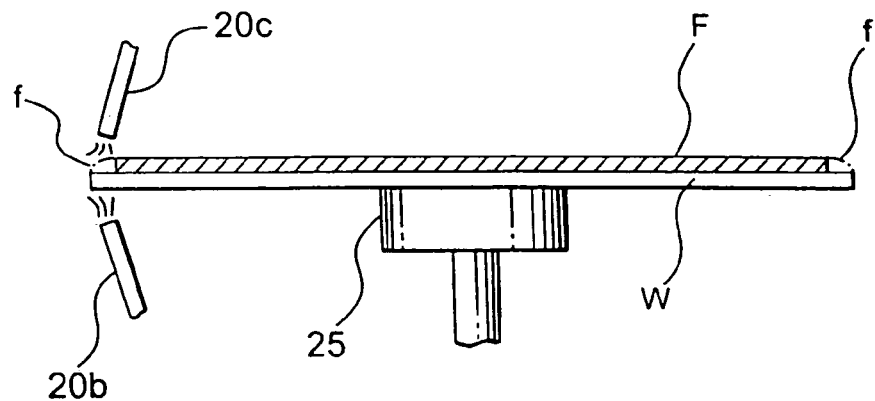
FIG. 23 is an exploded diagram showing a situation where the coated film of the circumference portion of an wafer is removed by edge-rinse treatment.

Subsequently, as shown in FIG. 21C, the coating liquid S is dispensed on the center portion of the wafer W from the nozzle 26. Then, as shown in FIG. 22A, by rotating the wafer W with high speed by the chuck 25, the coating liquid is spread over the surface of the wafer W due to centrifugal force, to form a coated film. Thereafter, the rotation speed is lowered and, as shown in FIG. 22B, the solvent is sprayed onto the brim of the wafer W from the nozzles 262 and 263. Thereby, as shown in FIG. 23, the brim portion f of the coated film F spread over the surface of the wafer W is removed. Thus, due to removal of the coated film at the brim portion of the wafer, since the carrying arm and the coating liquid do not make contact during transfer of the coated wafer W, the arm is prevented from being contaminated by the coating liquid. Further, when the wafer W is carried to the carrier after completion of the process, particles caused to peel from a part of the coated film due to groove of the carrier are prevented from occurring. Even in this edge rinse-treatment, the inside of the cup 22 is being filled by the solvent vapor 260.

Figure 22C:
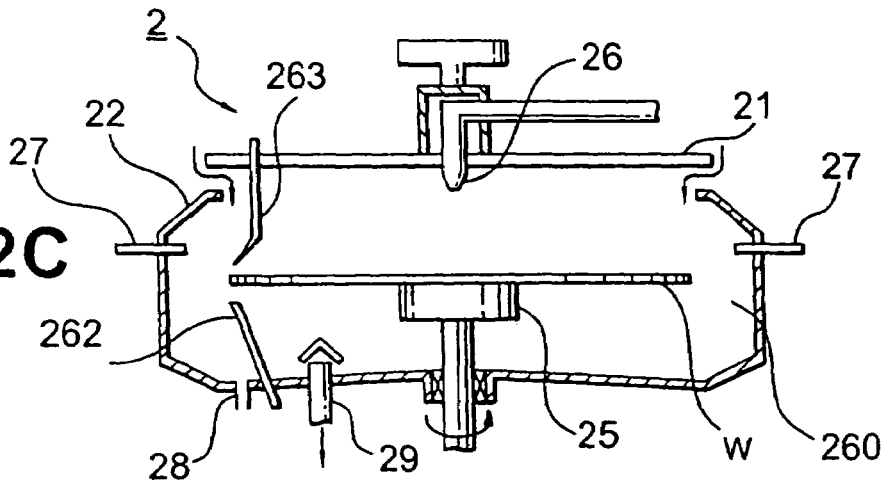

Thereafter, as shown in FIG. 22C, while holding up the cover 21 a little and letting in air into the cup 22, exhaust from the exhaust pipe 29 is carried out. Thus, the inside of the cup 22 is replaced by the air atmosphere. Then, by elevating the cover 21 and the chuck 25, the wafer W is delivered to the arm for carrying the wafer from the chuck 25. Thereafter, the wafer is carried to the gelling step.

Figure 24A:
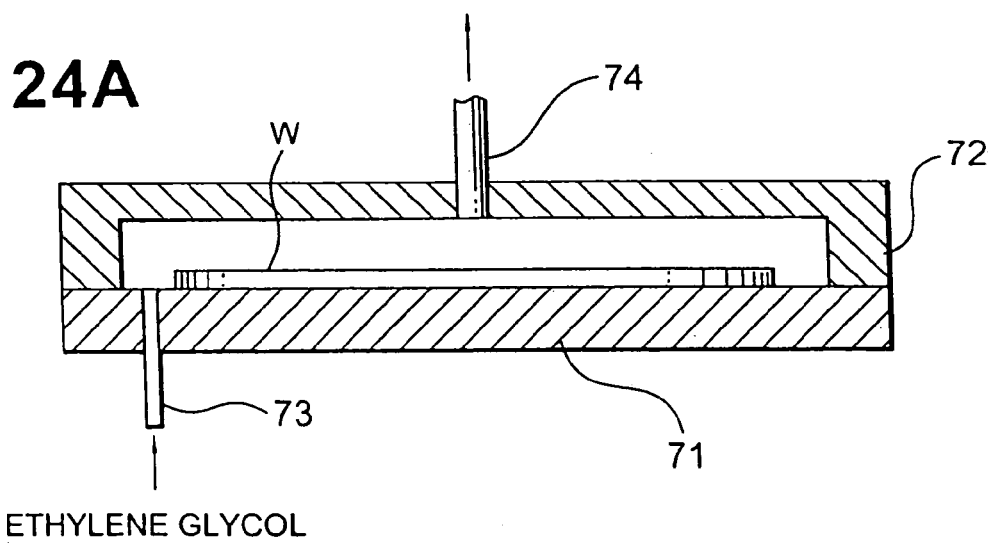
FIG. 24A and FIG. 24B are process diagrams showing processes after coating treatment.

The treatment after gelling step will be described briefly. In the gelling step, as shown in FIG. 24A, after disposing the wafer W on the heating plate 71, the cover 72 is put on to form a sealed space. Thus, the wafer W is heated to a temperature of, for instance, 100° C. to expedite the aforementioned gelling. In this case, the saturated vapor of ethylene glycol is introduced from the gas introducing path 73 laid inside the heating plate 71, for instance, and is exhausted from the exhaust path 74. Incidentally, this gelling step may be carried out by introducing basic gas such as ammonia gas into the treatment chamber.

Figure 24B:
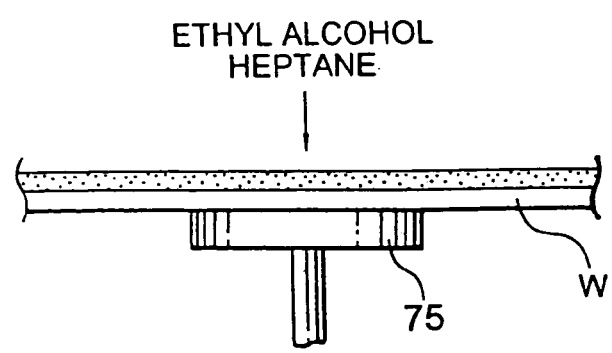

Thereafter, with the identical device as that employed in the coating treatment for instance, as shown in FIG. 24B, the wafer W is placed on the spin chuck 75, on the surface thereof, ethanol and HMDS (hexamethyl disilane) are dispensed in this order. Thereby, moisture and OH groups are removed. Subsequently, by dispensing a liquid of low surface tension such as heptane, the replacement of the solvent is carried out. Thereafter, the wafer W is treated in the bake step to form a porous silicon oxide film.

According to the example 5, by filling the inside of the cup 22 by the vapor of ethylene glycol during coating treatment and edge rinse treatment, the solvent can be suppressed in vaporization from the coated film. As the result, gelling is not hindered, and the pre-determined thickness can be secured. Incidentally, the edge rinse treatment may be carried out at a different place from the cup 22.

Here, when the spin coating is carried out as described above, at least during the wafer W is revolving, the inside of the cup 22 is required to be filled with the vapor of the solvent. In that case, the nozzle can be disposed different from the cup 22, for instance. Then, after the coating liquid is dripped on the wafer W from the nozzle, the cover is closed and the solvent vapor is dispensed into the cup 22. This is also included in the third invention.

Figure 25:
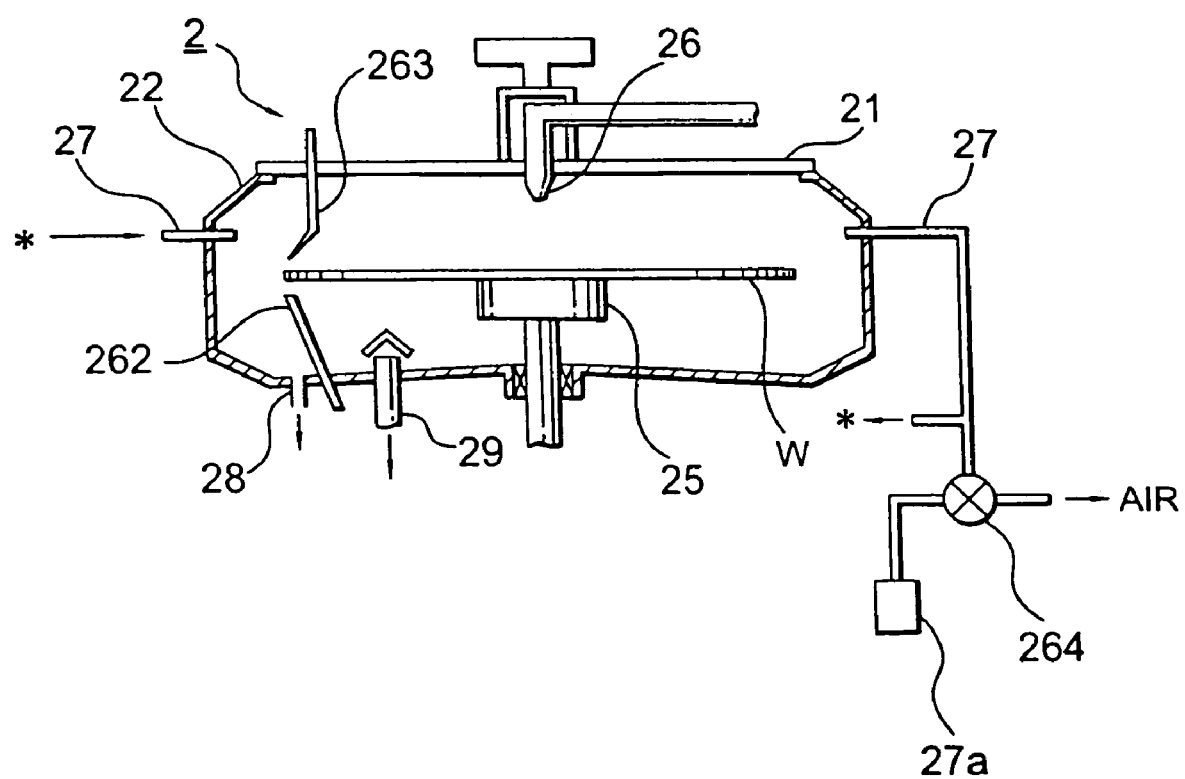
FIG. 25 is a side view of a profile showing one example in which a three-way valve is attached to a solvent vapor feeding pipe of the coating unit in the apparatus of forming a film.

Incidentally, in order to dispense into the cup 22 by switching the vapor of the solvent and the atmosphere, as shown in FIG. 25, at the midway of the solvent vapor dispensing pipe 27, a 3-way valve 264 one end thereof is open to the atmosphere may be disposed. Thereby, by switching the 3-way valve 264 toward the flow side of the atmosphere, while introducing the atmosphere into the cup 22 after coating, the inside of the cup 22 can be exhausted. By connecting the aforementioned one end of the 3-way valve 264 to a nitrogen gas source, nitrogen gas can be dispensed instead of the atmosphere.

In the third invention described above, the solvent vapor dispensing pipe 27 can be disposed such that the vapor of the solvent can be dispensed into the cup 22 from 3 or more directions, for instance. Further, by employing an open end cup and by surrounding it by an air tight vessel, the inside thereof is made an atmosphere of the vapor of the solvent and coating may be carried out therein. Further, the edge rinse treatment can be carried out in the open atmosphere, and the coating can be carried out with a method other than the spin coat. Further, as the substrate to be treated, without restricting to the wafer, glass substrates for liquid crystal displays may be employed.

As described above, according to the third invention, since the coating liquid in which colloids or particles of the starting substances of the film component are dispersed in the solvent can be coated on the substrate while preventing the solvent from evaporating, the excellent thin film such as the interlayer insulating film can be obtained.

Further, since the coated film at the brim portion of the substrate is removed in the atmosphere of the vapor of the solvent, vaporization of the solvent of the coating liquid can be suppressed further more.

EXAMPLE 6

Next, example 6 involving the fourth invention will be described.

Figure 26:
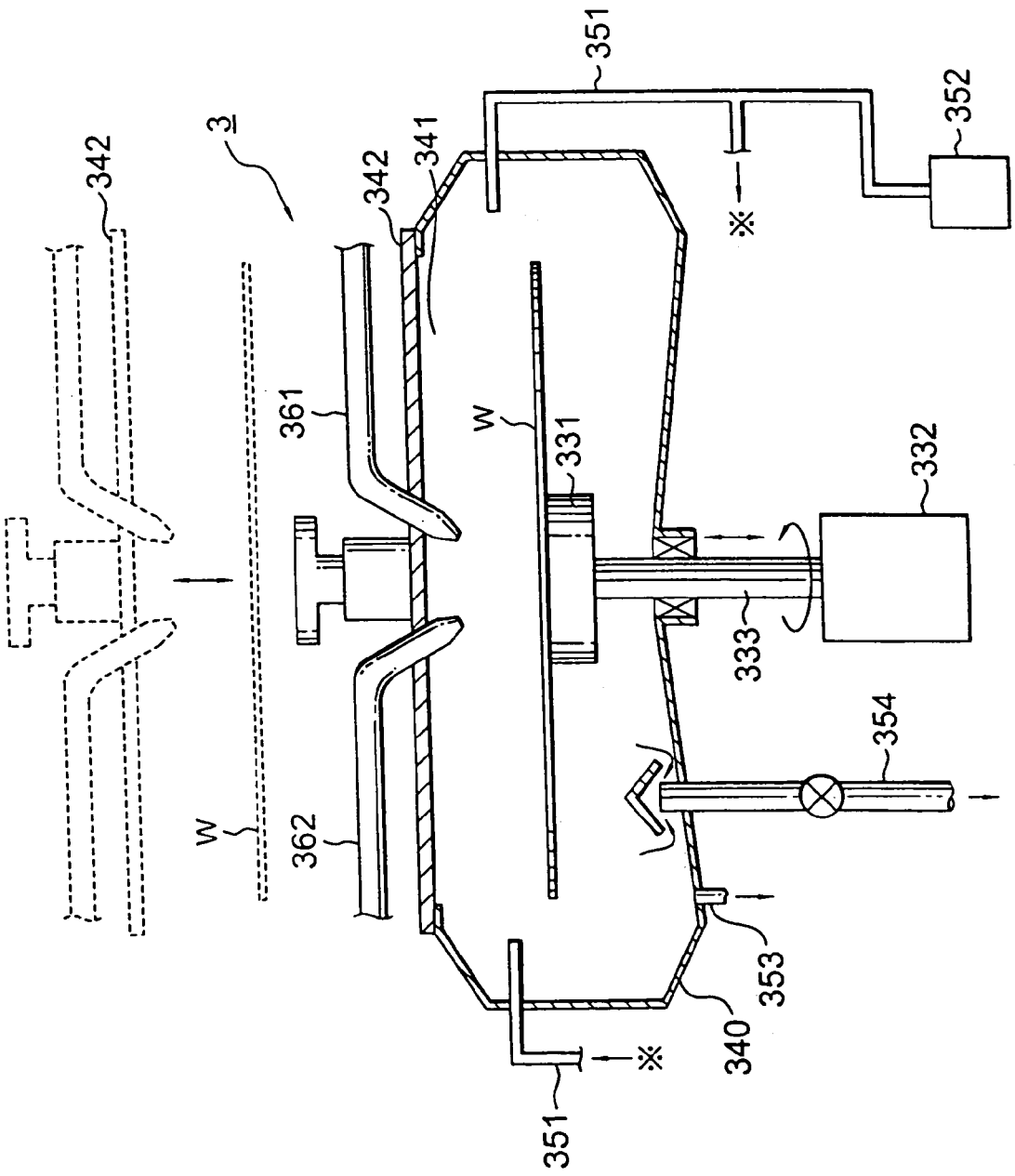
FIG. 26 is a side view of a profile showing one example of a coating unit where the process of forming a film of the method of the fourth invention is practiced.

FIG. 26 is a side view of a profile of the coating unit 2 involving example 6.

In the figure, reference numeral 331 denotes a chuck holding an wafer W in level (includes a state which is approximately level). This chuck 331 is composed of a vacuum chuck, for instance, and is designed to suck and hold the rear surface side of the wafer W. At the approximate center of the bottom surface of the chuck 331, a rotation axis 333 capable of going up and down and rotating by a driving portion 332 is attached. Thereby, the chuck 331 is going up and down between a delivering position of the wafer W above the cup which is shown in the figure by the dotted line and will be described later and a treatment position of the wafer W shown in the figure by the solid line. Further, the chuck 331 is capable of revolving around a vertical axis.

In the circumference of the chuck 331 and the wafer W which are in the treatment position, a cup 340 is disposed to surround these. On the upper surface of the cup 340, an opening 341 through which the wafer W is passable is formed. This opening 341 is opened or closed by a cover 342 disposed so as to be capable of going up and down. Further, on the side wall portion of the cup 340, a solvent vapor dispensing pipe 351 for dispensing the vapor of the solvent component such as ethylene glycol, which is employed in the coating liquid X and will be described later, into the cup 340 is connected. Further, the vapor of ethylene glycol is generated at the solvent vapor source 352. Further, at the bottom of the cup 340, a drain pipe 353 and an exhaust pipe 354 are connected.

At the cover 342, a coating liquid nozzle 361 for dispensing the coating liquid X approximately on the rotation center of the surface of the wafer (the surface thereon the coated film is formed) and a coating liquid nozzle 362 for dispensing the solution S approximately on the rotation center of the surface of the wafer are disposed. These nozzles 361 and 362 are attached slanted combined with the cover 342 such that the respective tip end directs toward the approximate center of rotation on the surface of the wafer.

Now, the coating liquid X will be described. In this coating liquid X, colloids or particles of a metal alkoxide such as TEOS which is a starting component are dispersed in a solvent, and, for the solvent, ethylene glycol, ethyl alcohol, water and a trace of hydrochloric acid are employed. An example of the ratio of the respective components in the coating liquid is as follows. For instance, TEOS and water are employed in an equal molar ratio, and ethylene glycol solution and ethanol solution are employed in several times of water by the molar ratio.

Further, the solution S dispensed on the surface of the wafer from the solution nozzle 62 is preferable to be a solution of smaller viscosity than that of the component of the highest viscosity in the components of the solvent of the coating liquid X, and to be capable of dissolving the metal alkoxide and water. Here, the component of the highest viscosity of the components of the solvent of the coating liquid X is ethylene glycol. Further, it is known that the metal alkoxide such as TEOS or the like is generally insoluble in water, whereas is soluble in alcohol and organic solvent. Therefore, as the solution S capable of being employed in the present example 6, alcohol or organic solvent of smaller viscosity than ethylene glycol can be employed. Among them, ethanol, one of components of the solvent of the coating liquid X, is particularly desirable to be employed.

Subsequently, a method involving the fourth invention being carried out at the aforementioned apparatus of forming a film will be described.

In this apparatus of forming a film, the wafer W, after being subjected to hydrophobic treatment and cooling treatment, is sequentially carried to a coating unit 2, an aging unit 3, and a solvent replacement unit 4 by a main arm 13, and, after the respective predetermined treatments are carried out at these units, is subjected to bake treatment.

Now, steps of forming a film being carried out in the coating unit 2 will be described with reference to FIG. 26 and FIG. 27A through FIG. 27D. First, the cover 342 is elevated up to the position of the dotted line in FIG. 26. At the same time, the chuck 331 is elevated up to a position above the cup 340. Then, at the position of the dotted line in FIG. 26, the wafer W carried to the unit 2 by the main arm 13 is delivered to the chuck 331. Then, the chuck 331 is lowered to the treatment position, and the cover 342 is lowered to seal the cup 340.

Figure 27A:
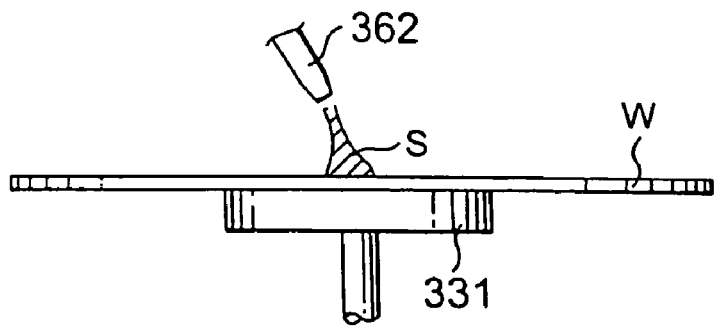
FIG. 27A, FIG. 27B, FIG. 27C and FIG. 27D are process diagrams for explaining the solvent replacement process of the method of the fourth invention.
Figure 27B:
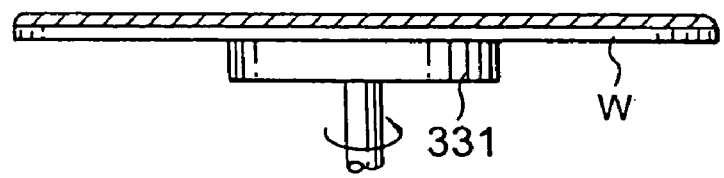

And, in this example, while exhausting from the exhaust pipe 354 for instance, ethylene glycol vapor is dispensed into the cup 340 from the solvent dispensing pipe 351. Then, after the inside of the cup 340 is filled by the vapor, exhaust is stopped. Then, as shown in FIG. 27A, the solution S such as 99.9% ethanol solution for instance is dispensed at the approximate center of rotation of the wafer W from the solution nozzle 362. Then, as shown in FIG. 27B, the wafer W is rotated by the chuck 331. Thereby, the solution S is diffused over the whole surface of the wafer W due to centrifugal force, to spread.

Figure 27C:
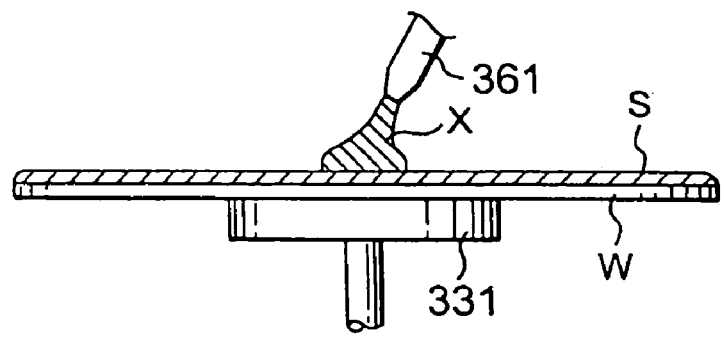

Subsequently, as shown in FIG. 27C, the coating liquid X is dispensed on the approximate rotation center of the wafer W from the coating liquid nozzle 361. In this case, the coating liquid X is preferable to be dispensed when the coated solution S is in a state where it does not vaporize and exists on the surface of the wafer W.

Figure 27D:
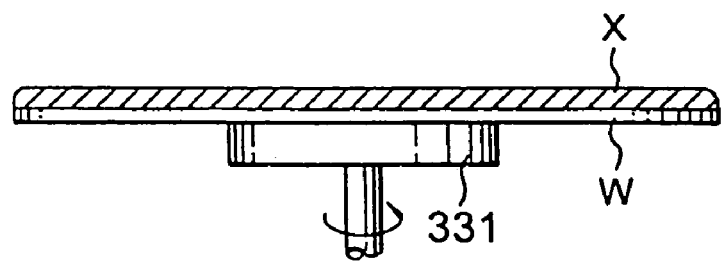

Then, as shown in FIG. 27D, the wafer W is rotated by the chuck 331, the coating liquid X is diffused and spread over the whole surface of the wafer due to centrifugal force, to form the coated film.

Incidentally, though not shown in the figure, thereafter, thinner is sprayed on the brim portion of the wafer W from a thinner nozzle in the cup 340, thereby the coated film of the brim portion is removed.

Further, in this example, why the inside of the cup 340 is filled by the vapor of ethylene glycol is to suppress vaporization of the solvent in the coating liquid.

Thereafter, while maintaining a state where the cover 342 is being held up a little, the inside of the cup 340 is evacuated. Then, by elevating the cover 342 and the chuck 331, the wafer W is delivered to the carrying arm 13 from the chuck 331, and is sequentially transferred to the aging unit 3 and the solvent replacement unit 4. At the respective units 3 and 4, the gelling step and the solvent replacement step are carried out. Then, these steps will be described briefly with reference to FIG. 28A and FIG. 28B.

Figure 28A:
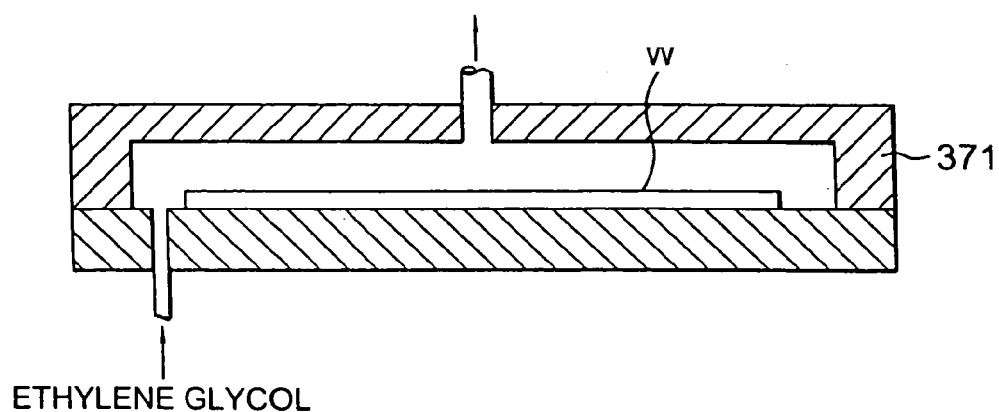
FIG. 28A and FIG. 28B are process diagrams for explaining a gelling process and a solvent replacement process of the fourth invention.

First, in the gelling step, the treatment of gelling the colloids of TEOS contained in the coated film on the wafer W is carried out to link the colloids in a reticular structure. For this, in a treatment chamber 371 filled by the vapor of ethylene glycol, the wafer W is heated to around 100° C. by the heating plate (FIG. 28A). Here, why the vapor of ethylene glycol is introduced into the treatment chamber 371 is to suppress vaporization of the solvent in the coated film. Therefore, at the temperature of, for instance, the inside of the treatment chamber 371, vapor is adjusted to be 100%. In this gelling step, instead of heating, a catalyst such as ammonia can be employed.

In that case, in the treatment chamber 371 filled by an ammonia gas, for instance, treatment is carried out at normal temperature, the gelling of the colloids of TEOS may be expedited by the ammonia gas which is a basic catalyst.

Figure 28B:
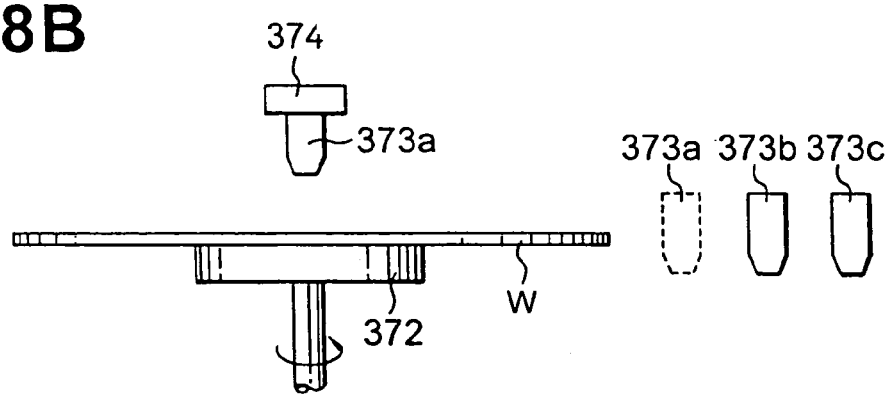

Subsequently, in the solvent replacement step, by dispensing sequentially ethanol, HMDS (hexamethyl disilane) and heptane on the approximate rotation center of the surface of the wafer W, the solvent in the coated film is replaced by another solvent. Therefore, in the solvent replacement unit 4, as shown in FIG. 28B, the wafer W is held in level on the wafer hold 372 constituted to be capable of rotating around the vertical axis. On the other hand, 3 pieces of nozzles 373 (373a, 373b, 373c) respectively ejecting ethanol, HMDS, and heptane are prepared. Then, these nozzles 373 (373a, 373b, 373c), by grasping by the carrying arm 374 and pulling out in turn from the respective nozzle receivers which are not shown in the figure, are transferred to the center portion of the wafer W.

In this step, first, the wafer W is rotated. In this state, ethanol is dripped on the approximate rotation center of the surface of the wafer W to diffuse over the whole surface of the wafer W due to centrifugal force.

Thereby, ethanol dissolves in the moisture in the coated film. As the result, the moisture is replaced by ethanol. Subsequently, while rotating the wafer W similarly, HMDS is dripped on the surface of the wafer W. Thereby, OH groups in the coated film are removed. Further, heptane is dispensed on the surface of the wafer W. Thereby, the solvent in the coated film is replaced by heptane. The reason why to employ heptane is that, due to use of a solvent of low surface tension, the force on a porous structure that is a reticular structure of TEOS can be made small, and the reticular structure of TEOS is made not to collapse.

The wafer W thereon the predetermined treatment is carried out at the solvent replacement unit 4 is transferred to the bake unit by the main arm 13. At this unit, the wafer W is subjected to the bake treatment. Thereby, on the surface of the wafer W, an interlayer insulating film consisting of a silicon oxide film is formed.

According to the aforementioned example 6, in the step of forming a film, prior to coating of the coating liquid, the whole surface of the wafer is coated by ethanol. In a state where the ethanol exists on the surface of the wafer W, thereon the coating liquid X is dispensed. Here, since the ethanol is lower in viscosity than ethylene glycol, the ethanol itself readily diffuses over the whole surface of the wafer. Therefore, the ethanol goes into minute concave/convex portions formed on the surface of the wafer W thoroughly.

Thus, in a state where ethanol exists on the whole surface of the wafer, on the surface of the wafer W, the coating liquid X is dispensed, to diffuse. The components composing the coating liquid X, that is, all of TEOS, water, ethylene glycol and hydrochloric acid are soluble in ethanol. Therefore, the coating liquid X mingles with ethanol on the surface of the wafer W. As the result, the coating liquid X becomes a state of capable of being mingled with ethanol, thereby goes into the places where ethanol exists.

Moreover, ethanol is lower in viscosity than ethylene glycol as mentioned above. Therefore, the coating liquid X mingled with ethanol becomes low in viscosity and becomes readily diffused. Therefore, when the wafer W is rotated, the coating liquid X spreads universally on the whole surface of the wafer and goes into the minute concave/convex portions. Therefore, all over the surface of the wafer, the coated film is formed.

In this time, even when, as the coating liquid S, the solution or alcohol which is lower in viscosity than ethylene glycol and dissolves metal alkoxide and water is employed, the component of the coating liquid X and the solution S mingle each other. As the result, the viscosity of the coating liquid X to be spread over the surface of the wafer W becomes low, thereby the similar effect as ethylene glycol can be obtained.

Further, when, as the solution S, ethanol which is one of solvent components of the coating liquid X is employed, since ethanol is included as the solvent in advance, mingling of the solution S and the coating liquid S on the surface of the wafer is proceeded readily. Therefore, during mingling of the solution S and the coating liquid X, there are no generation of bubbles and no remaining thereof in the coated film. Therefore, a coated film of more excellent quality can be formed.

Now, if a solution of higher viscosity than ethylene glycol had been employed, the solution S itself would be difficult to diffuse. Therefore, penetration into the minute concave/convex portions on the surface of the wafer W becomes difficult. Further, since the viscosity of the coating liquid X after the solution S and the coating liquid X were mingled becomes high, the coating liquid X becomes further more difficult to diffuse. As the result, an even coating of the coating liquid X on the whole surface of the wafer W becomes difficult.

Further, if a solution in which a metal alkoxide or water does not dissolve is employed as the solution S, the solution S and the coating liquid X do not mingle. Therefore, the viscosity of the coating liquid X can not be made low.

Furthermore, because of hindrance of the solution S to the coating liquid X, coating on the surface of the wafer W can not be carried out. Incidentally, inclusion of water in the solvent of the coating liquid is not restricted. However, when water is contained, the solution is necessary to be capable of dissolving the starting substance and water.

Thus, according to the aforementioned example 6, a coating liquid X becomes capable of being coated easily on the surface of the wafer W, thereby the coating liquid X can be coated on the whole surface of the wafer W universally. Therefore, since formation of the film can be secured all over the whole surface, as the result, a thin film of excellent quality such as an interlayer insulating film can be formed.

In the above-mentioned method of forming a film of the fourth invention, the aforementioned solvent replacement step is not always necessary. By carrying out gelling step after the step of forming a film, a thin film such as an interlayer insulating film may be formed.

According to the fourth invention, before coating a coating liquid in which particles or colloids of a starting substance of a film component are dispersed in a solvent, a solution of which viscosity is smaller than that of the component of the highest viscosity among solvents of the coating liquid and is capable of dissolving the starting substance is coated on the surface of the substrate. Thereby, coating of the coating liquid on the surface of the substrate becomes easy, thereby the film can be universally formed over the whole surface of the substrate. As the result, an excellent thin film such as an interlayer insulating film can be obtained.

EXAMPLE 7

Next, example 7 involving the fifth invention of the present application will be described.

FIG. 1 is a plan view showing an apparatus involving example 7.

FIG. 2A through FIG. 2D are diagrams showing schematically each step of the method of forming a film involving example 7.

In this apparatus, an wafer W, after being subjected to hydrophobic treatment and cooling treatment, is sequentially transferred to a coating unit 2, an aging unit 3, and a solvent replacement unit 4 by a main arm 13, and at these units, the predetermined treatments are carried out, respectively.

That is, at the unit 2, as shown in FIG. 2A, on the approximate rotation center of the surface of the wafer W sucked and held by an wafer holder 21 which will be described later, by the later described coating liquid nozzle 5, a coating liquid X is dispensed. Then, as shown in FIG. 2B, by rotating the wafer W, the coating liquid X is spread over the whole surface of the wafer W due to centrifugal force to form a film (treatment of forming a film).

Then, at the aging unit 3, colloids of TEOS contained in the coated film on the wafer W is gelled, treatment thereby to link the colloids to form a reticular structure is carried out (gelling treatment). To carry out this gelling, in a treatment chamber 37 filled by ethylene glycol vapor, the wafer W is heated to approximately 100° C. by a heating plate (FIG. 2C). In this step, instead of heating, in the treatment chamber 37 filled by an ammonia gas, treatment is carried out at the normal temperature, thereby gelling of the colloids of TEOS may be enhanced by the ammonia gas which is a basic catalyst. Incidentally, the reason why the inside of the treatment chamber 37 is filled by the ethylene glycol vapor is to suppress vaporization of the solvent in the coating liquid.

Subsequently, at the solvent replacement unit 4, on the approximate rotation center of the surface of the coated film M on the wafer W, ethanol, HMDS (hexamethyl disilane) and heptane are dispensed in turn, thereby the solvents in the coated film M are replaced by other solvents (solvent replacement treatment). For this, at the solvent replacement unit 4, as shown in FIG. 2D, the wafer W is held in level by an wafer holder 21 constituted to be capable of rotating around a vertical axis. In this state, first, ethanol is dripped on the approximate rotation center of the surface of the wafer W, thereafter the wafer W is rotated to make diffuse ethanol on the whole surface of the wafer due to centrifugal force. Thereby, ethanol dissolves into moisture in the coated film M, resulting in replacement of the moisture by ethanol.

Subsequently, in the similar manner, by dispensing HMDS on the surface of the wafer W, OH groups in the coated film are removed. Then, by dispensing heptane on the surface of the wafer W, the solvent in the coated film is replaced by heptane. The reason why heptane is employed is that, due to use of a solvent of smaller surface tension, the force put on the porous structure, that is, a reticular structure of TEOS, is reduced, thereby the reticular structure of TEOS is prevented from collapsing.

The wafer W thus carried out the predetermined treatment at the solvent replacement unit 4 is transferred to a bake unit by the main arm 13. The wafer W is bake treated at this unit, thereby an interlayer insulating film consisting of a silicon oxide film is formed on the surface of the wafer W.

The method of forming a film of the fifth invention is characterized in formation treatment of a film.

Figure 29:
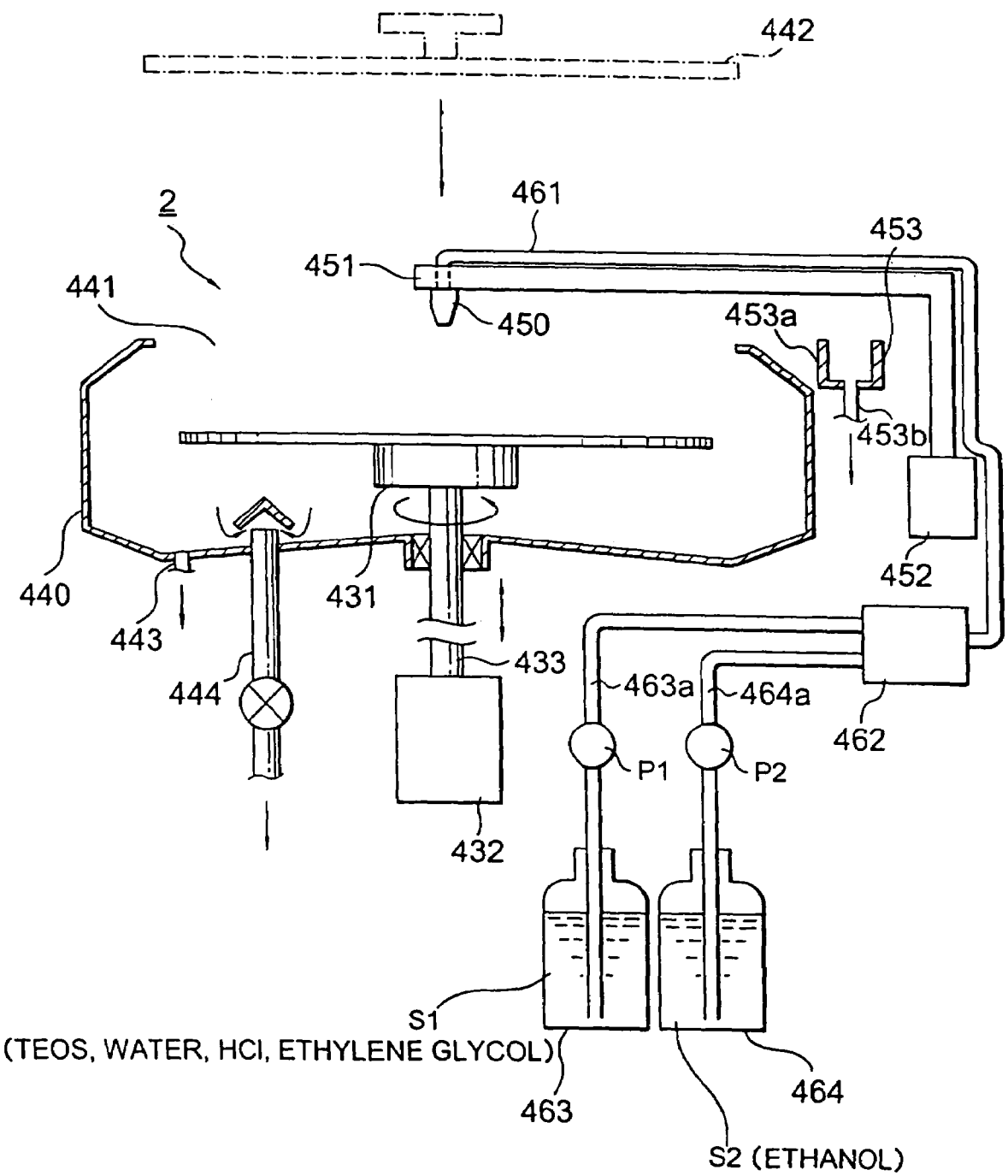
FIG. 29 is a side view of a profile showing one example of a coating unit where the treatment forming a film of the method of the fifth invention is carried out.

In the following, the coating unit 2 where this treatment is carried out will be described with reference to the side view of the profile of FIG. 29. Reference numeral 431 in the figure denotes a chuck for holding an wafer W level (includes approximately level). This chuck 431 is constituted of a vacuum chuck for instance, the rear side of the wafer W is sucked and held. On the approximate center of the bottom surface of the chuck 431, a rotation axis 433 capable of going up and down and rotating by a driving portion 432 is attached. With such a structure, the chuck 431 is capable of going up and down between a delivering position of the wafer W above the fixed cup which will be described later and a treatment position of the wafer W shown by the solid line in FIG. 29, and is capable of rotating round the vertical axis.

In the circumference of the chuck 431 and the wafer W which are positioned at the treatment position, a fixed cup 440 is disposed in order to surround them. On the upper surface of the fixed cup 440, an opening 441 where the wafer W is passable is formed. The opening portion 441 is opened and closed by a cover 442 disposed to be capable of going up and down. Further, on the bottom surface of the fixed cup 440, a draining pipe 443 and an exhaust pipe 444 are connected.

Above the wafer W which is in a treatment position, a coating liquid nozzle 450 is attached to dispense the coating liquid which will be described later on the approximate center of the surface of the wafer W (the surface where a coated film is formed). This coating liquid nozzle 450 is attached to a supporting arm 451 such that the tip end thereof is directed toward the approximate rotation center of the surface of the wafer. The supporting arm 451 is constituted to be capable of moving in a level direction by a driving portion 452. As the result, the coating liquid nozzle 450 is capable of moving between a dispensing position (a position shown in FIG. 29) of dispensing a coating liquid on the surface of the wafer, and a nozzle cleaning portion 453 disposed outside the wafer W which is in the treatment position. The nozzle cleaning portion 453 is a portion which receives the liquid overflowing from the coating liquid nozzle 450 and is constituted such that, a liquid exhaust path 453b is connected to the bottom surface of a cylindrical liquid receiver 453a, for instance.

The coating liquid nozzle 450 is connected to one end side of a solvent dispensing pipe 461 for dispensing a coating liquid X to the nozzle 450. The other end side of the coating liquid dispensing pipe 461 is connected to a mixing portion 462. This coating liquid dispensing pipe 461 has a jacketed structure having an internal pipe and an external pipe for instance. Through the external pipe, temperature controlling liquid is flowed.

To the mixing portion 462, a plurality, for instance, 2, of reserving tanks 463 and 464 for reserving respectively the first liquid and the second liquid which are components of the coating liquid X are connected through solvent dispensing pipes 463a and 463b having pumps P1 and P2. The respective liquids reserved in these first and second reserving tanks 463, 464 are mixed at the mixing portion 462, and are dispensed to the coating liquid nozzle 450 through the coating liquid dispensing pipe 461.

Here, the coating liquid X will be described. In this coating liquid X, colloids or particles of a metal alkoxide such as TEOS which is a starting substance of a film component are dispersed in a solvent. As a solvent, ethanol solution, ethylene glycol, water and a trace of hydrochloric acid (HCl) can be employed.

In such a coating liquid X, the colloids or particles of TEOS are insoluble or difficult to be dissolved in water. The liquid in which the colloids or particles of the TEOS, ethylene glycol, water and hydrochloric acid are mixed is reserved in the first reserving tank 463 as the first liquid S1. Further, an ethanol solution is an organic solvent which dissolves water and the colloids and the like of TEOS, and is reserved in the second reserving tank 464 as the second liquid S2.

Next, the formation treatment of a film which is carried out at the coating unit 2 will be described with reference to FIG. 30A through FIG. 30D. First, a cover 442 is elevated up to the position shown by the dotted line in FIG. 29. At the same time, a chuck 431 is elevated up to the position above the fixed cup 440. In this state, at the position of the dotted line in FIG. 29, the wafer W transferred to the unit 3 by the main arm 13 is delivered onto the chuck 431. Then, the chuck 431 is lowered to the treatment position, and the cover 442 is lowered to seal the fixed cup 440.

Figure 30A:
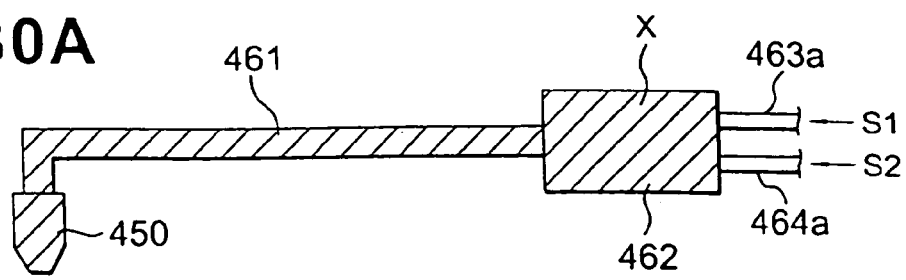
FIG. 30A, FIG. 30B, FIG. 30C and FIG. 30D are process diagrams for explaining the treatment of forming a film.

And, first, as shown in FIG. 30A, the coating liquid X is dispensed on the approximate rotation center on the surface of the wafer W from the coating liquid nozzle 450 to form a coated film on the surface. That is, the coating liquid X (mixed liquid) is made by mixing the first liquid S1 and the second liquid S2 at the mixing portion 462, then this coating liquid X is dispensed on the surface of the wafer W within 6 min. after mixing of the respective liquids to coat.

In specific, by operating pumps P1 and P2, the predetermined amounts of the first liquid S1 and the second liquid S2 are dispensed to the mixing portion 462 from the first reserving and the second reserving tanks 463 and 464. At the mixing portion 462, these first and the second liquids S1 and S2 are mixed to prepare the coating liquid X, then the coating liquid X is dispensed on the surface of the wafer W through the coating liquid dispensing pipe 461. Then, by rotating the wafer W, the coating liquid X is diffused and spread over the whole surface of the wafer due to centrifugal force to form a coated film. Thus, by dispensing the coating liquid X on the surface of the wafers W within 6 min. after the first and the second liquids S1 and S2 are mixed, the predetermined number of the wafers W undergoes film formation.

Incidentally, after films are formed, a thinner is sprayed on the brim portion of the wafer W from a thinner nozzle in the fixed cup 440 not shown in the figure to remove the coated film of the brim portion. Thereafter, the cover 442 and the chuck 431 are elevated to deliver the wafer W from the chuck 431 to the carrying arm 13, then it is carried to the aging unit 3 and the solvent replacement unit 4 in turn.

Figure 30B:
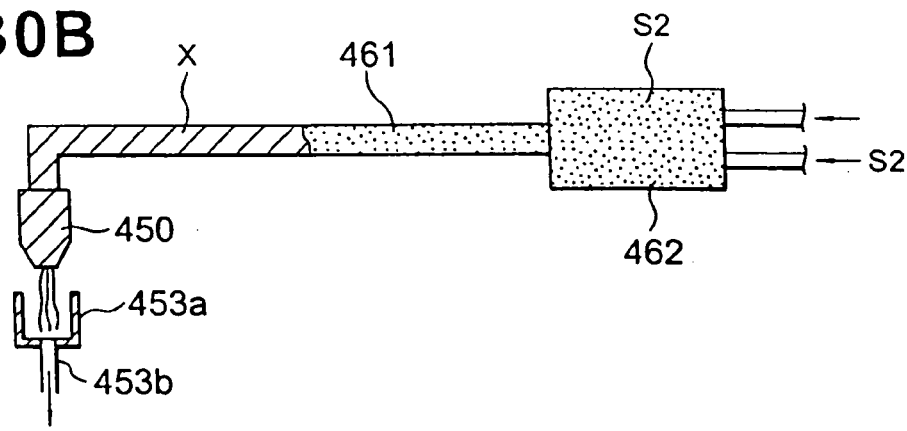

Subsequently, at the coating unit 2, before coating the coating liquid X on the surface of the following wafer W, as shown in FIG. 30B, the inside of the path of the coating liquid X composed of the mixing portion 462 and the coating liquid pipe 461 is cleaned by an organic solvent. That is, after the coating liquid nozzle 450 is moved above the nozzle cleaning portion 453, supply of the first liquid to the mixing portion 462 is stopped. Then, only the second liquid is dispensed to the coating liquid dispensing pipe 461 through the mixing portion 462.

Figure 30C:
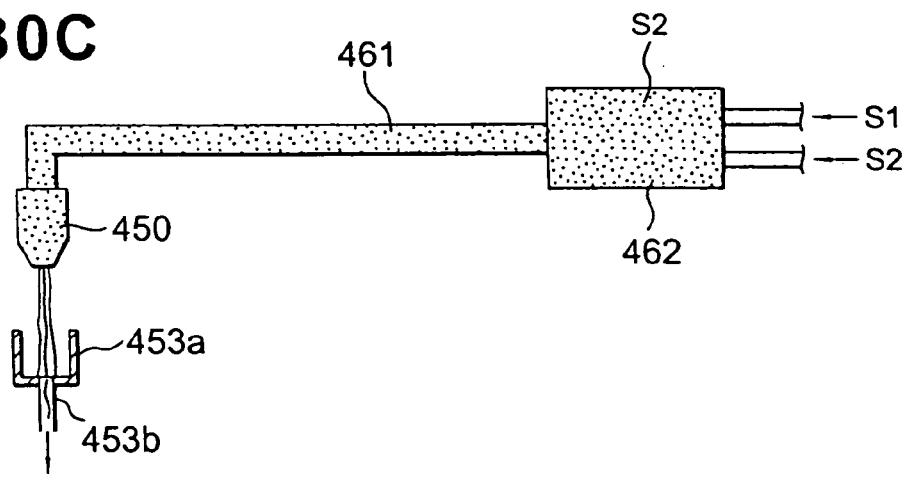

By carrying out like this, the flow path of the coating liquid X is replaced gradually from the upstream side by an organic solvent, the ethanol solution S2 in this example (FIG. 30B), before long, is completely replaced by the ethanol solution S2 (FIG. 30C). Thereby, the inside of the flow path is cleaned by the ethanol solution S2. In this time, the coating liquid X and the ethanol solution S2 flowing out of the coating liquid nozzle 450 are exhausted from the liquid exhaust path 453b through the liquid receiver 453a. Here, as an organic solvent for cleaning the flow path, it is preferable to employ a component which dissolves the starting substance of the film component and water. As such organic solvents, alcohol such as an ethanol solution, IPA (isopropyl alcohol) or the like can be employed.

Figure 30D:
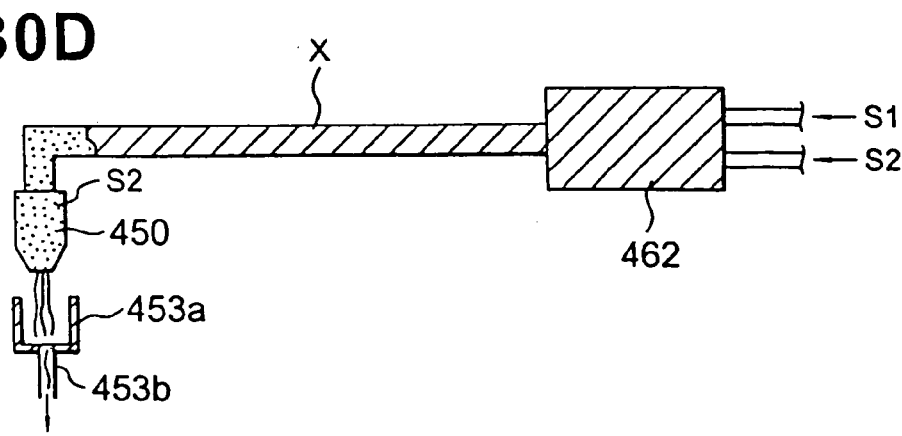

After thus replacing the inside of the flow path by the ethanol solution S2, as shown in FIG. 30C and FIG. 30D, the first and the second liquids S1 and S2 are dispensed into the inside of the flow path. Thus, by replacing the inside of the flow path by the coating liquid X, then, by moving the coating liquid nozzle 450 to the dispensing position, the wafer W is again subjected to the formation treatment of the coated film. This time, after the coating liquid nozzle 450 is moved to the dispensing position, the inside of the flow path may be replaced by the coating liquid X, or, on the surface of the wafer W, the ethanol solution and the coating liquid X may be replaced.

According to the aforementioned example 7, since the coating liquid X of within the film quality deteriorating time period after completion of mixing of the first and the second liquids S1, S2, for instance, within 6 min. after completion of mixing is coated on the surface of the wafer W, as obvious from the experimental results which will be described later, deterioration of the film quality of coated film can be suppressed.

Here, the experiments which the inventors carried out are as follows. That is, the aforementioned first liquid S1 and the second liquid S2 are mixed to form the coating liquid X. Then, by varying the time periods up to dispensing the coating liquid X on the surface of the wafers W after mixing, the coated films are formed on the surfaces of the wafers W by the aforementioned method. Then, the state of such formed coated films are observed by visual observation.

This time, the inventors had grasped from experience that the film quality of the films to be formed deteriorated when the time period up to dispensing on the surface of the wafer W passed approximately 6 min. after the first liquid S1 and the second liquid S2 are mixed. Therefore, in order to confirm the critical point, the experiment was carried out by varying the time periods up to dispensing on the surface of the wafers W such as 1 min, 2 min, 3 min, 4 min, 5 min, 6 min, 10 min, and 30 min, respectively after mixing.

As to the coated films obtained under the respective conditions, the in-plane uniformity of the film thickness= (standard deviation of film thickness in the wafer plane)/(average film thickness in the wafer plane)×100(%) is obtained. On the other hand, the obtained coated films are checked by visual observation. The results are shown in FIG. 31. Here, ○ denotes a state where no irregularity is observed in the coated film, and X denotes a state where a radial truck is seen on the surface like a running truck of a particle. From these results, it is confirmed that, by employing the coating liquid X of within 6 min after the first and the second liquids S1 and S2 are mixed, deterioration of the film quality and in-plane non-uniformity of the film thickness of the formed film can be suppressed.

Thus, when the coating liquid X which elapsed more than 5 min. after mixing of the TEOS and the solvent such as ethanol solution or the like is employed, fluctuation of the film thickness or film quality of the coated film occurs, though the mechanism being not clarified, the inventors assume as follows. That is, the coating liquid X is a mixture of the TEOS and the solvent. When the TEOS and the solvent are mixed, hydrolysis and polymerization of the TEOS occur. When a certain time period elapsed after mixing, the colloids grow too much and deviate from the appropriate colloidal state to obtain the best film quality. As the result, fluctuation in the thickness or the film quality of the coated film are considered to occur.

Here, whereas TEOS is difficult to dissolve in water but it is soluble in alcohol, accordingly the hydrolysis or the polymerization of TEOS is construed to occur after elapse of a certain time period after dissolution of the TEOS, water and hydrochloric acid into the ethanol solution. It is considered that it occurs when the time period of more than 6 min. had elapsed after the ethanol solution and the other components were mixed, for instance.

Therefore, like example 7, by separating the components of the coating liquid X into an ethanol solution (the second liquid) and the other components (the first liquid), and by forming the film while employing the coating liquid X of within 6 min. after mixing of these, the coating liquid X can be employed before the colloids grow too much. As the result, it is considered that deterioration of the film quality of the coated film can be suppressed.

Further, as in example 7, after forming films on the predetermined pieces of wafers W with a coating liquid X of within 5 min. after mixing of the first and the second liquids S1, S2, before coating the coating liquid X on the next wafer W, the mixing portion 462 and the flow path of the down stream side of the mixing portion 462 are cleaned. Thereby, in the flow path, there does not remain the old coating liquid which elapsed more than 5 min. after mixing. Therefore, when the subsequent wafer W is processed, there is no chance of the old coating liquid X being dispensed on the wafer W, accordingly the film quality of the coated film is prevented from deteriorating.

Further, if alcohol such as an ethanol solution or the like is employed as the organic solvent in this case, as mentioned above, TEOS, water, and hydrochloric acid dissolve in the ethanol solution. Therefore, since the respective components of the coating liquid X existing in the flow path are dissolved in the ethanol solution, cleaning of the flow path can be readily carried out. Further, like example 7, by transferring the first and the second liquids S1, S2 respectively from the separate reserving tanks 463, 464 into the mixing portion 462 by pumps P1, P2, the mixing ratio of the first and the second liquids S1, S2 can be advantageously varied with ease.

Thus, according to the example 7, since the hydrolysis and polymerization of the coating liquid X dispensed on the surface of the wafer W can be suppressed, deterioration of the film quality of the coated film due to decomposition of the coating liquid X can be suppressed. As the result, excellent thin films such as interlayer insulating films can be formed.

In the above described example 7, instead of disposition of the first and the second reserving tanks 463, 464 or the mixing portion 462, on another place the first and the second liquids S1, S2 are mixed. Then, within 6 min. after the preparation of the mixed liquid (coating liquid X), the coating liquid may be coated on the surface of the wafer W. Further, vapor of ethylene glycol is dispensed inside the fixed cup 440, after the inside of the cup 440 is filled by the vapor, the coating liquid X may be dispensed. In this case, there is an effect that vaporization of the solvent of the coating liquid X can be suppressed.

In the aforementioned method of forming films of the fifth invention, the replacement treatment of the aforementioned solvent is not necessarily required. That is, by carrying out gelling treatment after formation of a coated film, a thin film such as an interlayer insulating film may be formed.

According to the fifth invention, the first liquid containing particles or colloids of a starting material of a film component and water and the second liquid consisting of an organic solvent capable of dissolving water and the film component are mixed, the mixture of the liquids is coated on the surface of the substrate within 6 min. after preparation to form a coated film. Thereby, deterioration of the film quality can be suppressed. As the result, an excellent thin film such as an interlayer insulating film can be obtained.

Incidentally, in the example 7, based on empirical facts or experiments, the film quality deterioration time period is set at 6 min., however, the film quality deterioration time period varies depending on chemicals or solvents to be employed, treatment conditions or the like.

Therefore, in the case of the conditions being different from the example 7, the appropriate value of the film quality deterioration time period is determined each time by experiment or the like. Thus, corresponding to the respective conditions, the film quality deterioration time periods are determined. Therefore, in the fifth invention, the film quality deterioration time period is not restricted to 6 min.

EXAMPLE 8

Next, example 8 involving the sixth invention of the present application will be described.

FIG. 1 is a plan view showing an apparatus involving Example 8.

FIG. 2A through FIG. 2D are diagrams showing schematically the respective steps of a method of forming a film involving example 8.

In FIG. 2A through FIG. 2D, the flow of treatment of forming a film is schematically shown in order. An wafer W prior to the treatment and taken out by a main arm 13 from the inside of a cassette C of a cassette stage CS is accommodated in a coating unit 2. Then, in a state where the inside of the coating unit 2 is filled by a vapor of solvent, a coating liquid T is dripped on the surface of the wafer W (cf. FIG. 2A). The coating liquid employed here is one in which colloids or particles of TEOS which is a metal alkoxide are dispersed in a solvent containing organic solvents such as ethylene glycol and ethyl alcohol and further containing water and a trace of hydrochloric acid. Because of low vapor pressure of ethylene glycol, it remains in the film as the solvent even after vaporization of ethyl alcohol, to work for suppressing shrinkage of the film.

Subsequently, when the wafer W is rotated with high speed in a state where the inside of the coating unit 2 is filled by the vapor of the solvent, the coating liquid in which sol of TEOS is dispersed in the solvent is spread over the surface of the wafer W to form a film F (FIG. 2B).

Next, the wafer W is placed on the stage 31 of the aging unit 3 and is sealed by the cover 33. Then, under normal temperature, into the aging unit 3, a treatment gas for enhancing gelling of the coated film is introduced to gel the film (FIG. 2C). The treatment gas is an ammonia gas including water vapor.

Subsequently, in the solvent replacement unit 4, with ethyl alcohol, HMDS (hexamethyl disilane) and heptane, solvent replacement of the gelled film is carried out (FIG. 2D). Thereby, moisture in the coated film is replaced by ethyl alcohol. Further, OH groups in the coated film are removed by HMDS. Further, the solvent in the coated film is replaced by heptane. Incidentally, the reason why heptane is employed is to prevent the reticular structure of TEOS from collapsing by decreasing the force put on the porous structure, that is, the reticular structure of TEOS through employment of solvent of small surface tension. Thereafter, the wafer W is treated at the bake unit for 1 min., for instance. Thus, on the surface of the wafer W, an interlayer insulating film consisting of a silicon oxide film is formed.

Figure 32:
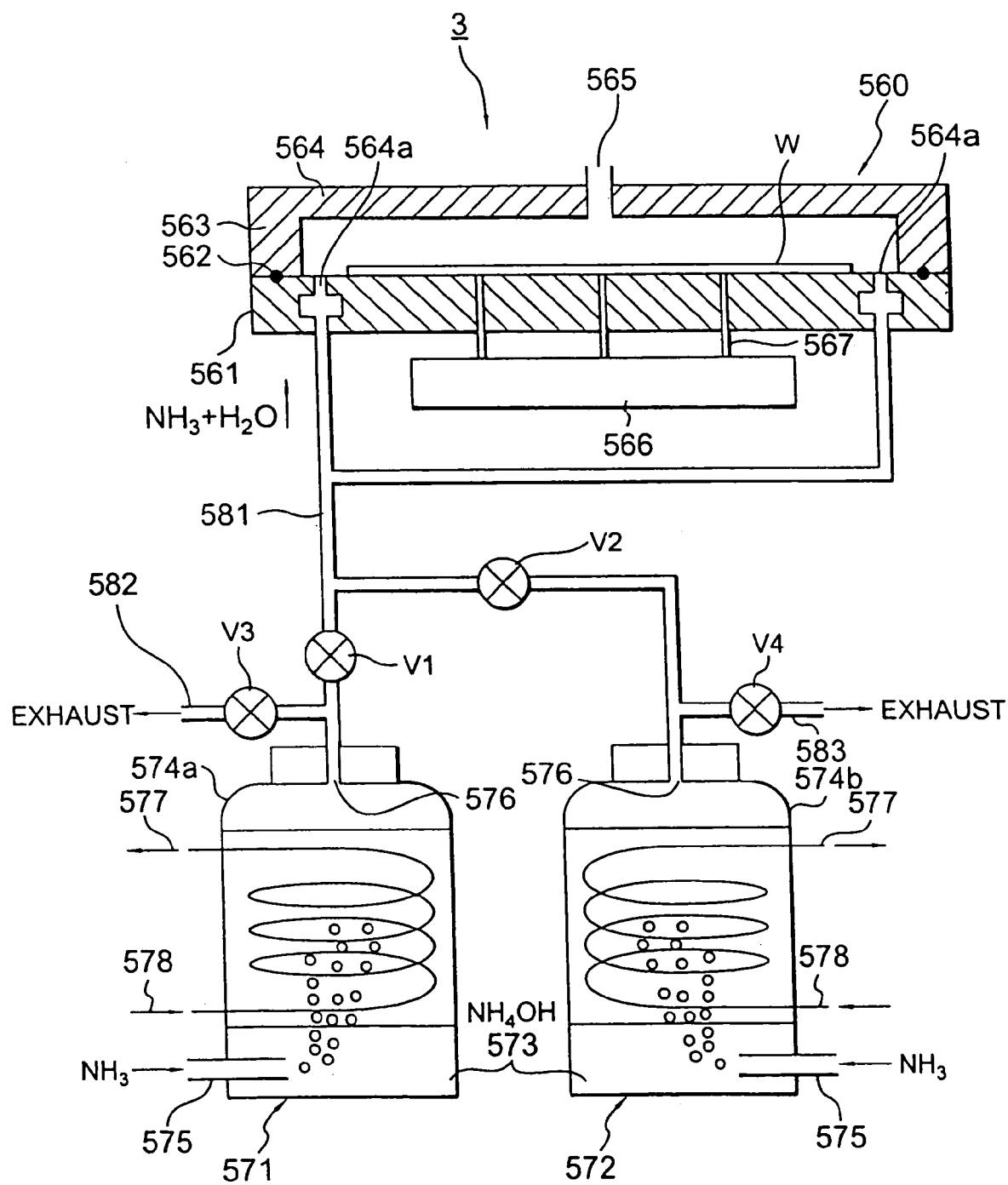
FIG. 32 is a diagram showing diagrammatically one example of an aging unit in the apparatus of forming a film employed upon practicing of the method of the sixth invention.

FIG. 32 is a diagram diagrammatically showing one example of the aforementioned aging unit 3. As shown in FIG. 32, this aging unit 3 comprises a stage 561 thereon the wafer W is placed, a cover 563 sealing the space above the stage 561 together with it, and an exhaust path 565 having an opening in the center portion of the cover 563.

The cover 563 is intimately connected to the circumference portion of the stage 561 through a sealing member 562, and constitutes the treatment chamber 560 together with the stage 561.

And, along the outside of the brim of the wafer W placed on the stage 561, a plurality of or slit like gas intakes 564 are opened. Further, on the bottom surface of the aging unit 3, 3 pieces, for instance, of pins 567 capable of going up and down are disposed to be capable of freely appearing and disappearing. These pins 567 capable of going up and down are driven up and down between the stage 561 and the above position thereof by a driving source 566 for going up and down the wafer W.

The gas intake 564a is connected to a treatment gas dispensing pipe 581. This dispensing pipe 581 is branched at the midway, the branched pipes are connected to the first gas generating source 571 and the second gas generating source 572 through switching valves V1 and V2, respectively. The first gas generating source 571 and the second gas generating source 572 are constituted in the identical manner.

These first gas generating source 571 and second gas generating source 572 comprise a tank 574a reserving commercial ammonia water ($NH_4OH$) (ammonia concentration: 30% by weight at normal temperature) 573, a bubbling gas feeding pipe 575 for carrying out bubbling by introducing an ammonia gas into the ammonia water 573 in the tank 574b, an exhaust takeout 576 exhausting the treatment gas generated by bubbling, and a means 577 for maintaining the temperature of the ammonia water 573 at a constant temperature for instance at the normal temperature. Incidentally, the tanks 574a, 574b corresponds respectively to the first chamber and the second chamber in claim 37.

The means for keeping a constant temperature is not restricted in particular. As shown schematically in FIG. 32, for instance, the tank 574 can be constituted by winding spiral a pipe 578 which is a circulating path of water. In this case, the pipe 578 is connected to a circulating device of water not shown in the figure and water adjusted to the normal temperature is flowed all the time. Thereby, the temperature of the ammonia water 573 reserved in the tank 574 is always maintained at the normal temperature.

The treatment gas feeding pipe 581 is branched, between the first gas generating source 571 and the valve V1, and between the second gas generating source 572 and the valve V2, respectively, into bypasses 582, 583 proceeding to the exhaust paths through switching valves V3, V4.

Next, operation of the aging unit 6 of the aforementioned configuration will be described. The ammonia water in the first and the second gas generating sources 571, 572 is maintained at the normal temperature in advance by circulating the temperature controlled water. Now, in the first gas generating source 571, bubbling of ammonia gas is being carried out and the ammonia gas 573 of the first gas generating source 571 has already reached the saturated concentration of ammonia (approximately 33% by weight). Thereby, the treatment gas consisting of ammonia gas containing water vapor (considered to be in a nearly saturated state) is generated and is exhausted through valve V3. During this, the switching valve V2 on the second gas generating source 572 side is closed.

Then, the wafer W is carried into the treatment chamber 560 from the coating unit 2, thereafter treatment is carried out for the predetermined time period. During the treatment, the switching valve V1 on the first gas generating source 571 side is opened, and the valve V3 to the exhaust side is closed, and the treatment gas is dispensed from the first gas generating source 571 to the inside of the treatment chamber 560 (the first treatment step).

In the case of the ammonia water in the first gas generating source 571 decreasing and the ammonia water being replenished thereto, by letting start bubbling of the ammonia gas in advance at a predetermined timing even at the second gas generating source 572, the ammonia water 573 is made to reach the saturated concentration of ammonia and to generate ammonia gas containing water vapor. During this, on the second gas generating source side 572, the switching valve V2 is kept closed, and by opening the valve V4 to the exhaust side, the generated gas is released directly to the exhaust path through the bypass 583 from the second gas generating source 572 (preparatory exhaust step).

In this state, the valve V1 which is on the first gas generating source 571 side and was being opened is closed to stop feeding of the treatment gas to the treatment chamber 560 from the first gas generating source 571. At the same time, the valve V2 which is on the second gas generating source 572 side and was being closed is opened to feed the treatment gas to the treatment chamber 560 from the second gas generating source 572. In this time, at the same time with switching of valves V1, V2, the valve V3 which is on the first gas generating source 571 side and was being closed is opened. Thereby, the gas generated at the first gas generating source 571 is made to be released to the exhaust path. At the same time with this, the valve V4 which is on the second gas generating source 572 side and was being opened is closed (the second treatment step).

Thereafter, the ammonia water is replenished to the first gas generating source 571 to let generate the ammonia gas containing water vapor from the ammonia water which reached the saturated concentration of ammonia by bubbling of ammonia gas. On the other hand, in the case of the ammonia water in the second gas generating source 572 decreasing and the ammonia water being replenished thereto, by letting bubbling going on at the first gas generating source 571, similarly the treatment gas feeder is again switched from the second gas generating source 572 to the first gas generating source 571.

Here, the timing of starting bubbling at the second gas generating source 572 during replenishment of the ammonia water to the first gas generating source 571 is such a timing at which, when the ammonia water is replenished to the first gas generating source 572, a state, where the ammonia gas containing water vapor is generated at the second gas generating source 572, is attained. Such a timing or the timing when the ammonia water at the first and the second gas generating sources 571, 572 is replenished may be determined by an operator. Or, by disposing water level sensors to the respective gas generating sources 571, 572, thereby the water level of the ammonia water may be automatically detected, to determine the appropriate timing.

Further, the switching valves V1, V2, V3, and V4 may be designed to be manually switched by an operator. Or, a controller for controlling switching of these may be disposed to switch automatically according to the predetermined timings.

Figure 33:
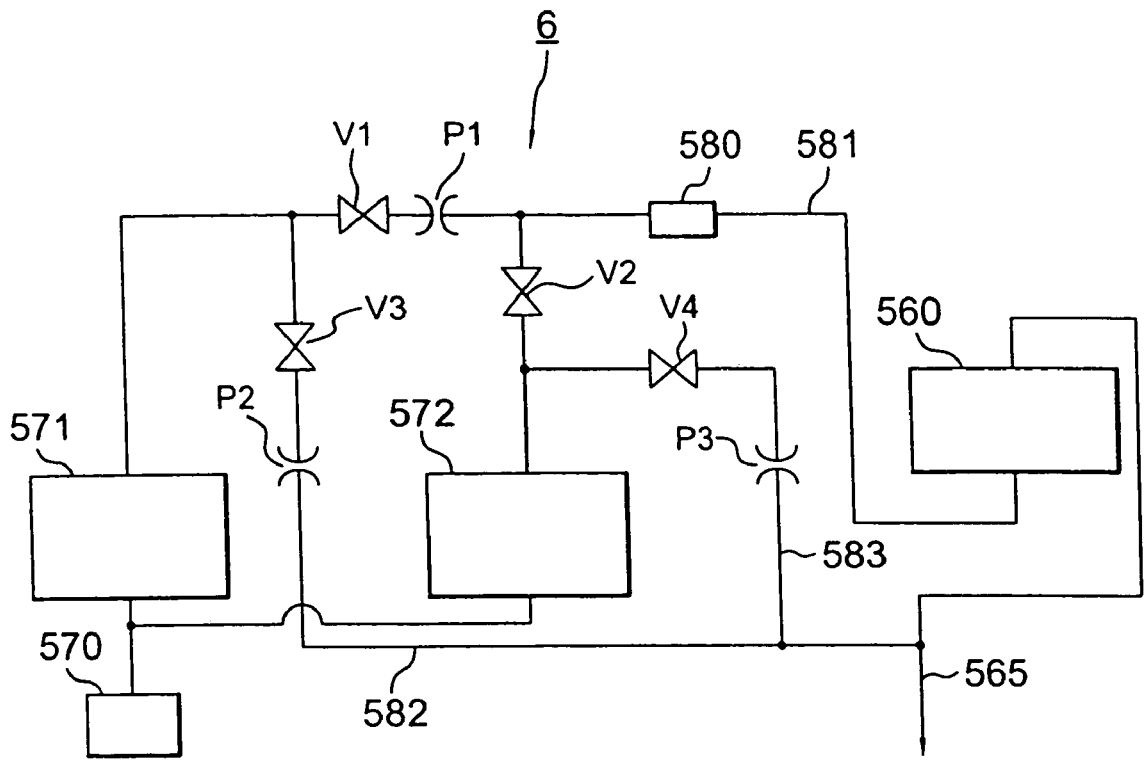
FIG. 33 is a diagram showing diagrammatically one example of path of gas flow in the aging unit shown in FIG. 32.

FIG. 33 is a diagram showing diagrammatically one example of a gas flow path in the aging unit 3 of configuration shown in FIG. 32. In this example, ammonia gas is fed to the first and the second gas generating sources from a common gas feeding source 570. And as shown in FIG. 33, between the valve V1 and the branching point of the treatment gas feeding pipe 581, a conductance control portion P1 is disposed. This conductance control portion P1 is disposed so as to match the conductance from the first gas generating source 571 to the treatment chamber 560 to the conductance from the second gas generating source 572 to the treatment chamber 560. This conductance control portion P1 is provided with a structure by which the cross section of the gas flow path, that is, resistance of gas flow can be controlled. Specific control of the conductance is carried out such that, by use of a flow meter 580 disposed at the gas feeding pipe 581, the flow rate when the gas is flowed from the first gas generating source 571 and that when the gas is flowed from the second gas generating source are made equal. Incidentally, the conductance control portion P1 may be disposed, instead of at the aforementioned position, at positions between from the valve V2 to the aforementioned branching point, or may be disposed on both positions.

In addition, even on the first bypass (the first exhaust path) 582 reaching directly to the exhaust path 565 from the first gas generating source 571 without through the treatment chamber 560 but through the valve V3, a conductance controlling portion P2 is disposed. The conductance of this conductance controlling portion P2 is set the conductance of the whole gas flow path from the first gas generating source 571 through the valve V3 on the exhaust side, the conductance controlling portion P2, and the first bypass 582 to the exhaust path 565, to be equal with the conductance of the whole gas flow path from the first gas generating source 571 through the valve V1 on the treatment chamber side and the treatment chamber 560 to the exhaust path 565.

Further, even on the second bypass (the second exhaust path) 583 from the second gas generating source 572 without through the treatment chamber 560 but through the valve V4 directly to the exhaust path 565, the conductance controlling portion P3 is disposed. The conductance of this conductance controlling portion P3 is set the conductance of the whole gas flow path from the second gas generating source 572 through the valve V4 on the exhaust side, and the second bypass 583 to the exhaust path 565 to be equal with that of the whole gas flow path from the second gas generating source through the valve V2 on the treatment chamber 560 side and the treatment chamber 560 to the exhaust path 565.

By controlling the conductance of the gas flow path like this, when, while letting gas flow from the first gas generating source 571 to the bypass 582 for instance, an wafer is introduced into the treatment chamber 560 and the gas flow path is switched to the treatment chamber 560 side, or when the feeding source of the treatment gas to the treatment chamber 560 is switched between the first gas generating source 571 and the second gas generating source 572, the fluctuation of the flow rate of the treatment gas and the pressure inside the treatment chamber 560 can be suppressed. For instance, provided that the first gas generating source 571 is switched to the second gas generating source 572, the gas flow from the first gas generating source 571 to the treatment chamber 560 is stopped, and at the same time, the gas flow from the second gas generating source 572 to the bypass 583 is switched to the valve V2 side. In this case, as mentioned above, since the conductances of the respective flow paths were made equal, the pressure and flow rate of the gas flowing into the treatment chamber 560, though being varied a little due to switching of the valve, hardly show fluctuation. This situation is identical when the source of the treatment gas is returned from the second gas generating source 572 to the first gas generating source 571.

According to the aforementioned example 8, simultaneously with the first treatment step where an wafer W is treated by feeding an ammonia gas containing water vapor from the first gas generating source 571 to the inside of the treatment chamber 560, even at the second gas generating source 572, by letting the ammonia gas containing water vapor generate, preparatory exhaust step of releasing the ammonia gas containing water vapor directly to the exhaust path 565 through the bypass 583 is carried out, and when the ammonia water is replenished to the first gas generating source 571, the feeding source of the treatment gas to the treatment chamber 560 is switched from the first gas generating source 571 to the second gas generating source 572, thereby the second treatment step of treating the wafer W is carried out, accordingly upon replenishing the ammonia water feeding of the treatment gas is not interrupted.

Further, according to the aforementioned example 8, since the ammonia water 573 in the first and the second gas generating sources 571, 572 is always being held at the normal temperature by the temperature controlling water, the temperature fluctuation due to vaporization and absorption of ammonia can be suppressed, thereby fluctuation of water vapor is suppressed, resulting in stabilization of the process. In the case of ammonia water particularly, since a slight temperature variation induces a large variation of the saturated concentration, the generating amount of the gas is considered to fluctuate due to the external temperature disturbance. However, according to example 8, the flow rate of the ammonia gas can be stabilized.

Further, upon introducing the ammonia gas after carrying in an wafer W into the treatment chamber 560, since the conductance of the each gas flow path of the bypass 582 side and the treatment chamber 560 side is equal each other, upon switching the valves V1 and V3, the ammonia gas is introduced from the beginning with the predetermined pressure and flow rate. Further, even when the first gas generating source and the second gas generating source 571, 572 are switched, the pressure and the flow rate of the ammonia gas do hardly fluctuate, accordingly the gelling treatment can be carried out with stability. As the result, the film thickness and film quality of the coated films can be suppressed from fluctuating, uniform treatment between the wafers can be carried out. Further, since the ammonia water can be replenished without interrupting operation each time, thereby lowering of throughput can be prevented from occurring.

In the aforementioned sixth invention, various variations can be applicable. The temperature control means 577, for instance, can maintain the ammonia water 573 in the tank 574 at the normal temperature by winding the tank 574 of the first gas generating source 571 and the second gas generating source 572 by a heater of resistance heating or the like, or by employing an immersion heater. Further, the valves V1 and V2 can be substituted by a single 3-way valve.

Figure 34:
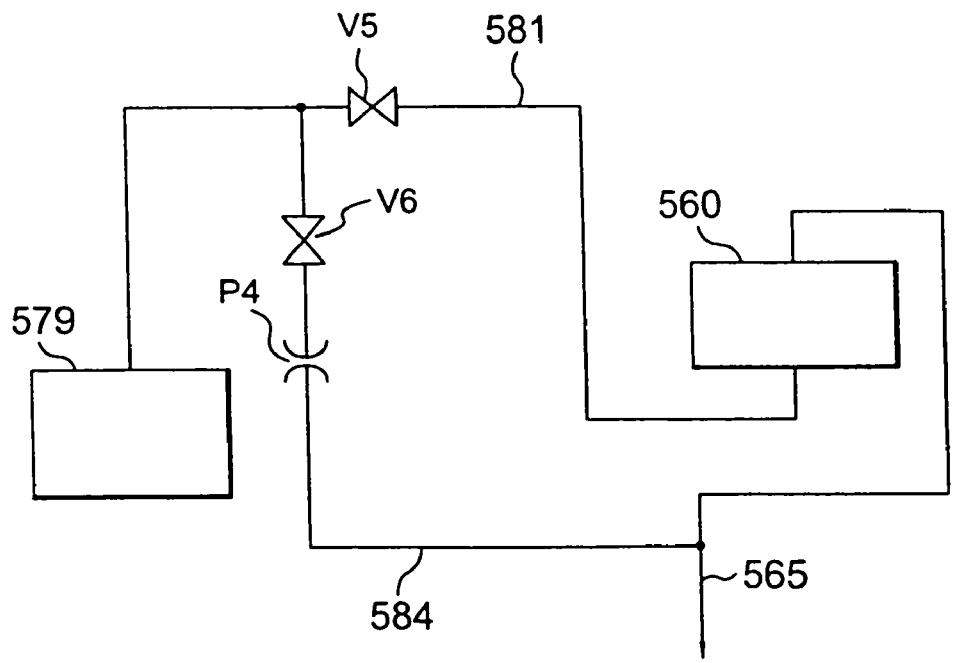
FIG. 34 is a diagram showing diagrammatically another example of path of gas flow in an aging unit.
Figure 35:
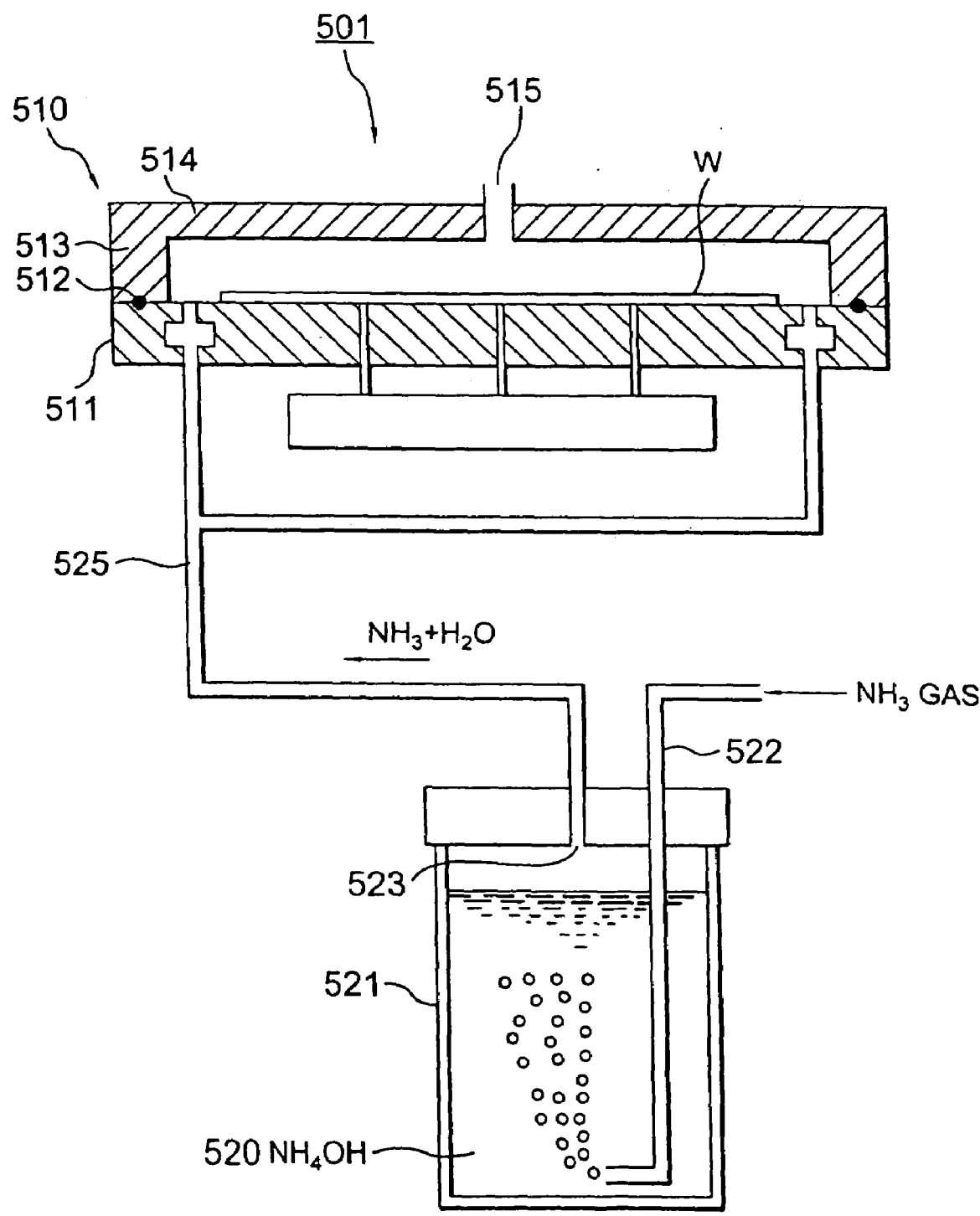
FIG. 35 is a diagram showing diagrammatically a conventional aging unit.

Further, the sixth invention, as shown in FIG. 34, can be a configuration in which a single gas generating source 579 generating an ammonia gas saturated by water vapor is connected to the treatment chamber 560. The gas generating source 579 can be constituted as identical as the first gas generating source 571 or the second gas generating source 572 shown in FIG. 33. In this example, a switching valve V5 is disposed at the midway of the treatment gas feeding pipe 581 which communicates and connects the gas generating source 579 and the treatment chamber 560. And, a bypass 584 is disposed branched between the valve V5 and the gas generating source 579. This bypass 584 is communicated and connected to the exhaust path 565 through the switching valve V6 and the conductance control portion P4. By conductance control portion P4, the conductance of the flow path through the treatment chamber 560 and that of the flow path through the bypass 584 are made equal.

According to the example shown in FIG. 34, after replenishment of the ammonia water, the preparatory exhaust step of releasing directly to the exhaust path 565 through the bypass 584 is carried out until the concentration of the ammonia water is stabilized at the predetermined concentration, and when subsequently the flow path is switched to the treatment chamber 560 side, since the conductance of the flow path before and after switching are equal, the ammonia gas can be fed with the predetermined flow rate into the treatment chamber 560 from the beginning, therefore, the stable gelling treatment can be carried out. In order to carry out treatment step of treating the wafer W by feeding the ammonia gas saturated by water vapor into the treatment chamber 560 by switching the valve V5 and the valve V6 to open state and closed state, respectively, with stability, the ammonia gas containing water vapor can be always introduced into the treatment chamber 560. Further, since, through the temperature control of the ammonia water of the gas generating source 579 and the conductance control of the gas flow path, the treatment temperature, the flow rate of the treatment gas and the pressure in the treatment chamber 560 can be held at the constant values, uniform treatment can be carried out between the wafers, thereby the fluctuation of the film quality between the wafers can be suppressed.

Incidentally, the subject to be treated is not restricted to the wafer, but can be a glass substrate for liquid display device. Further, the sixth invention is not restricted to the case of gelling by use of the ammonia gas. It can be applied to a device in which, for instance, while exhausting the treatment gas from the bypass, the subject to be treated is carried into the treatment chamber, thereafter by switching the flow path from the bypass to the treatment chamber side, the treatment gas is introduced.

Further, in the aforementioned example 8, by disposing 2 tanks 574 of ammonia, the ammonia gas generated therefrom is switched in turn, but 3 and more of tanks 574 can be disposed. In that case, while shifting the timings generating ammonia from the respective tanks 574, by switching 3 tanks 574 and the feeding pipe 581 in turn, the ammonia gas can be flowed always at a constant flow rate.

As shown in the above, according to the sixth invention, in the case of treatment being carried out by introducing the treatment gas into the treatment chamber, the stable treatment can be carried out.

EXAMPLE 9

Next, example 9 involving the seventh invention of the present-application will be described.

Figure 36:
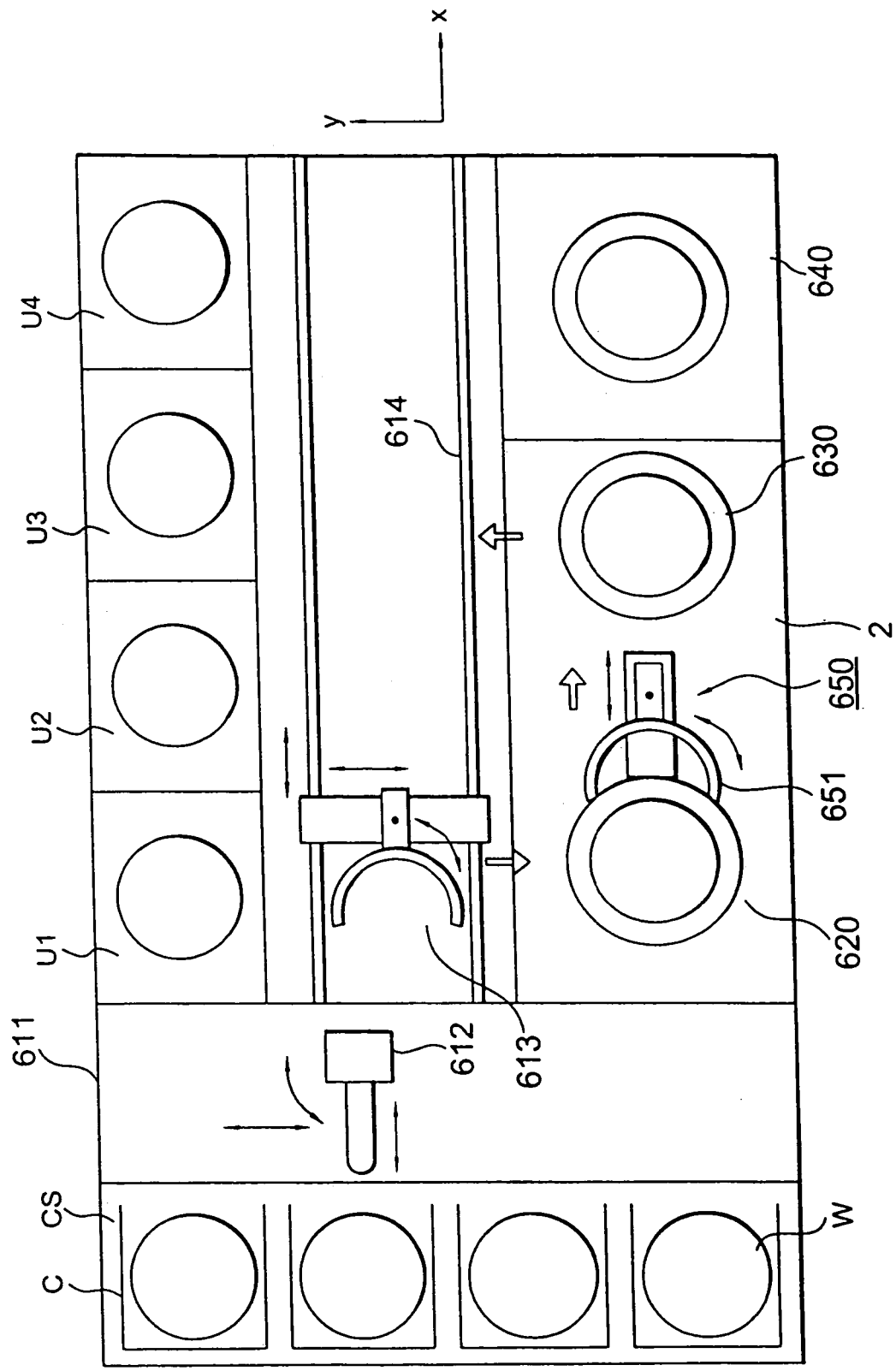
FIG. 36 is a plan view showing one example of one embodiment of an apparatus of forming a film of the seventh invention.

FIG. 36 is a plan view showing diagrammatically the whole configuration of the apparatus of forming a film of example 7 involving the seventh invention of the present application.

In the figure, reference numeral 611 denotes an input/output port of wafers W which are substrates, reference numeral 612 denotes a carrying arm constituting a receiving portion, and reference numeral 613 denotes a main arm constituting a main carrying portion. On one side of a carrying way (guide rail) 614 of the main arm 613, a coating/aging unit 620 provided with a coating unit 620 which is a coating portion and an aging unit 630 which is a gelling treatment portion, and a solvent replacement unit 640 which is a solvent replacement portion are arranged in this order.

Further, also on the other side of the carrying way 614, the treatment units U1 through U4 are arranged.

To these treatment units U1 through U4, the units for carrying out hydrophobic treatment, cooling treatment and heat treatment (bake treatment) are respectively assigned. In this example 9, the unit for carrying out the hydrophobic treatment and the cooling treatment corresponds to the pre-treatment portion for carrying out the treatment preceding the coating of the coating liquid on the wafer W. Further, the unit for carrying out the heat treatment corresponds to the heating portion for drying the wafer W treated at the aging unit 630.

The carrying arm 612 and the main arm 613 are constituted to be capable of moving freely in the X direction and in the Y direction, and to be capable of rotating freely. An wafer W is taken out of a cassette C disposed on a cassette stage CS by the carrying arm 612 and is delivered to the main arm 613. Further, the wafer W is sequentially carried by the main arm 613 to the respective units 620, 640, and U1 through U4.

Figure 37:
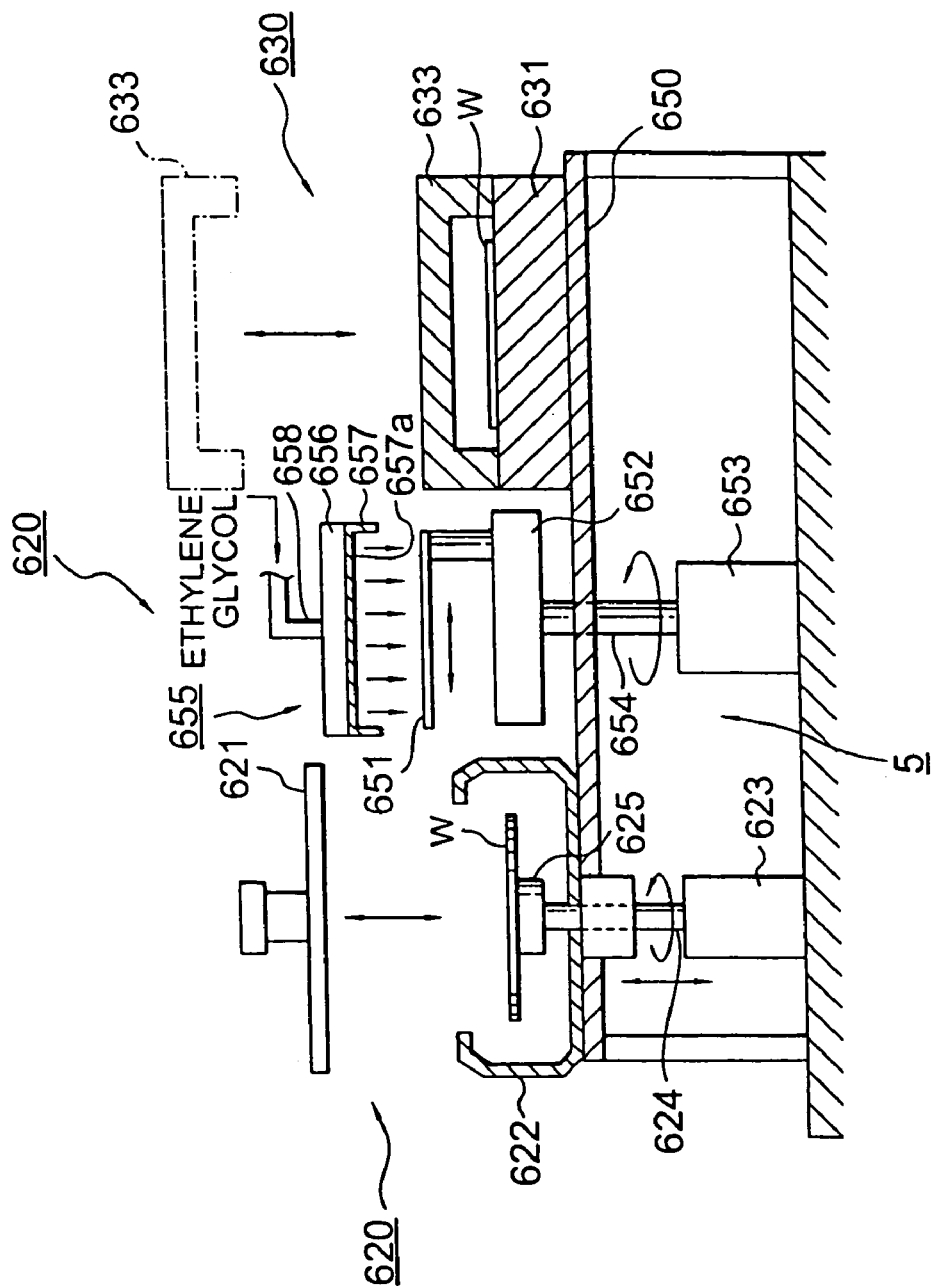
FIG. 37 is a cross-sectional view showing one example of a coating/aging unit of the apparatus of forming a film.

Subsequently, the coating/aging unit 620 will be described with reference to FIG. 37 through FIG. 39. To this coating/aging unit 620, as shown in FIG. 37, a coating unit 620 and an aging unit 630, for instance, are disposed adjacent thereto.

First, the coating unit 620 will be described with reference to FIG. 38. The coating unit 620 comprises a fixed cup 622 for accommodating an wafer W, a cover 621 opening and closing an upper opening thereof, a vacuum chuck 625 disposed to be capable of rotating in the fixed cup 622, and a coating liquid nozzle 626 for dispensing the coating liquid on the wafer W held on the vacuum chuck 625.

At the bottom portion of the fixed cup 622, a breakthrough is opened, therethrough a rotation axis 624 is inserted. The upper end of this rotation axis 624 is combined with the vacuum chuck 625, the lower end of the other rotation axis 624 is combined to a driving portion 623 disposed below the lower side of the fixed cup 622. Through this rotation axis 624, driving force of rotation is transmitted from the driving portion 623 to the vacuum chuck 625. Further, the rotation axis 624 is capable of going up and down in the up/down direction. The coating liquid nozzle 626 is disposed combined with the cover 621 and the coating liquid is dispensed on the central portion of the wafer W.

To the cup 622, a solvent vapor feeding pipe 627 for feeding the vapor of the solvent which is sent from the solvent vapor generating source 627*a* and is employed in the coating liquid is connected. To the cup 622, a drain pipe 628 and an exhaust pipe 629 are further connected.

Next, the aging unit 630 will be described with reference to FIG. 39. This aging unit 630 comprises a heating plate 631 consisting of ceramic, for instance, including a heater 631*a*, and a cover 633 disposed adjacent to the upper side of the heating plate 631 so as to form a space S, which constitutes a treatment chamber there, by partitioning the upper space of the heating plate 631.

The cover 633 is, in addition to being intimately connected to the brim portion of the heating plate 631 through a sealing member 632, free in contacting and detaching with respect to the heating plate 631.

On the upper surface of the heating plate 631, a groove like gas supply is formed such that surrounds the exterior circumference of the wafer W to be placed on the heating plate 631, the bottom portion of this gas supply is connected to the gas feeding path 634.

On the central portion of the cover 633, an intake for inhaling a gas is formed, and this intake is connected to an exhaust path 635 communicating with the exterior.

The bottom portion of the heating plate 631, 3 pieces of pins 636 for going up and down disposed to be capable of appearing and disappearing freely are provided. These pins 636 for going up and down goes up and down the wafer W between the heating plate 631 and the above position thereof. Incidentally, a heating means such as a heater is preferably disposed even to the cover 633.

These fixed cup 622 and aging unit 630 of the coating unit 620, as shown in FIG. 37, are disposed adjacent each other on a common level base stage 650. And, between these units 620 and 630 on the base stage 650, a sub-arm mechanism 5 constituting an auxiliary carrying portion is disposed.

This sub-arm mechanism 5 is exclusively used for carrying the wafer W treated at the coating unit 620 to the aging unit 630. For this, together with disposition of, for instance, a sub-arm 651 for holding a part of the circumference portion of the bottom surface of the wafer W, this sub-arm 651 is constituted to be capable of moving in the level direction (the X direction in FIG. 1) along a guide rail 652, in addition, the guide rail 652 itself is constituted to be capable of rotating in the level direction through a vertical rotation axis 654 by a driving portion 653. Thus, the sub-arm 651 is capable of reversing the direction between the coating unit 620 and the aging unit 630 for receiving the wafer W. At the same time, the sub-arm is capable of moving between an waiting position (the position shown by the solid line in FIG. 37) and a position receiving the wafer W from the coating unit 620, and between the waiting position and a position delivering the wafer W to the aging unit 630. Further, in this example, the guide rail 652 is disposed at the above side than the base stage 650.

Further, above the sub-arm 651, above the guide rail 652 of the carrying path of the wafer W between the coating unit 620 and the aging unit 630, a solvent vapor feeding portion 655 which is a means for feeding vapor of the solvent component which is employed in the coating liquid is disposed. This solvent vapor feeding portion 655 comprises a dispersing room 656 for dispersing the solvent vapor and a vapor diffusing plate 657. The dispersing room 656 is disposed so as to opposes the sub-arm 651 in the waiting position, and the diffusing plate 657 is attached to the bottom surface of the dispersing room 656 and has a structure in which a plurality of steam holes 657*a* are bored. To the dispersing room 656, a solvent vapor feeding pipe 658, for instance, for feeding the solvent vapor generated at a solvent vapor generating source, which is not shown in the figure, is connected.

Figure 40:
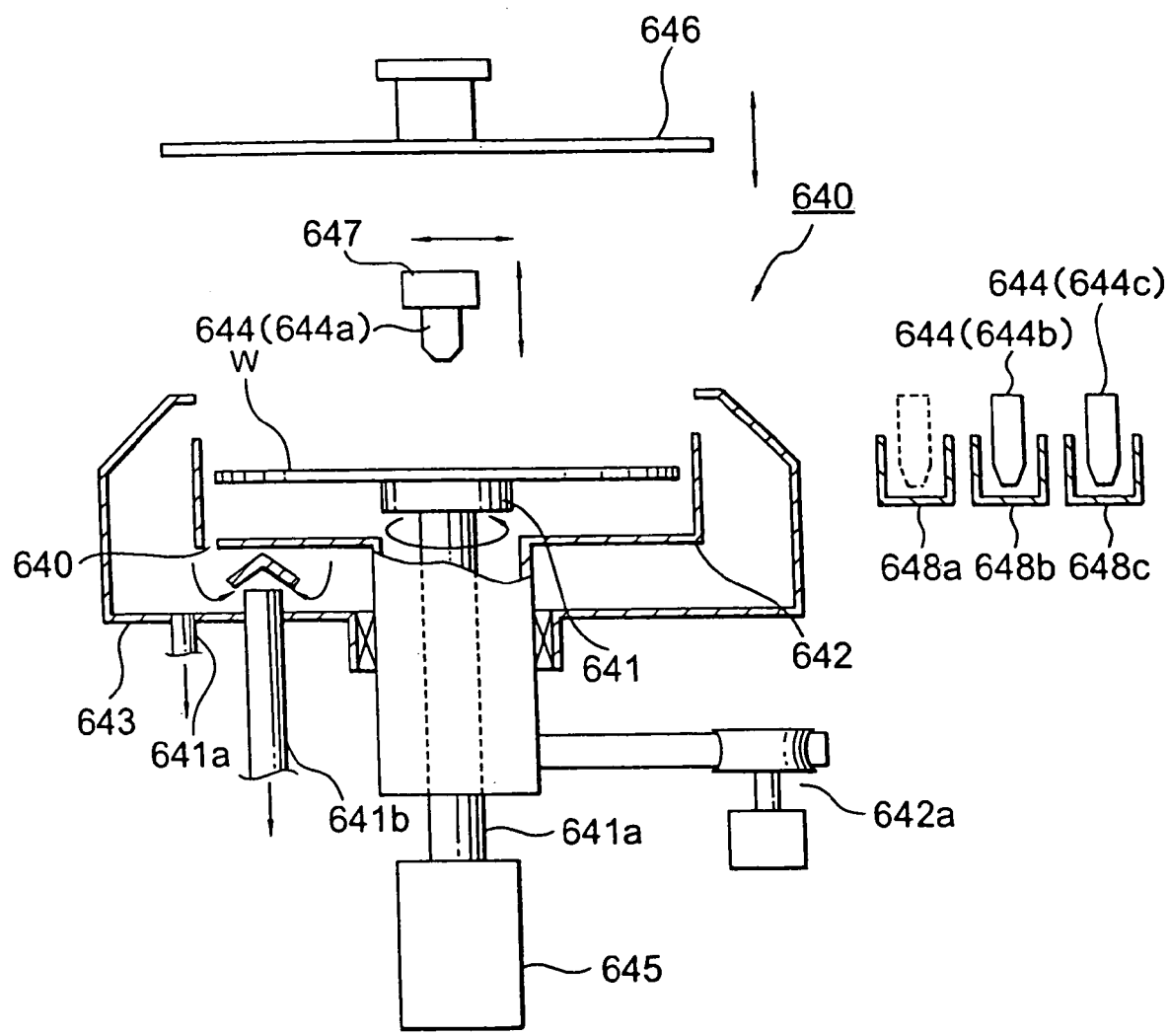
FIG. 40 is a cross-sectional view showing one example of a solvent replacement unit of the apparatus of forming a film.

Subsequently, the solvent replacement unit 640 will be described with reference to FIG. 40.

This unit 640 comprises a vacuum chuck 641 rotating the wafer W while holding it in level, a rotary cup 642 which is disposed to surround the wafer W on this chuck 641 and has a hole 640 for exhausting liquid, a fixed cup 643 which is disposed outside the rotary cup 642 and in which an waste liquid path 641*a* and an waste gas path 641*b* are connected, and a nozzle 644 for dispensing the solvent to the wafer W. Further, reference numeral 645 in the figure denotes a driving portion for rotating and going up and down the rotation axis 641*a* of the chuck 641, and reference numeral 642*a* denotes a driving portion for rotating the rotary cup 640.

The opening on the upper surface of the fixed cup 643 is opened and closed by a cover 646 capable of going up and down. Further, as the nozzle 644 in this example, 3 pieces of nozzles 644*a*, 644*b*, and 644*c* for ejecting ethanol, HMDS (hexamethyl disilane) and heptane, respectively, are prepared. These nozzles 644*a*, 644*b*, and 644*c* are grasped and taken out of the nozzle receiving portions 648*a*, 648*b*, and 648*c*, respectively, and are transferred to the above of the central portion of the wafer W.

In this apparatus of forming a film, the wafer W undergone the hydrophobic treatment and the cooling treatment is carried in turn to the coating/aging unit 620, the solvent replacement unit 640, and the unit for carrying out bake treatment, and by carrying out the predetermined treatment at the respective units, an interlayer insulating film consisting of a silicon oxide film is formed on the surface of the wafer W.

Subsequently, the treatments carried out at the coating/aging unit 620 and the solvent replacement unit will be described. First, at the coating/aging unit 620, the coating liquid is coated on the surface of the wafer W at the coating unit 620 to form a coated film. Thereafter, the wafer W is carried to the aging unit 630 by the sub-arm 651. Then, the particles or the colloids of the coated film formed on the wafer W at the unit 630 are gelled.

Figure 38:
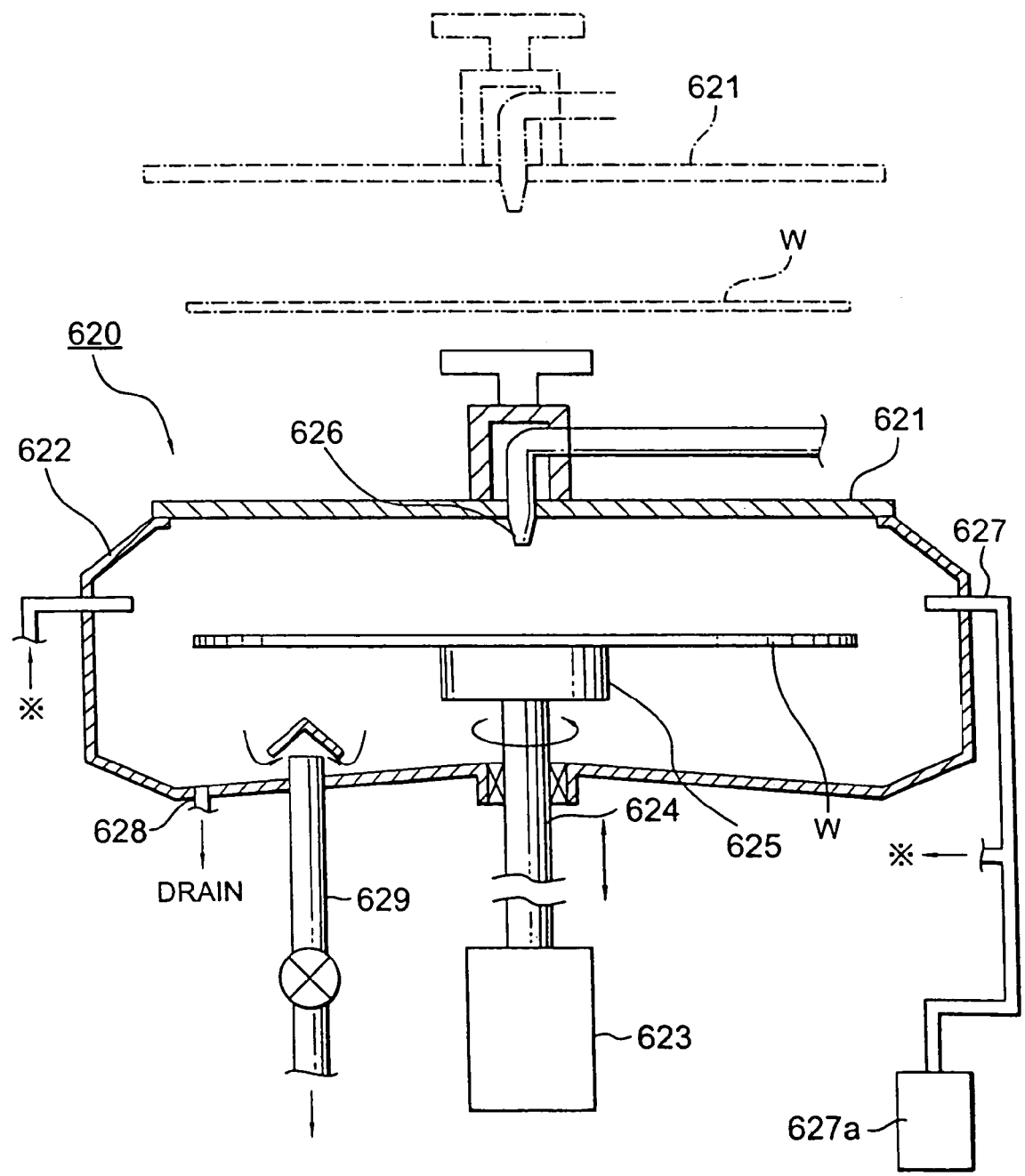
FIG. 38 is a cross-sectional view showing one example of the coating unit of the coating/aging unit.
Figure 39:
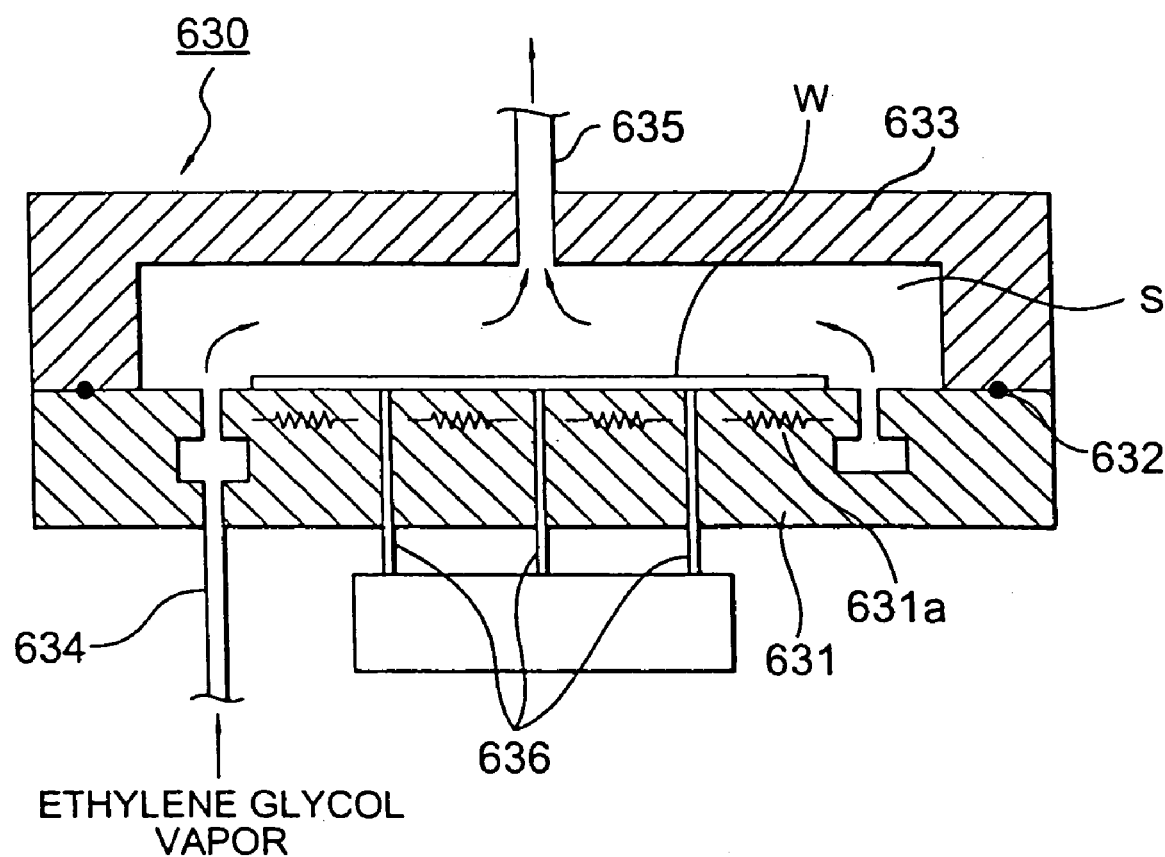
FIG. 39 is a cross-sectional view showing one example of the aging unit of the coating/aging unit.

In specific, at the coating unit 620, the wafer W carried to the coating unit 620 by the main arm 613 is delivered to the chuck 625 at the position of the dotted line in FIG. 38 for instance, after the chuck 625 is lowered, the cup 622 is sealed by the cover 621. The coating liquid used here can be prepared by dispersing the colloids or particles of TEOS which is a metal alkoxide in the solvent which contains organic solvent such as ethylene glycol and ethyl alcohol, water and a trace of hydrochloric acid. Ethylene glycol plays, other than the role of, upon coating, adjusting the viscosity of the coating liquid to an appropriate value, another role of suppressing vaporization of ethyl alcohol by remaining there as the solvent because, at the steps after the coating step, ethyl alcohol the vapor pressure of which is low vaporizes almost completely. This is based on the higher vapor pressure of ethylene glycol.

And, in this example, while exhausting from the exhaust pipe 629, the vapor of ethylene glycol is fed into the cup 622 from the solvent vapor feeding pipe 627. The exhausting is ceased after the inside of the cup 622 is filled by the vapor of ethylene glycol, and the coating liquid is fed on the central portion of the wafer W from the nozzle 626. Then, the wafer W is rotated by the chuck 625, the coating liquid is spread on the surface of the wafer W due to centrifugal force to form a film. The reason why the treatment is carried out in such a state where the inside of the cup 622 is filled by the vapor of ethylene glycol is to suppress the vaporization of the solvent in the coating liquid. Incidentally, though not shown in the figure, thereafter, the solvent is sprayed on the circumference portion of the wafer W from the nozzle in the cup 622 to remove the coated film of the circumference portion.

After the coating treatment is carried out thus at the coating unit 620, the wafer W is carried to the aging unit 630 by the sub-arm 651. First, in a state where the cover 621 is lifted a little for instance, the inside of the cup 622 is evacuated, after the cover 621 and the chuck 625 are raised, the wafer W is delivered from the chuck 625 to the sub-arm 651. That is, the solvent vapor such as that of ethylene glycol is fed on the guide rail 652 from the solvent vapor feeding portion 655, the direction of the sub-arm 651 is turned to the side of the coating unit 620, the sub-arm 651 is moved from the waiting position to the position where the wafer W is received from the coating unit 620, and the wafer W is delivered from the chuck 625 to the sub-arm 651.

Then, the cover 633 of the aging unit 630 is raised, the direction of the sub-arm 651 is turned to the side of the aging unit 630, the sub-arm 651 is moved to the position where the wafer W is delivered to the aging unit 630, by cooperation of the pins 636 for going up and down and the sub-arm 651, the wafer W is delivered from the sub-arm 651 on the heating plate 631.

Next, at the aging unit 630, the colloids of TEOS contained in the coated film on the wafer W is gelled, to link the colloids reticular. That is, at the aging unit 630, after the wafer W is placed on the heating plate 631, the cover 633 is closed, while evacuating from the exhaust path 635, the vapor of ethylene glycol for instance is introduced into the treatment chamber from the gas feeding path 634. Here, the wafer W is heated to the temperature of around 100° C., for instance.

The treatment of linking the colloids reticular by gelling the colloids of TEOS is expedited by heating the coated film, however, by employing an ammonia gas instead of heating, the ammonia gas is operated on TEOS as a catalyst, thereby the gelling may be expedited. Further, the reason why the vapor of ethylene glycol is introduced into the treatment chamber is to suppress the vaporization of the solvent in the coated film, therefore, the piping and the vapor generating source are controlled in their temperature such that the vapor is saturated (100% by the relative humidity of ethylene glycol) at the temperature of the treatment chamber, for instance.

Subsequently, the treatment carried out at the solvent replacement unit 640 will be described. The wafer W treated at the aging unit 630 is delivered from the heating plate 631 to the main arm 613, then is transferred to the solvent replacement unit 640 by this main arm 613. And, at this unit 640, a solvent other than the solvent of the coating liquid is fed, thereby the solvent in the coated film formed on the wafer W is replaced by the other solvent.

In specific, in a state where the cover 646 is open, at the above position of the fixed cup 643, the wafer W is delivered to the chuck 641 from the main arm 613, and the chuck 641 is lowered. Then, first, together with dripping chemicals in which moisture is soluble, for instance, ethanol on the approximately central portion of the wafer W from the nozzle 644*a*, the wafer W and the rotary cup 642 are rotated, thereby ethanol is diffused over the whole surface of the wafer W due to the centrifugal force. Thereby, ethanol dissolves in the moisture in the coated film, resulting in replacement of the moisture by ethanol.

Subsequently, the cover 646 is opened, similarly HMDS is dispensed on the approximate rotation center of the wafer W to remove OH groups in the coated film. Further, by dispensing heptane on the approximate rotation center of the wafer W, the solvent in the coated film is replaced by heptane. The reason why heptane is employed here is to prevent the reticular structure of TEOS from collapsing by reducing the force added on the porous structure, namely, reticular structure of TEOS through use of the solvent of low surface tension. Incidentally, the above example of the solvent replacement unit 640 is described of the jacketed cup structure consisting of the fixed cup 643 and the rotary cup 642, however, as identical as the coating unit 620, a structure with only a fixed cup may be employed.

In the aforementioned example 9, the coating unit 620 and the aging unit 630 are disposed adjacently inside the same unit 620, thereby the wafer W is transferred by an exclusive sub-arm 651 from the coating unit 620 to the aging unit 630. Therefore, the wafer W on which the coating treatment is carried out at the coating unit 620 is transferred without delay to the aging unit 630 without waiting transfer of the wafer W and is treated. Accordingly, since gelling treatment can be carried out in a state where the vaporization of the solvent in the coated film is suppressed, desired film thickness and film quality can be secured.

Further, the distance of the transfer path between the coating unit 620 and the aging unit 630 is short, accordingly the transfer time becomes short. Accordingly, vaporization of the solvent in the coated film during transfer can be reduced further more. Further, since the vapor of ethylene glycol is supplied on the transfer path, the vaporization of the solvent during transfer is further suppressed by this ethylene glycol.

When there is no sub-arm 651, transfer between the coating unit 620 and the aging unit 630 is carried out by the main arm 613. Therefore, even if the coating treatment is completed, in the case of the main arm 613 being employed for transfer between the other units, it is required to wait for the main arm 613. Further, since the main arm 613 moves along the guide rail 614 in the center, the transfer path between the coating unit 620 and the aging unit 630 becomes long, resulting in the longer transfer time. Therefore, since it takes a long time to transfer the wafer W from the coating unit 620 to the aging unit 630, the amount of vaporization of the solvent in the coated film is liable to increase.

Figure 41:
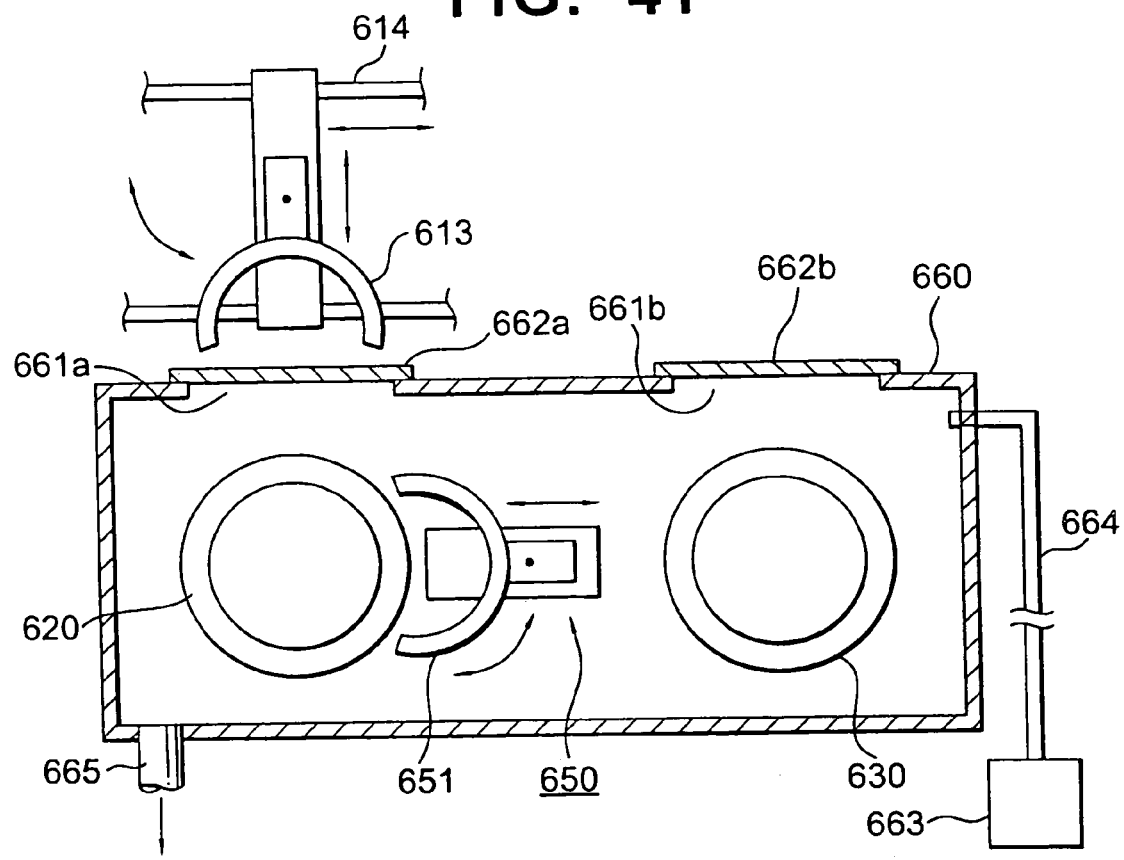
FIG. 41 is a plan view showing another example of a coating/aging unit.
Figure 42:
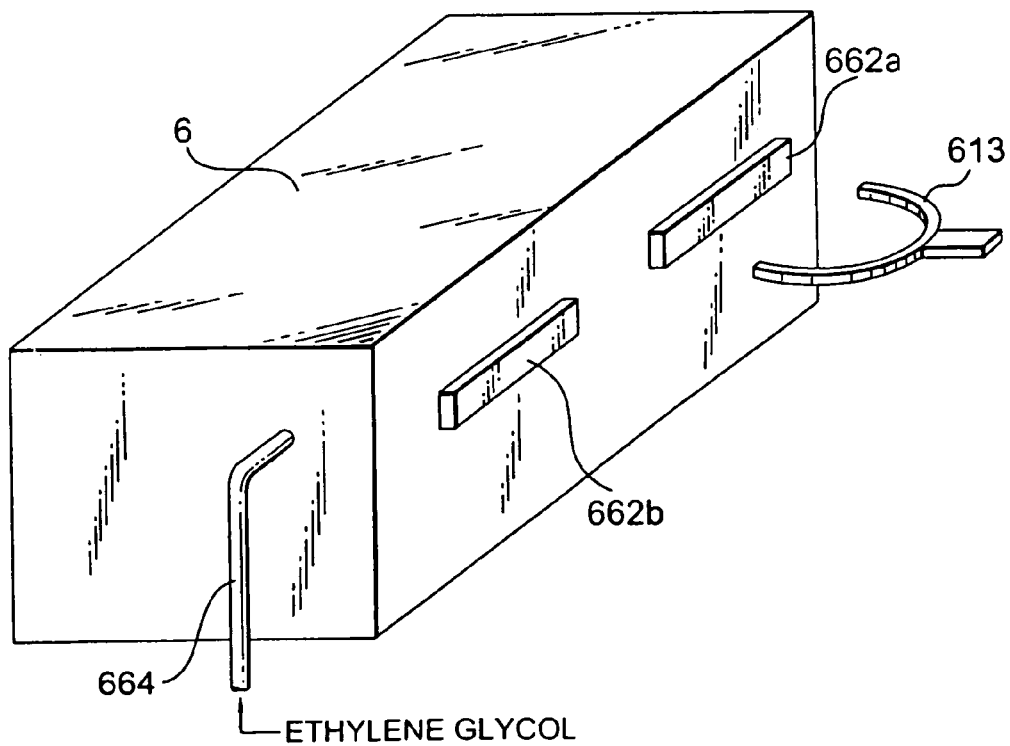
FIG. 42 is a perspective view showing another example of a coating/aging unit.

Subsequently, modification example of example 9 will be described with reference to FIG. 41 and FIG. 42. This example is characterized in that, together with covering the whole coating and aging unit 620 by the treatment chamber (case) 660, the inside of the treatment chamber 660 is filled by the vapor of the solvent component of the coated film such as ethylene glycol. On the side wall opposite to the guide rail 614 of the treatment chamber 660, an opening 661a for delivering the wafer W from the main arm 613 to the coating unit 620, and an opening 661b for delivering the wafer W from the aging unit 630 to the main arm 613 are respectively disposed on the appropriate positions, and these openings 661a, 661b are always closed by the doors 662a, 662b.

Further, to the treatment chamber 660, a solvent vapor feeding pipe 664 for feeding the vapor of ethylene glycol generated at the solvent vapor generating source 663 and an exhaust pipe 665 are connected respectively. In this example, a means for feeding the vapor of the solvent component into the treatment chamber 660 is constituted of the solvent vapor generating source 663 and the solvent vapor feeding pipe 664.

In this example, while evacuating the inside of the treatment chamber 660, by feeding the vapor of ethylene glycol into the treatment chamber 660, the inside of the treatment chamber, for instance, is adjusted to be saturated by the vapor of ethylene glycol. Then, in a state where the inside of the treatment chamber 660 is made the atmosphere of ethylene glycol, the door 662a is opened, the wafer W is delivered from the main arm 613 on the chuck 625 of the coating unit 620, and the door 662a is closed. Then, treatment for forming a coated film is carried out as described above, the wafer W is transferred from the coating unit 620 to the aging unit 630 by the sub-arm 651, and at the aging unit 630 gelling treatment is carried out. Thereafter, the door 662b is opened, and the wafer W is delivered from the heating plate 631 to the main arm 613.

In such a configuration, since the treatment chamber is filled by the vapor of ethylene glycol, all over the steps from the execution of the coating treatment at the coating unit 620 up to the execution of gelling treatment at the aging unit 630, the vaporization of the solvent in the coated film can be suppressed. Since the gelling of the coated film is further suppressed thereby, the thin film of more excellent quality can be formed.

Figure 43:
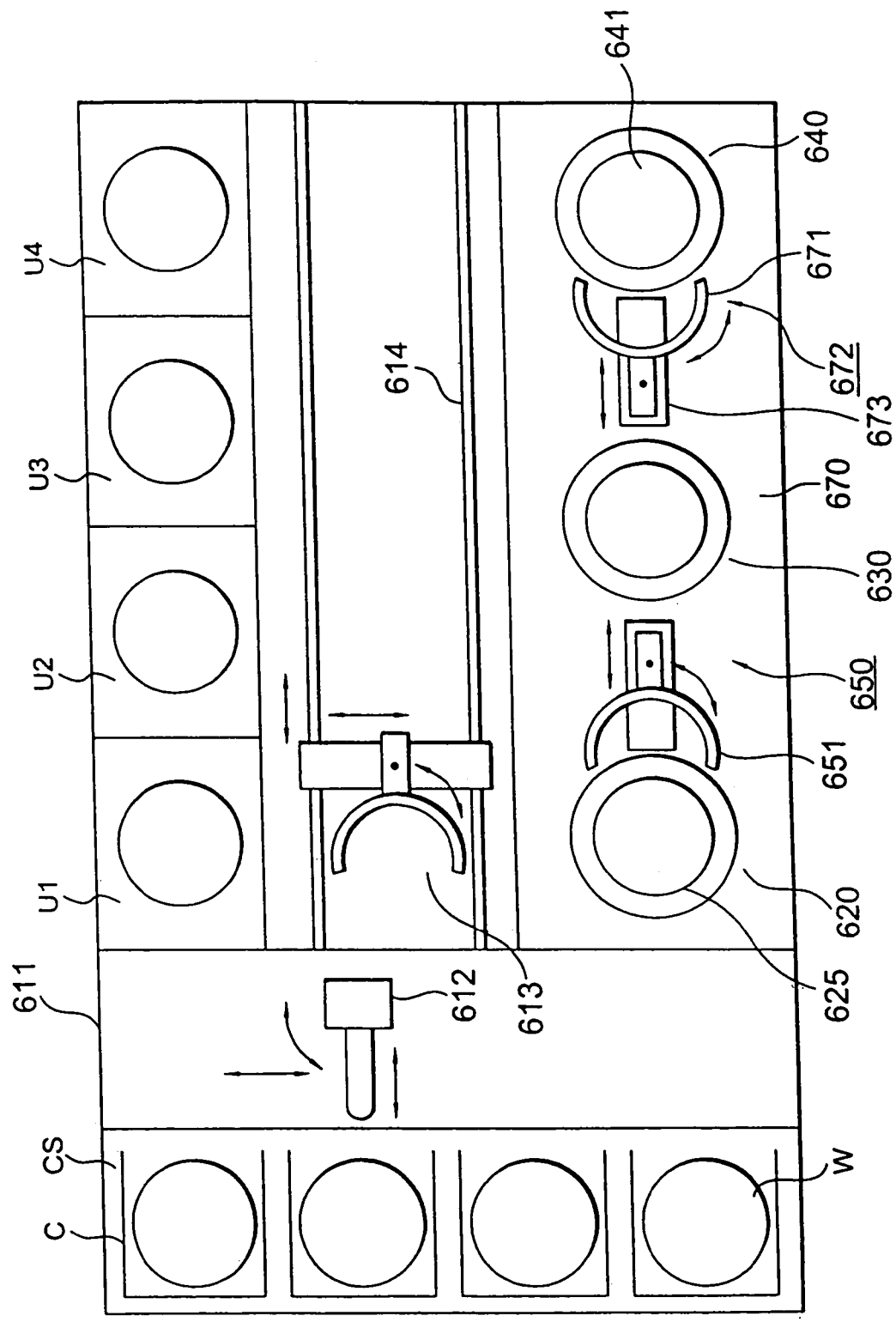
FIG. 43 is a plan view showing another example of an apparatus of forming a film.

Subsequently, still another modification example of example 9 will be described with reference to FIG. 43. In this example, a coating unit 620 and an aging unit 630 and a solvent replacement unit 640 are disposed adjacently in the same unit 670 in this order, and, between the aging unit 630 and the solvent replacement unit 640, a sub-arm mechanism 672 constituting an auxiliary transfer portion for transferring exclusively the wafer W treated at the aging unit 630 to the solvent replacement unit 640 is disposed.

Also in this example, between the coating unit 620 and the aging unit 630, a sub-arm mechanism 650 for exclusively transferring the wafer W treated at the coating unit 620 to the aging unit 630 is disposed, the sub-arm mechanism 670 between the aging unit 630 and the solvent replacement unit 640 is constituted identically as the sub-arm mechanism 650. That is, the sub-arm 671, together with the direction being reversed between the aging unit 630 and the solvent replacement unit 640, is constituted to be capable of moving along the guide rail (transferring path) 672 between the both units 630, 640.

In this example, the wafer W is delivered from the main arm 613 onto the chuck 625 of the coating unit 620, after the coating treatment is carried out at the coating unit 620, the wafer W is transferred to the aging unit 630 by the sub-arm 651, to deliver to the heating plate 631. Then, after the gelling treatment is carried out at this unit 630, the wafer W is delivered to the sub-arm 671 to transfer to the solvent replacement unit 640, then is delivered to the chuck 641. And, after solvent replacement treatment is carried out at this unit 640, the wafer W is delivered from the chuck 641 to the main arm 613, and the wafer W is transferred by the arm 613 to a unit for carrying out bake treatment.

In such a configuration, not only between the coating unit 620 and the aging unit 630, but also between the aging unit 630 and the solvent replacement unit 640, transfer of the wafer W is carried out without delay. Accordingly, since the gelling treatment can be carried out in a state where vaporization of the solvent in the coated film is suppressed, in addition to suppression of film shrinkage and deterioration of the film quality, the time period during which the large surface tension of the solvent is added on the reticular structure of TEOS is short, accordingly collapse of the film structure is suppressed, resulting in a thin film of further excellent quality.

Figure 44:
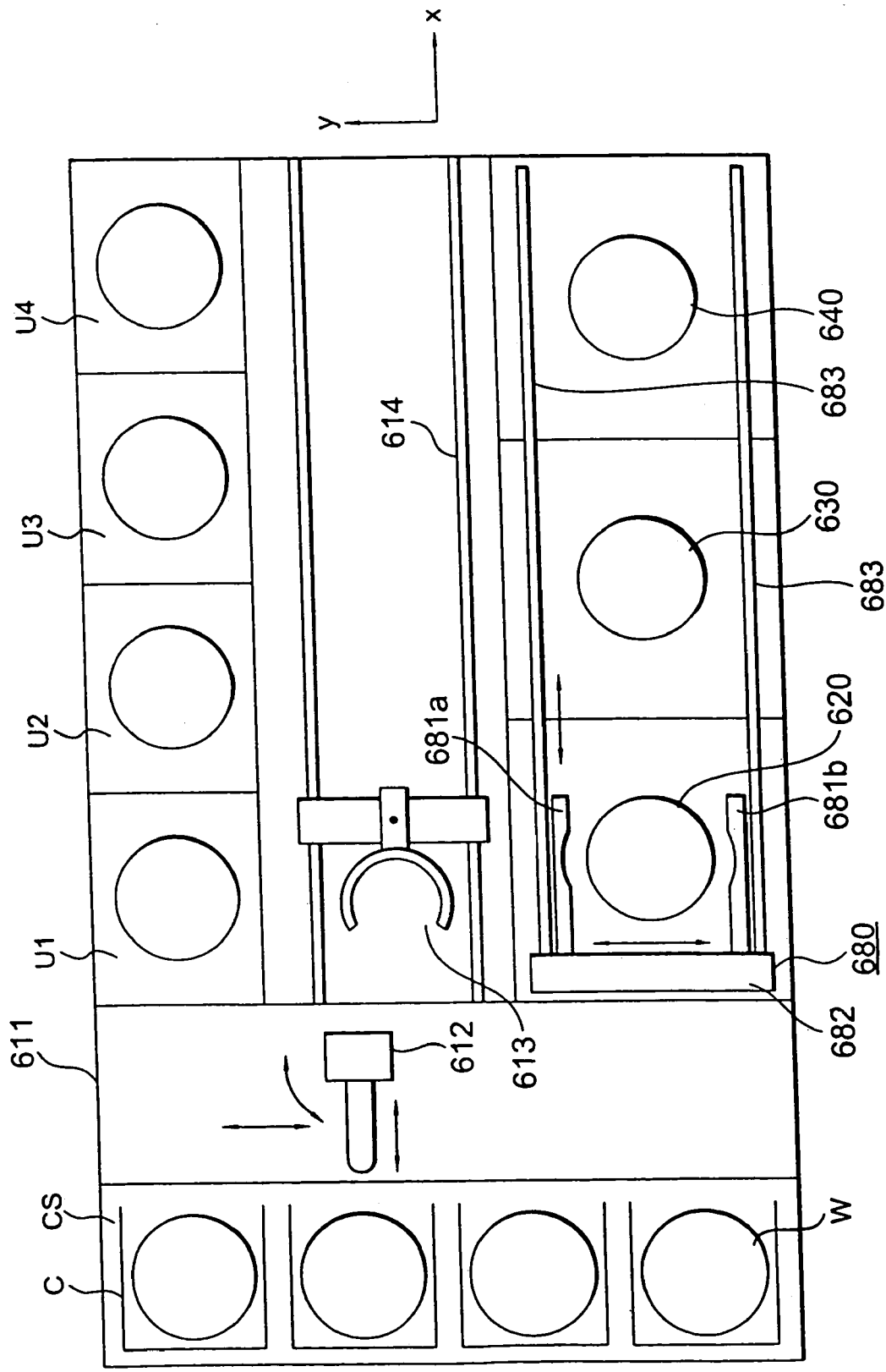
FIG. 44 is a plan view showing still another example of an apparatus of forming a film.

In the aforementioned seventh invention, the auxiliary transfer portion may be constituted as shown in FIG. 44. In this example, for instance, a coating unit 620, an aging unit 630, and a solvent replacement unit 640 are constituted as different units each other. The auxiliary transfer portion 680 is provided with a pair of arm members 681a, 681b which hold the wafer W by nipping a part of both circumference portions of the wafer W for instance, and these arm members 681a, 681b are constituted to be capable of freely opening and closing in the Y direction for instance by an opening and closing mechanism 682. Further, the opening and closing mechanism 682 is constituted to be movable in the X direction along the guide rail 683 at a position above the respective units 620, 630, and 640.

In such a configuration, the wafer W is exclusively transferred along the guide rail 683 from the coating unit 620 to the aging unit 630, and from the aging unit 630 to the solvent replacement unit 640, held by the arm members 681a, 681b.

Therefore, even in the case of these units 620, 630, and 640 being constituted as the separate units, the wafer W is transferred without delay between these units, as the result, the vaporization of the solvent in the coated film can be suppressed, accordingly deterioration of the film quality of the thin film can be prevented from occurring.

Incidentally, this auxiliary transfer portion can be applied even in the case of the coating unit 620, the aging unit 630, and the solvent replacement unit 640 being constituted as the same unit, also can be applied for transfer only between the coating unit 620 and the aging unit 630.

Figure 45:
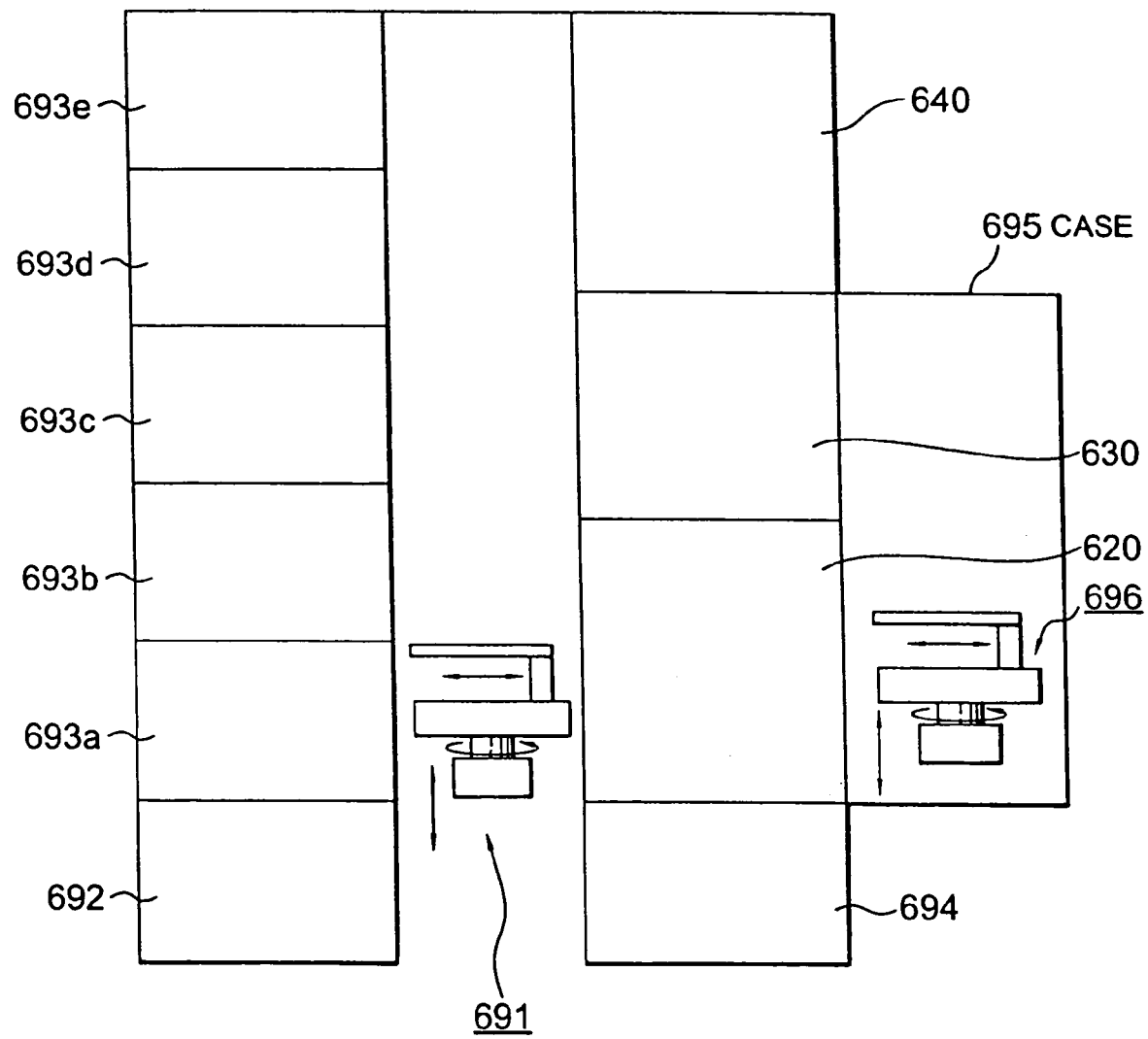
FIG. 45 is a plan view showing still another example of an apparatus of forming a film.

Further, the seventh invention can be applied even in the apparatus of forming a film of vertical type as shown in FIG. 45. The apparatus will be briefly-described with reference to FIG. 45. Reference numeral 691 in the figure denotes a main arm constituted to be capable of freely going up and down, freely moving forward and backward, and freely rotating, and, on one side (left side) of the main arm 691, a hydrophobic treatment unit 692 which is a pre-treatment step for carrying out the hydrophobic treatment of the wafer W, and 5 heating units 693a through 693e, for instance, constituting the heating portion for carrying out heat treatment (bake treatment) to the wafer W are piled up from the bottom in this order.

On the other hand, on the other side (right side) of the main arm 691., a receiving portion 694 for receiving the wafer W from outside the apparatus, a coating unit 620, an aging unit 630, and a solvent replacement unit 640 are piled up from the bottom in this order. Thus, on both sides of the main arm 691, a plurality of unit groups are disposed respectively, and, between these unit groups, a transfer path of the main arm 691 is formed. On the side portion of the coating unit 620 and the aging unit 630, for instance, the opposite side of the transfer path of the main arm 691, in a case 695, the sub-arm 696 constituting the auxiliary transfer portion is disposed to be capable of freely going up and down, freely moving forward and backward, and freely rotating, and the inside of the case 695 is a transfer path of the sub-arm 696.

Even in such a configuration, since the wafer W is exclusively transferred between the coating unit 620 and the aging unit 630 by the sub-arm 696, transfer between these units 620, 630 is carried out without delay. Accordingly, vaporization of the solvent in the coated film can be suppressed and the film quality of the thin film is prevented from deteriorating. Also in this example, the inside of the case 695 may be made an atmosphere of ethylene glycol, or, by extending the case 695 up to the side of the solvent replacement unit 640, the wafer W may be exclusively transferred between the aging unit 630 and the solvent replacement unit 640 by the sub-arm 696. Incidentally, in the seventh invention, the substrate is not restricted to the wafer but can be glass substrate for liquid crystal display.

According to the seventh invention, after the coating liquid in which colloids or particles of the starting material of the film component are dispersed in the solvent is coated on the substrate, the subsequent step can be carried out without delay, accordingly a thin film of excellent quality such as an interlayer insulating film can be obtained.

What is claimed is:

1. A method of forming a film, comprising:
   applying a coating liquid in which particles or colloids of a starting substance of a film component are dispersed in a solvent on the surface of a substrate to form a film;
   transferring the substrate into a sealed chamber and first gelling the coating liquid on the substrate while exposing the substrate to a carrier gas containing solvent vapor of the coating liquid at a first average concentration;
   bringing the substrate to a predetermined temperature, and after the substrate attains a predetermined temperature;
   secondly gelling the coating liquid on the substrate with a carrier gas containing the solvent vapor of the coating liquid at a second average concentration higher than the first average concentration;
   wherein the first average concentration corresponds to the saturated vapor pressure of the solvent at the substrate temperature during transfer into the chamber; and
   wherein the second average concentration corresponds to the saturated vapor pressure of the solvent at the substrate temperature at the predetermined temperature during the second gelling.

2. The method of forming a film as set forth in claim 1:
   wherein the temperature of the gas introduced in the sealed chamber in the first gelling is controlled so that it is close to that inside the sealed chamber.

3. The method of claim 1, further comprising prior to the first gelling:
   exhausting gas in the treatment chamber while generating a mixed gas of the solvent component vapor and the carrier gas.

4. The method of claim 1, wherein first gelling comprises heating the substrate.

5. The method of forming a film as set forth in claim 1:
   wherein the gas is generated by mixing a carrier gas and a vapor of a solvent component; and
   wherein the first gelling step is carried out by controlling a flow rate of at least one of the carrier gas or the vapor of the solvent component.

6. The method of claim 1:
   wherein
   the mixing of the carrier gas and the vapor of the solvent component is carried out at a vaporizer vaporizing a liquid of the solvent component, and
   the first gelling step is carried out by controlling a flow rate of the liquid of the solvent component being introduced into the vaporizer.

7. The method of claim 1:
   wherein the first gelling comprises varying continuously the concentration of the vapor of the solvent component.

8. The method of claim 1:
   wherein the first gelling comprises mixing intermittently the vapor of the solvent component into the carrier gas.

9. The method of claim 1, further comprising:
   feeding a gas into a sealed chamber before exposing the substrate to said gas in a state where the first average concentration of the vapor of the solvent component is higher than an average concentration for the first gelling until the sealed chamber is filled with the gas.

10. The method of claim 1, wherein the coating liquid comprises colloids or particles of a metal alkoxide.

11. The method of claim 1, wherein the coating liquid comprises dispersed colloids of TEOS (tetra-ethoxy-silane).

12. The method of claim 1, wherein the solvent comprises ethylene glycol or ethyl alcohol.

* * * * *